(12) United States Patent
Iijima et al.

(10) Patent No.: US 8,107,000 B2
(45) Date of Patent: Jan. 31, 2012

(54) IMAGE PICKUP APPARATUS AND SEMICONDUCTOR CIRCUIT ELEMENT

(75) Inventors: Tomokuni Iijima, Osaka (JP); Katsumi Imada, Nara (JP); Satoshi Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 574 days.

(21) Appl. No.: 12/300,754

(22) PCT Filed: May 10, 2007

(86) PCT No.: PCT/JP2007/059630
§ 371 (c)(1), (2), (4) Date: Nov. 13, 2008

(87) PCT Pub. No.: WO2007/132717
PCT Pub. Date: Nov. 22, 2007

(65) Prior Publication Data
US 2009/0174804 A1    Jul. 9, 2009

(30) Foreign Application Priority Data
May 16, 2006 (JP) .................................. 2006-136044

(51) Int. Cl.
*G03B 13/36* (2006.01)
(52) U.S. Cl. .......................... 348/352; 348/340; 396/123
(58) Field of Classification Search .................. 348/340, 348/352; 396/133, 123
See application file for complete search history.

(56) References Cited

U.S. PATENT DOCUMENTS
5,068,737 A * 11/1991 Taniguchi et al. ............ 348/353
(Continued)

FOREIGN PATENT DOCUMENTS
JP    11-41521    2/1999
(Continued)

OTHER PUBLICATIONS

Chinese Office Action, with English translation, issued in Chinese Patent Application No. 200780017796.X, mailed Oct. 13, 2010.

*Primary Examiner* — Clayton E Laballe
*Assistant Examiner* — Leon W Rhodes
(74) *Attorney, Agent, or Firm* — McDermott Will & Emery LLP

(57) ABSTRACT

The present invention includes: a plurality of lens portions, each having at least one lens; a plurality of image pickup regions which are provided to correspond to the lens portions, respectively, and each of which has a light receiving surface substantially perpendicular to a direction of an optical axis of the corresponding lens portion; an image pickup signal input portion 133 which receives image pickup signals generated by the image pickup regions; a transfer range determining portion 144 which determines a transfer range of the image pickup signals transferred from the image pickup regions to the image pickup signal input portion 133; an image pickup region driving portion 132 which drives the image pickup regions such that the image pickup signals corresponding to the transfer range determined by the transfer range determining portion 144 are transferred to the image pickup signal input portion 133; and a parallax calculating portion 142 which calculates a parallax based on the image pickup signals transferred to the image pickup signal input portion 133, and the transfer range determining portion 144 switches between a first operating mode in which the image pickup signals generated by at least two image pickup regions of the plurality of image pickup regions are determined as the transfer range and a second operating mode in which the image pickup signals different from those of the first operating mode are determined as the transfer range.

13 Claims, 42 Drawing Sheets

U.S. PATENT DOCUMENTS

| | | | |
|---|---|---|---|
| 5,528,330 A * | 6/1996 | Utagawa | 396/96 |
| 5,530,514 A * | 6/1996 | Lisson et al. | 396/114 |
| 6,072,564 A * | 6/2000 | Nakamura et al. | 356/3.14 |
| 6,163,022 A | 12/2000 | Yasui et al. | |
| 2001/0014215 A1 | 8/2001 | Ide et al. | |
| 2002/0089596 A1* | 7/2002 | Suda | 348/302 |
| 2003/0086013 A1 | 5/2003 | Aratani | |
| 2004/0125230 A1 | 7/2004 | Suda | |
| 2004/0207747 A1 | 10/2004 | Ikeda | |

FOREIGN PATENT DOCUMENTS

| | | |
|---|---|---|
| JP | 11-258491 | 9/1999 |
| JP | 2000-284170 | 10/2000 |
| JP | 2001-12927 | 1/2001 |
| JP | 2001-221633 | 8/2001 |
| JP | 2001-249265 | 9/2001 |
| JP | 2001-305422 | 10/2001 |
| JP | 2003-143459 | 5/2003 |
| JP | 2004-191893 | 7/2004 |
| JP | 2006-39397 | 2/2006 |

* cited by examiner

Fig. 46

IMAGE PICKUP APPARATUS AND SEMICONDUCTOR CIRCUIT ELEMENT

RELATED APPLICATIONS

This application is the U.S. National Phase under 35 U.S.C. §371 of International Application No. PCT/W2007/059630, filed on May 10, 2007, which in turn claims the benefit of Japanese Application No. 2006-136044, filed on May 16, 2006, the disclosures of which Applications are incorporated by reference herein.

TECHNICAL FIELD

The present invention relates to an image pickup apparatus capable of measuring a distance and a semiconductor circuit element used in the image pickup apparatus.

BACKGROUND ART

Known as a conventional image pickup apparatus is an image pickup apparatus of Patent Document 1. FIG. 53 is an exploded perspective view of the image pickup apparatus of Patent Document 1. An image pickup apparatus 901 includes an iris member 902, an optical lens array 903, an optical filter 906, and an image pickup unit 907. In the image pickup apparatus 901, the iris member 902 having four openings 902-1, 902-2, 902-3, and 902-4 and the optical lens array 903 having four lenses 903-1, 903-2, 903-3, and 903-4 constitute four image pickup optical systems. Light beams which have passed through the image pickup optical systems, respectively, form images on four pixel groups 907-1, 907-2, 907-3, and 907-4, respectively, on the image pickup unit 907. The image pickup unit 907 constituted by a CCD sensor or the like is formed on a semiconductor substrate 910 together with a drive circuit 908 and a signal processing circuit 909.

The signal processing circuit 909 sequentially reads out pixel information of the image pickup unit 907 by the drive circuit 908, receives the pixel information as pixel signals, calculates values of parallaxes of respective pixel groups (907-1, 907-2, 907-3, and 907-4) from the pixel signals, and calculates distances based on the parallaxes.

Patent Document 1: Japanese Laid-Open Patent Application Publication No. 2003-143459

DISCLOSURE OF THE INVENTION

Problems to be Solved by the Invention

As described above, in the conventional image pickup apparatus described in Patent Document 1, the signal processing circuit 909 reads out using the drive circuit 908 all the pixel information of four pixel groups 907-1, 907-2, 907-3, and 907-4 on the image pickup unit 907 to calculate the parallax. Therefore, a transfer time for transferring all the pixel information from the image pickup unit 907 to the signal processing circuit 909 is required. On this account, the increase in speed of the image pickup apparatus is limited due to the transfer time. To be specific, an interval between parallax calculations cannot be made shorter than the transfer time.

In a case where a rolling shutter CMOS sensor is utilized as the image pickup unit 907, times at which images are taken differ among the pixel groups 907-1, 907-2, 907-3, and 907-4. In a case where the movement of a subject is fast, image pickup signals utilized for the parallax calculation differ. This decreases the accuracy of the parallax to be obtained.

The present invention was made in light of the above problems, and an object of the present invention is to provide an image pickup apparatus capable of carrying out the high-speed and highly-accurate parallax calculation, and a semiconductor circuit element used in the image pickup apparatus. To be specific, an object of the present invention is to provide an image pickup apparatus capable of carrying out the high-speed parallax calculation by shortening the transfer time of the image pickup signals and carrying out the highly-accurate parallax calculation even if the movement of the subject is fast, and a semiconductor circuit element used in the image pickup apparatus.

Means for Solving the Problems

To solve the above-described problems, an image pickup apparatus of the present invention includes: a plurality of lens portions, each having at least one lens; a plurality of image pickup regions which are provided to correspond to the plurality of lens portions, respectively, and each of which has a light receiving surface substantially perpendicular to a direction of an optical axis of the corresponding lens portion; an image pickup signal input portion which receives image pickup signals generated by the image pickup regions; a transfer range determining portion which determines a transfer range of the image pickup signals transferred from the image pickup regions to the image pickup signal input portion; an image pickup region driving portion which drives the image pickup regions such that the image pickup signals corresponding to the transfer range determined by the transfer range determining portion are transferred to the image pickup signal input portion; and a parallax calculating portion which calculates a parallax based on the image pickup signals transferred to the image pickup signal input portion, wherein the transfer range determining portion is configured to be able to switch between a first operating mode in which the image pickup signals generated by at least two image pickup regions of the plurality of image pickup regions are determined as the transfer range and a second operating mode in which the image pickup signals different from those of the first operating mode are determined as the transfer range.

In a case where the image pickup signals generated by all of the image pickup regions are always transferred, the transfer time becomes long, so that it is difficult to carry out the high-speed parallax calculation. As described above, by suitably switching between the first operating mode and the second operating mode, the image pickup signals of only a necessary range are transferred, so that the high-speed parallax calculation is realized.

In the image pickup apparatus according to the present invention, the transfer range determining portion may be configured to be able to switch between the first operating mode in which the image pickup signals generated by substantially all of the image pickup regions are determined as the transfer range and the second operating mode in which the image pickup signals generated by a substantially half of the image pickup regions are determined as the transfer range.

Moreover, in the image pickup apparatus according to the present invention, the substantially half of the image pickup regions may be a substantially half, which is earlier in order of transfer, of the image pickup regions. In a case where the plurality of image pickup regions are four image pickup regions arranged in two rows and two columns, the substantially half of the image pickup regions may be two image pickup regions, which are arranged diagonally, of the four image pickup regions.

Moreover, in the image pickup apparatus according to the present invention, the image pickup regions may be divided into a plurality of fields to be interlaced; and the transfer range determining portion may be configured to be able to switch between the first operating mode in which the image pickup signals generated by substantially all of the image pickup regions are determined as the transfer range and the second operating mode in which the image pickup signals generated by one field of the image pickup regions are determined as the transfer range.

Moreover, in the image pickup apparatus according to the present invention, the transfer range determining portion may be configured to switch between the first operating mode and the second operating mode based on information about a subject.

Moreover, in the image pickup apparatus according to the present invention, the transfer range determining portion may be configured to switch from the first operating mode to the second operating mode when it determines that high speed is required to calculate the parallax.

Moreover, in the image pickup apparatus according to the present invention, the transfer range determining portion may be configured to switch from the second operating mode to the first operating mode when it determines that high accuracy is required to calculate the parallax.

Moreover, in the image pickup apparatus according to the present invention, the transfer range determining portion may be configured such that in both the first operating mode and the second operating mode, the image pickup signals generated by a part of the plurality of image pickup regions are determined as the transfer range.

Moreover, in the image pickup apparatus according to the present invention, the transfer range determining portion may be configured such that in at least one of the first operating mode and the second operating mode, the image pickup signals generated by the image pickup regions taking an image of a moving subject are determined as the transfer range.

Moreover, in the image pickup apparatus according to the present invention, the transfer range determining portion may be configured to switch between the first operating mode and the second operating mode based on speed of movement of the subject.

Moreover, in the image pickup apparatus according to the present invention, the transfer range determining portion may be configured to switch to, when the movement of the subject is fast, an operating mode in which the image pickup signals generated by a large number of the image pickup regions are determined as the transfer range, and to, when the movement of the subject is slow, an operating mode in which the image pickup signals generated by a small number of the image pickup regions are determined as the transfer range.

Moreover, in the image pickup apparatus according to the present invention, the transfer range determining portion may be configured such that a number of pixels corresponding to the image pickup signals in the transfer range is maintained substantially constant in at least one of the first operating mode and the second operating mode.

Moreover, in the image pickup apparatus according to the present invention, the image pickup regions may be configured to take an image of regions containing regions corresponding to a road surface; and the transfer range determining portion may be configured such that in at least one of the first operating mode and the second operating mode, the image pickup signals corresponding to regions other than the regions corresponding to the road surface are determined as the transfer range.

Moreover, in the image pickup apparatus according to the present invention, the image pickup regions may be configured to take an image of regions containing regions corresponding to a face of a person; and the transfer range determining portion may be configured such that in at least one of the first operating mode and the second operating mode, the image pickup signals corresponding to the regions corresponding to the face of the person are determined as the transfer range.

Moreover, in the image pickup apparatus according to the present invention, at least two image pickup regions of the plurality of image pickup regions may be configured to repeatedly alternately transfer a part of the generated image pickup signals to the image pickup signal input portion to transfer all of the generated image pickup signals to the image pickup signal input portion.

Further, the image pickup apparatus according to the present invention may further include a distance calculating portion which calculates a distance to the subject based on the parallax obtained by the parallax calculating portion.

Moreover, a semiconductor circuit element of the present invention is a semiconductor circuit element for use in an image pickup apparatus including: a plurality of lens portions, each having at least one lens; and a plurality of image pickup regions which are provided to correspond to the plurality of lens portions, respectively, and each of which has a light receiving surface substantially perpendicular to a direction of an optical axis of the corresponding lens portion, and the semiconductor circuit element includes: an image pickup signal input portion which receives image pickup signals generated by the image pickup regions; a transfer range determining portion which determines a transfer range of the image pickup signals transferred from the image pickup regions to the image pickup signal input portion; an image pickup element driving portion which drives the image pickup regions such that the image pickup signals corresponding to the transfer range determined by the transfer range determining portion are transferred to the image pickup signal input portion; and a parallax calculating portion which calculates a parallax based on the image pickup signals transferred to the image pickup signal input portion, wherein the transfer range determining portion is configured to be able to switch between a first operating mode in which the image pickup signals generated by at least two image pickup regions of the plurality of image pickup regions are determined as the transfer range and a second operating mode in which the image pickup signals different from those of the first operating mode are determined as the transfer range.

BRIEF DESCRIPTION OF THE DRAWINGS

FIG. 46 is a diagram for explaining the divided blocks, calculation order, and transfer range flag of the first image pickup signal in the parallax calculation utilizing the first image pickup signal and the second image pickup signal in the image pickup apparatus according to Embodiment 3 of the present invention.

EXPLANATION OF REFERENCE NUMBERS

Figure 1:
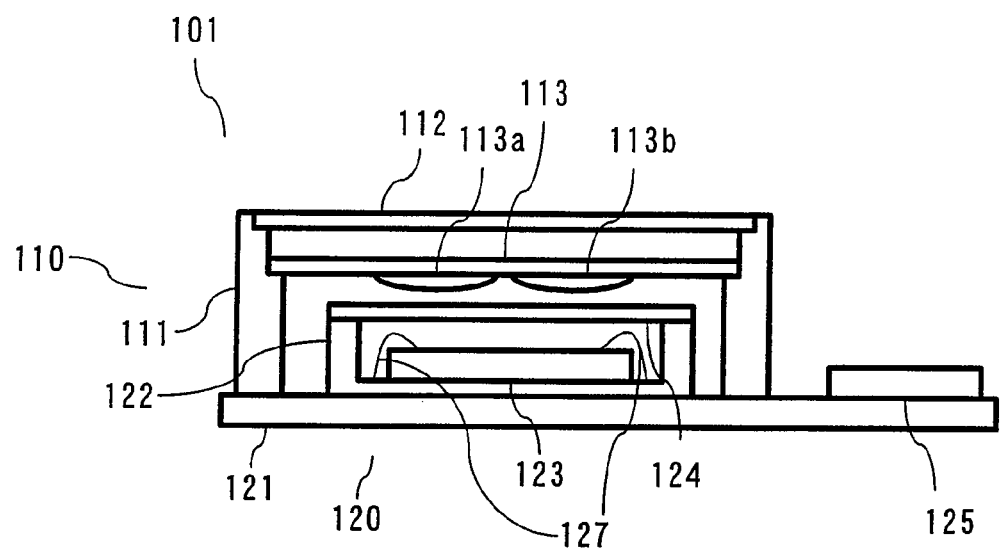
FIG. 1 is a cross-sectional view showing the configuration of an image pickup apparatus according to Embodiment 1 of the present invention.

101, 201, 301 an image pickup apparatus
110, 310 lens module
111, 311 lens barrel
112, 312 upper cover glass
113, 313 lens
113a, 313a first lens portion
113b, 313b second lens portion
113c third lens portion
113d fourth lens portion
120, 220, 320 circuit portion
121, 321 substrate
122, 322 package
123, 223, 323 image pickup element
124, 224 package cover glass
124a, 224a first color filter
124b, 224b second color filter
124c, 224c third color filter
124d, 224d fourth color filter
124e, 224e light shielding portion
125, 225, 325 SLSI
127, 327 gold wire
131, 231, 331 system control portion
132, 232, 332 image pickup element driving portion
232a first image pickup element driving portion
232b second image pickup element driving portion
133, 233, 333 image pickup signal input portion
134, 234, 334 preprocessing portion
135, 335 input buffer
135a, 335a first input buffer
135b, 335b second input buffer
135c third input buffer
135d fourth input buffer
136, 236, 336 image processing portion
137, 337 output buffer
137a, 337a first output buffer
137b, 337b second output buffer
138, 338 input/output portion
141, 241, 341 calculating buffer
141a, 241a, 341a first calculating buffer
141b, 241b, 341b second calculating buffer
142, 242, 342 parallax calculating portion
143, 343 distance calculating portion
144, 344 transfer range determining portion

BEST MODE FOR CARRYING OUT THE INVENTION

Hereinafter, an image pickup apparatus according to embodiments of the present invention will be explained in reference to the drawings.

Embodiment 1

In accordance with an image pickup apparatus according to Embodiment 1 of the present invention, a transfer range determining portion suitably changes a transfer range of image pickup signals. Especially, the image pickup apparatus switches between a case where the image pickup signals generated by substantially all of image pickup regions are set as the transfer range and a case where the image pickup signals generated by a substantially half (region which is earlier in order of transfer) of the image pickup regions are set as the transfer range. To be specific, in a case where high speed is required, the image pickup signals generated by the substantially half (region which is earlier in the order of transfer) of the image pickup regions are set as the transfer range. With this, since the transfer is limited to the image pickup signals generated by the half of the image pickup regions when the high speed is required, a time necessary for the transfer is reduced in half as compared to a case where the image pickup signals generated by all of the image pickup regions are set as the transfer range. Therefore, it is possible to realize the image pickup apparatus capable of carrying out the high-speed parallax calculation and distance calculation.

Hereinafter, the image pickup apparatus according to Embodiment 1 of the present invention will be explained in reference to the drawings.

FIG. 1 is a cross-sectional view showing the configuration of the image pickup apparatus according to Embodiment 1 of the present invention. As shown in FIG. 1, an image pickup apparatus 101 includes a lens module portion 110 and a circuit portion 120.

The lens module portion 110 includes a lens barrel 111, an upper cover glass 112, and a lens 113. The circuit portion 120 includes a substrate 121, a package 122, an image pickup element 123, a package cover glass 124, and a system LSI (hereinafter referred to as SLSI) 125 that is a semiconductor circuit element.

The lens barrel 111 has a cylindrical shape and is formed by injection molding of resin, and its inner wall surface is matte-black to prevent diffused reflection of light. The upper cover glass 112 has a disc shape, is formed by transparent resin, and is fixed to an inner wall of an upper portion of the lens barrel 111 by adhesive or the like. A protective membrane which prevents damages by friction and the like and an antireflection coating which prevents reflection of incident light are disposed on a surface of the upper cover glass 112.

Figure 2:
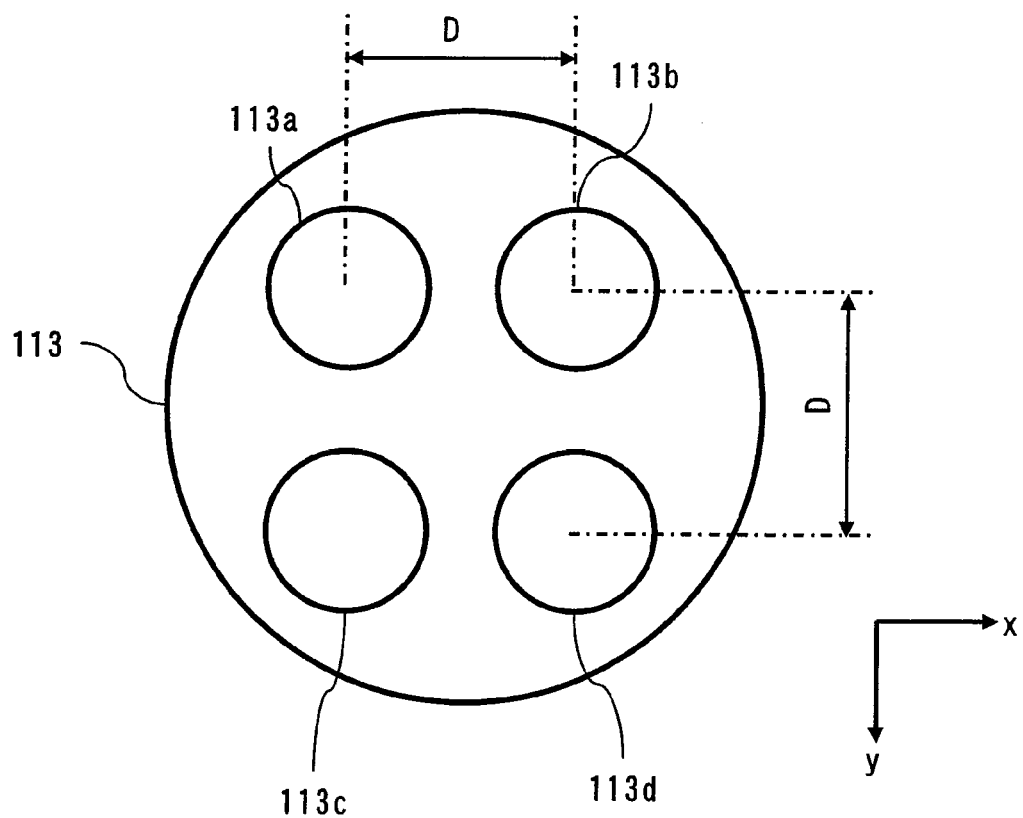
FIG. 2 is a plan view showing the configuration of a lens of the image pickup apparatus according to Embodiment 1 of the present invention.

FIG. 2 is a plan view showing the configuration of the lens of the image pickup apparatus according to Embodiment 1 of the present invention. The lens 113 has a substantially disc shape and is formed by glass or transparent resin. In the lens 113, a first lens portion 113a, a second lens portion 113b, a third lens portion 113c, and a fourth lens portion 113d are arranged in a grid of two rows and two columns. As shown in FIG. 2, an x-axis and a y-axis are set along directions of the arrangement of the first to fourth lens portions 113a to 113d. Light incident from a subject side of the first lens portion 113a, the second lens portion 113b, the third lens portion 113c, and the fourth lens portion 113d emanates to the image pickup element 123 side thereof to form four images on the image pickup element 123. As shown in FIG. 2, an optical axis of the first lens portion 113a and an optical axis of the second lens portion 113b are separated from each other by D in a horizontal direction (x-axis direction), and coincide with each other in a vertical direction (y-axis direction). The optical axis of the first lens portion 113a and an optical axis of the third lens portion 113c coincide with each other in the horizontal direction (x-axis direction), and are separated from each other by D in the vertical direction (y-axis direction). The optical axis of the third lens portion 113c and an optical axis of the fourth lens portion 113d are separated from each other by D in the horizontal direction (x-axis direction), and coincide with each other in the vertical direction (y-axis direction).

The substrate 121 is formed by a resin substrate. A bottom surface of the lens barrel 111 is fixed to an upper surface of the substrate 121 by adhesive or the like. Thus, the lens module portion 110 and the circuit portion 120 are fixed to constitute the image pickup apparatus 101.

The package 122 is made of resin having a metal terminal. The package 122 is fixed inside the lens barrel 111 such that the metal terminal portion is, for example, soldered to an upper surface of the substrate 121.

The image pickup element 123 is a progressive CCD sensor, and is disposed such that a light receiving surface thereof is substantially perpendicular to the optical axes of the first lens portion 113a, the second lens portion 113b, the third lens portion 113c, and the fourth lens portion 113d. Each terminal of the image pickup element 123 is connected to the metal terminal at a bottom portion inside the package 122 by a gold wire 127 using wire bonding, and is electrically connected to the SLSI 125 via the substrate 121. Light emanating from the first lens portion 113a, the second lens portion 113b, the third lens portion 113c, and the fourth lens portion 113d form images on the light receiving surface of the image pickup element 123, this light information is converted into electric information by a photodiode, and this electric information is transferred to the SLSI 125.

Figure 3A:
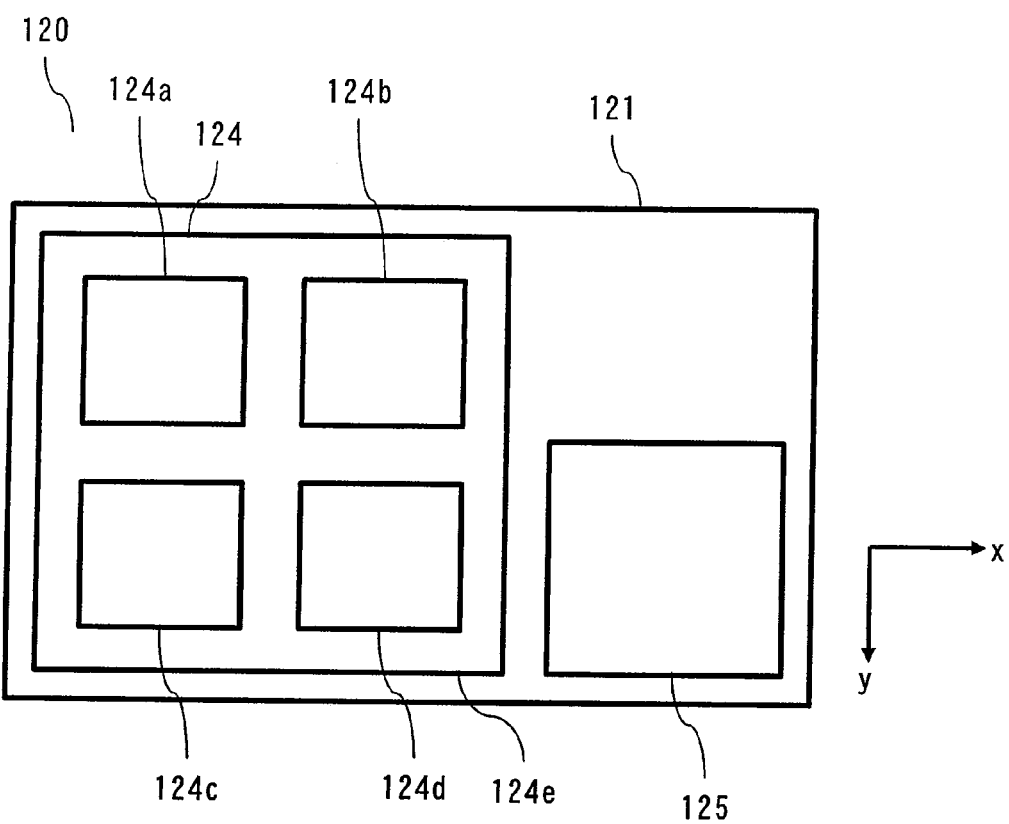
FIG. 3A is a plan view showing the configuration of a circuit portion of the image pickup apparatus according to Embodiment 1 of the present invention.

FIG. 3A is a plan view showing the configuration of the circuit portion of the image pickup apparatus according to Embodiment 1 of the present invention. The package cover glass 124 has a flat plate shape, is formed by transparent resin, and is fixed to an upper surface of the package 122 by adhesive or the like. A first color filter 124a, a second color filter 124b, a third color filter 124c, a fourth color filter 124d, and a light shielding portion 124e are disposed on an upper surface of the package cover glass 124 by vapor deposition or the like. An antireflection coating is disposed on a lower surface of the package cover glass 124 by vapor deposition or the like.

Figure 3B:
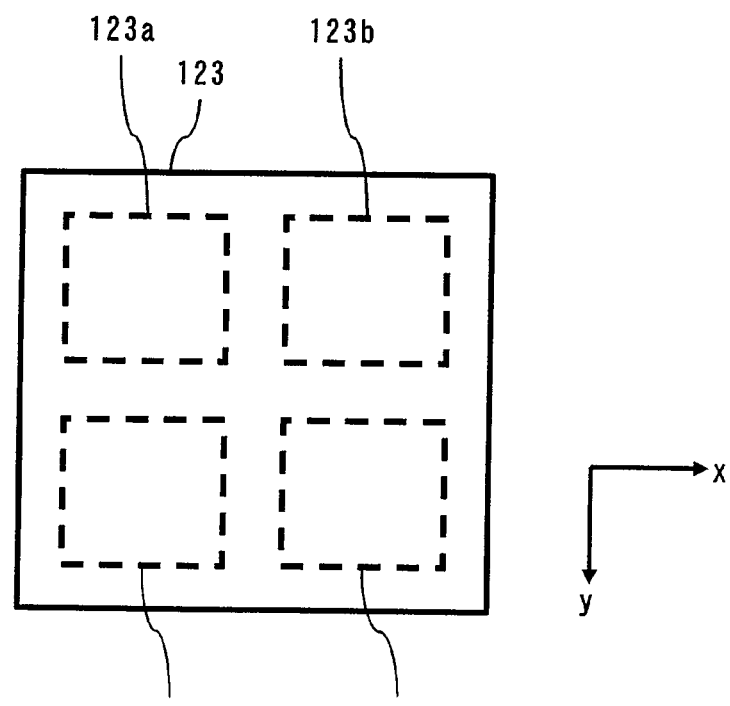
FIG. 3B is a plan view showing the configuration of an image pickup element of the image pickup apparatus according to Embodiment 1 of the present invention.

FIG. 3B is a plan view showing the configuration of the image pickup element of the image pickup apparatus according to Embodiment 1 of the present invention. As shown in FIG. 3B, the image pickup element 123 is constituted by a first image pickup region 123a, a second image pickup region 123b, a third image pickup region 123c, and a fourth image pickup region 123d. The first to fourth image pickup regions 123a to 123d are arranged in two rows and two columns such that light receiving surfaces thereof are substantially perpendicular to the optical axes of the first to fourth lens portions 113a to 113d, respectively. The image pickup regions 123a to 123d generate the image pickup signals.

As described above, in the present embodiment, one image pickup element includes a plurality of image pickup regions. However, the image pickup apparatus of the present invention is not limited to this. A plurality of image pickup regions may be included in the other configuration. For example, one mode may be such that a plurality of image pickup regions are included by providing a plurality of image pickup elements each having one image pickup region.

Figure 4:
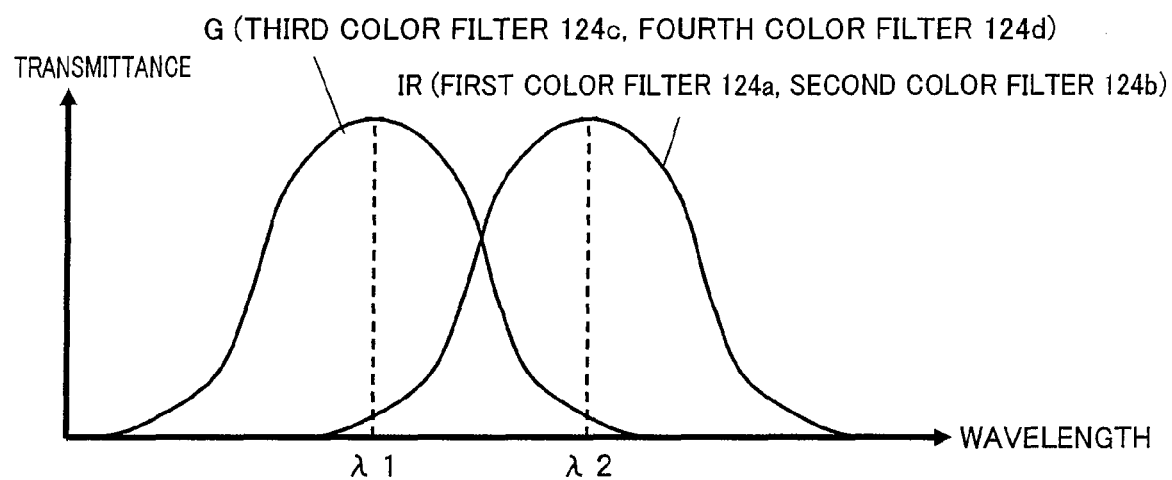
FIG. 4 is a characteristic diagram of color filters of a an image pickup apparatus according to Embodiment 1 of the present invention.

FIG. 4 is a characteristic diagram of color filters of a camera module according to Embodiment 1 of the present invention. Each of the first color filter 124a and the second color filter 124b has a spectral transmission characteristic (transmission characteristic centering on a wavelength λ2; for example, λ2 is 870 nm) which is shown by IR in FIG. 4 and mainly transmits near infrared light. Each of the third color filter 124c and the fourth color filter 124d has a spectral transmission characteristic (transmission characteristic centering on a wavelength λ1; for example, λ1 is 500 nm) which is shown by G in FIG. 4 and mainly transmits green light.

Therefore, object light which has been incident on an upper portion of the first lens portion 113a emanates from a lower portion of the first lens portion 113a, and the near infrared light is transmitted mainly by the first color filter 124a and forms an image on a light receiving portion of the first image pickup region 123a. On this account, the first image pickup region 123a receives the near infrared light component of the object light. The object light which has been incident on an upper portion of the second lens portion 113b emanates from a lower portion of the second lens portion 113b, and the near infrared light is transmitted mainly by the second color filter 224b and forms an image on a light receiving portion of the second image pickup region 123b. On this account, the second image pickup region 123b receives the near infrared light component of the object light. The object light which has been incident on an upper portion of the third lens portion 113c emanates from a lower portion of the third lens portion 113c, and the green light is transmitted mainly by the third color filter 224c and forms an image on a light receiving portion of the third image pickup region 123c. On this account, the third image pickup region 123c receives the green light component of the object light. The object light which has been incident on an upper portion of the fourth lens portion 113d emanates from a lower portion of the fourth lens portion 113d, and the green light is transmitted mainly by the fourth color filter 224d and forms an image on a light receiving portion of the fourth image pickup region 123d. On this account, the fourth image pickup region 123d receives the green light component of the object light.

The SLSI 125 drives the image pickup element 123 in the following manner, receives electric information from the image pickup element 123, carries out various calculations, communicates with a host CPU, and outputs image information, distance information, and the like to outside. Note that the SLSI 125 is connected to a power supply (3.3 V for example) and a ground (0 V for example).

Next, a relation between a subject distance and the parallax will be explained. Since the image pickup apparatus according to Embodiment 1 of the present invention has four lens portions (the first lens portion 113a, the second lens portion 113b, the third lens portion 113c, and the fourth lens portion 113d), relative positions of four object images formed by four lens portions, respectively, change depending on the subject distance.

Figure 5:
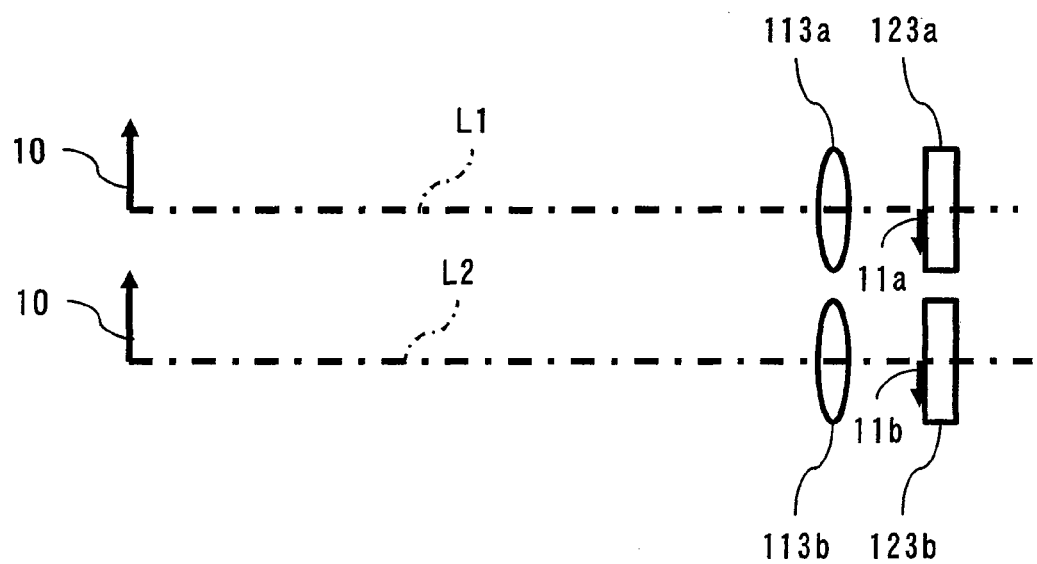
FIG. 5 is a diagram for explaining a position of an object image positioned at infinity in the image pickup apparatus according to Embodiment 1 of the present invention.

FIG. 5 is a diagram for explaining a position of an object image positioned at infinity in the image pickup apparatus according to Embodiment 1 of the present invention. In FIG. 5, for simplicity, only the first lens portion 113a and the second lens portion 113b of the lens portion 113 are shown. Incident light L1 which is light incident from an object 10 at infinity to the first lens portion 113a and incident light L2 which is light incident from the object 10 at infinity to the second lens portion 113b are in parallel with each other. Therefore, a distance between the first lens portion 113a and the second lens portion 113b is equal to a distance between an object image 11a and an object image 11b on the image pickup element 123. That is, there is no parallax.

Figure 6:
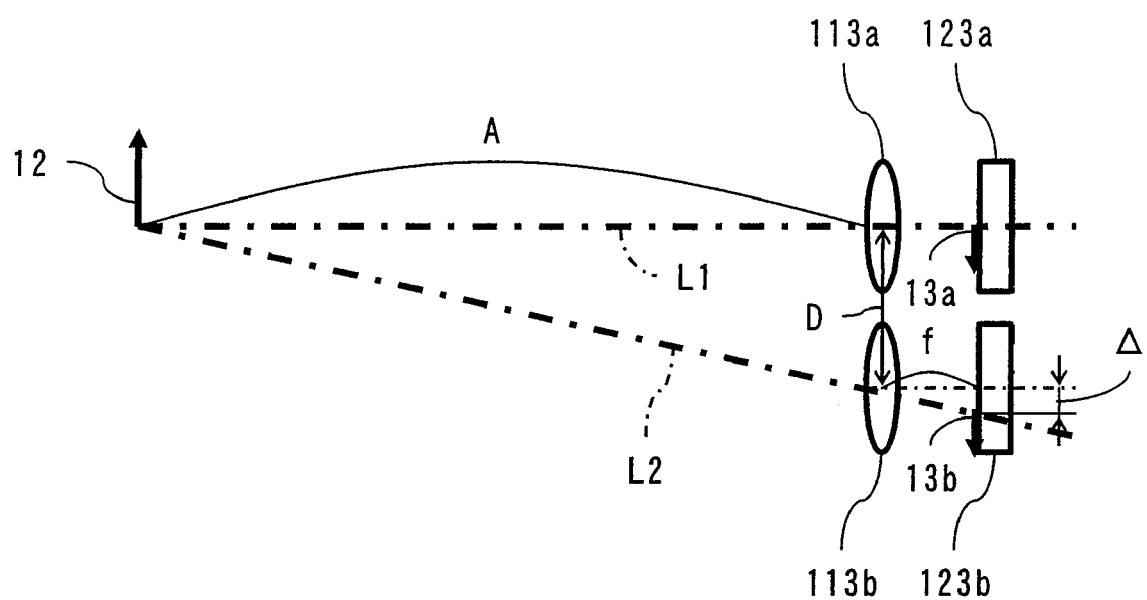
FIG. 6 is a diagram for explaining a position of the object image positioned at a finite distance in the image pickup apparatus according to Embodiment 1 of the present invention.

FIG. 6 is a diagram for explaining a position of the object image positioned at a finite distance in the image pickup apparatus according to Embodiment 1 of the present invention. In FIG. 6, for simplicity, only the first lens portion 113a and the second lens portion 113b of the lens portion 113 are shown. The incident light L1 which is light incident from an object 12 at the finite distance to the first lens portion 113a and the incident light L2 which is light incident from the object 12 at the finite distance to the second lens portion 113b are not in parallel with each other. Therefore, the distance between an object image 13a and an object image 13b on the image pickup element 123 is longer than the distance between the first lens portion 113a and the second lens portion 113b. That is, there exists the parallax.

In a case where a distance (subject distance) to the object image 12 is denoted by A, the distance between the first lens portion 113a and the second lens portion 113b is denoted by D, and a focal length of the lens portions 113a, 113b is denoted by f, a parallax value Δ is represented by Formula 1 below since a right angled triangle whose two sides sandwiching a right angle have lengths of A and D, respectively, and a right angled triangle whose two sides sandwiching a right angle have lengths of f and Δ, respectively, are similar to each other in FIG. 6.

$$\Delta = f \cdot D / A \quad \text{Formula 1}$$

The same relation as above is true between the other lens portions. Thus, the relative positions of four object images formed by four lens portions 113a, 113b, 113c, and 113d, respectively, change depending on the subject distance. For example, the parallax value Δ increases as a subject distance A decreases.

Figure 7:
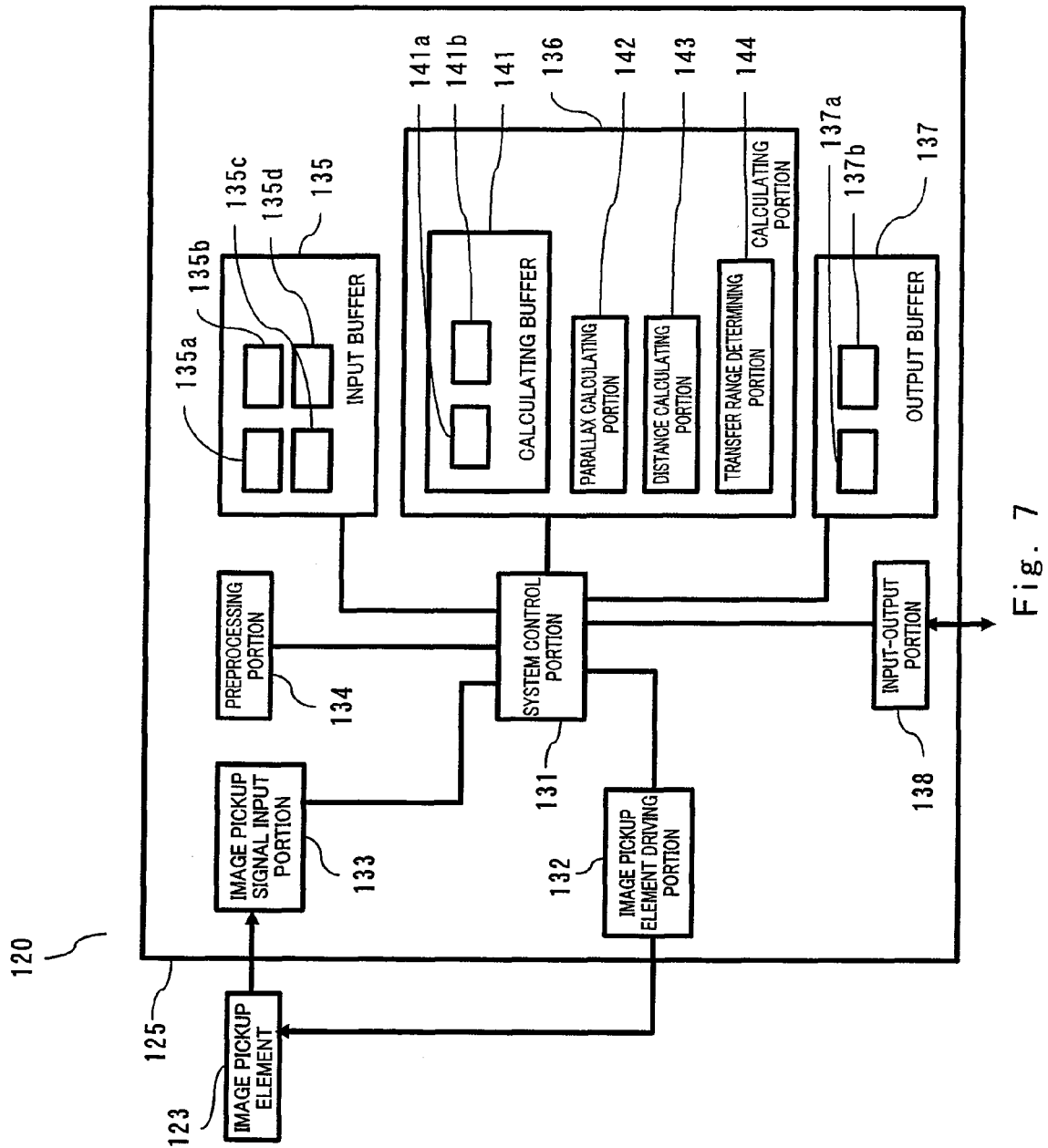
FIG. 7 is a block diagram showing the configuration of the image pickup apparatus according to Embodiment 1 of the present invention.

Next, an operation of the image pickup apparatus according to Embodiment 1 of the present invention will be explained. FIG. 7 is a block diagram showing the configuration of the image pickup apparatus according to Embodiment 1 of the present invention. The SLSI 125 includes a system control portion 131, an image pickup element driving portion 132, an image pickup signal input portion 133, a preprocessing portion 134, an input buffer 135, a calculating portion 136, an output buffer 137, and an input/output portion 138. The input buffer 135 includes a first input buffer 135a, a second input buffer 135b, a third input buffer 135c, and a fourth input buffer 135d. The calculating portion 136 includes a calculating buffer 141, a parallax calculating portion 142, a distance calculating portion 143, and a transfer range determining portion 144. The calculating buffer 141 includes a first calculating buffer 141a and a second calculating buffer 141b. The output buffer 137 includes a first output buffer 137a and a second output buffer 137b.

The system control portion 131 is constituted by a CPU (Central Processing Unit), a logic circuit, and the like, and controls the entire SLSI 125.

The image pickup element driving portion 132 is constituted by a logic circuit and the like, generates a signal for driving the image pickup element 123, and applies to the image pickup element 123 a voltage corresponding to this signal.

The image pickup signal input portion 133 is constituted by connecting in series a CDS circuit (Correlated Double Sampling Circuit), an AGC (Automatic Gain Controller), and an ADC (Analog Digital Converter), receives an electric signal from the image pickup element 123, removes a fixed noise by the CDS circuit, adjusts a gain by the AGC, and converts by the ADC an analog signal into a digital value to generate an image pickup signal I0.

The transfer range determining portion 144 determines a transfer range flag FO in the following manner. When the transfer range flag FO is 1 (first operating mode), the image pickup signals generated by all of the image pickup regions are set as the transfer range. When the transfer range flag FO is 2 (second operating mode), the image pickup signals generated by the half of the image pickup regions are set as the transfer range. Note that the transfer range flag FO is initialized to 1.

The image pickup element driving portion 132 drives the image pickup element 123 such that the image pickup signals corresponding to the transfer range determined by the transfer range determining portion 144 are transferred to the image pickup signal input portion 133. With this, the image pickup signals corresponding to a specific transfer range are transferred from the image pickup element 123 to the image pickup signal input portion 133.

Figure 8:
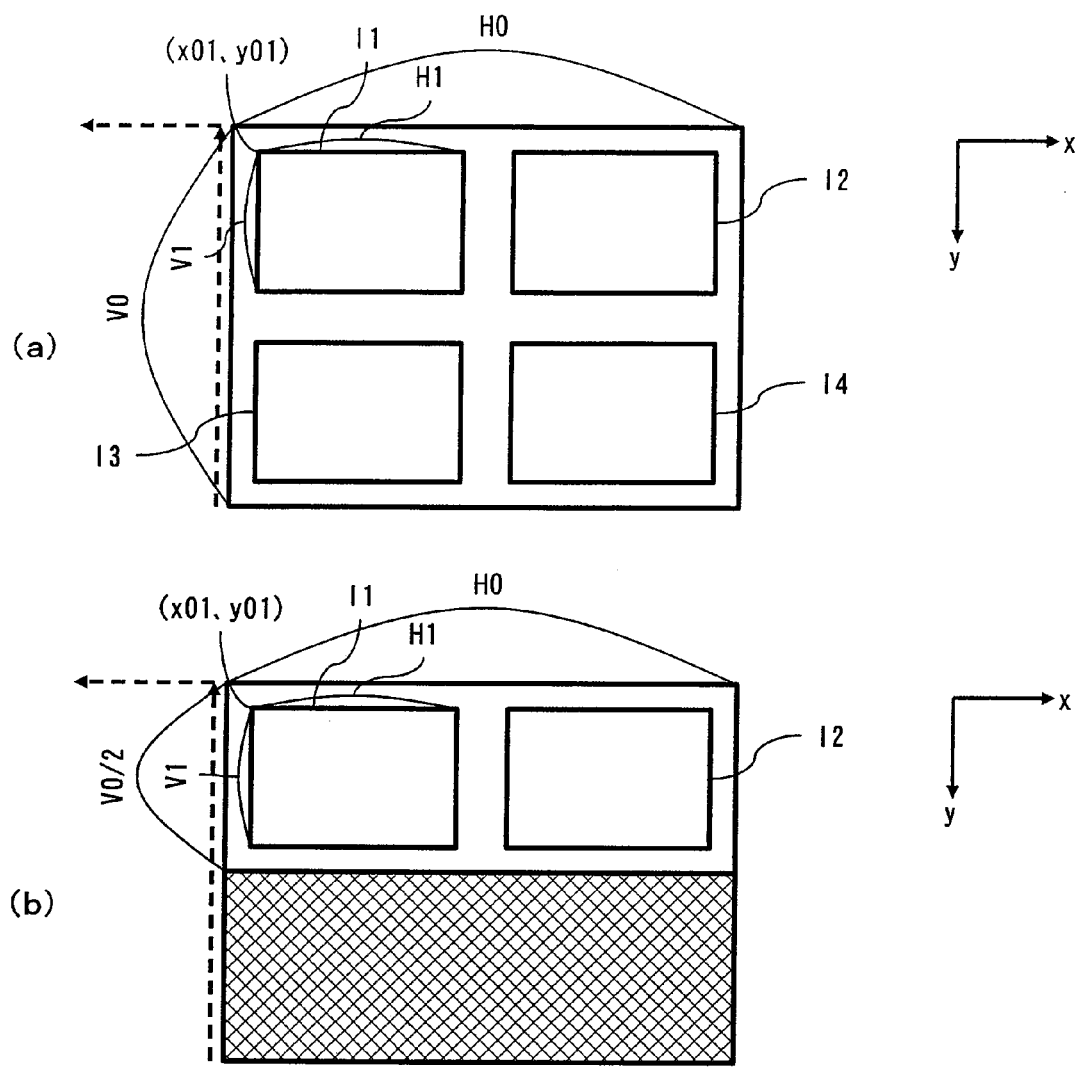
FIG. 8 are diagrams for explaining a cut-out position of an image pickup signal of the image pickup apparatus according to Embodiment 1 of the present invention.
Figure 9:
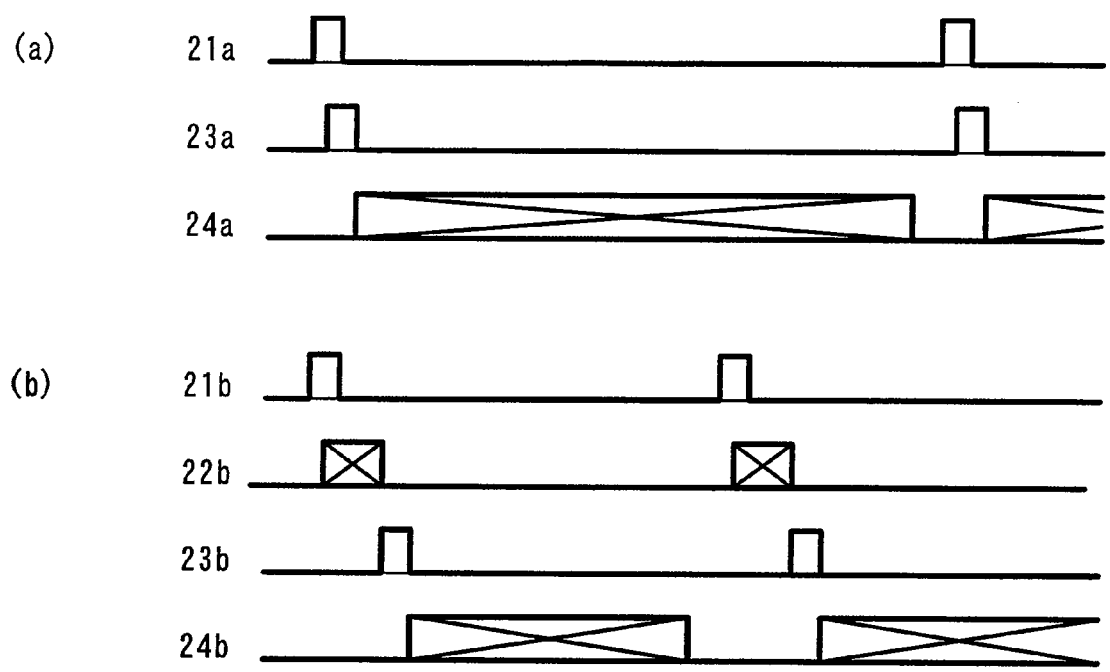
FIG. 9 are timing charts showing the transfer of the image pickup signals of the image pickup apparatus according to Embodiment 1 of the present invention.

FIG. 8 are diagrams for explaining a cut-out position of the image pickup signal of the image pickup apparatus according to Embodiment 1 of the present invention. FIG. 9 are timing charts showing the transfer of the image pickup signals of the image pickup apparatus according to Embodiment 1 of the present invention. When the transfer range flag FO is 1, the transfer range is the image pickup signals generated by all of the image pickup regions. Therefore, as shown in FIG. 8(a), the image pickup signal of H0 pixels in the horizontal direction and V0 pixels in the vertical direction is transferred. To be specific, an image pickup signal I0(x, y) input to the image pickup signal input portion 133 has H0 pixels in the x direction and V0 pixels in the y direction, is input in order of I0(0, 0) ((x, y)=(0, 0)), I0(1, 0), I0(2, 0), . . . , and I0(H0−1, V0−1), and is sequentially transferred to the preprocessing portion 134. As shown in FIG. 9(*a*), after a certain period from a rising edge of a vertical synchronization signal 21*a*, electric charge is transferred from the photodiode of the CCD sensor to vertical transfer CCDs at a timing of a high level of a signal 23*a* and is sequentially transferred in the vertical CCDs and horizontal CCDs at a high level of a signal 24*a*, and the analog signal is converted into a digital signal that is the image pickup signal and is input in the image pickup signal input portion 133.

Meanwhile, when the transfer range flag FO is 2, the transfer range is the image pickup signals generated by the half of the image pickup regions. Therefore, as shown in FIG. 8(*b*), the image pickup signals of H0 pixels in the horizontal direction and V0/2 pixels in the vertical direction are transferred. To be specific, the image pickup signal I0(*x*, y) input from the image pickup signal input portion 133 has H0 pixels in the x direction and V0/2 pixels in the y direction, is input in order of I0(0, 0) ((x, y)=(0, 0)), I0(1, 0), I0(2, 0), . . . , and I0(H0−1, V0/2−1), and is sequentially transferred to the preprocessing portion 134. In FIG. 8(*b*), an upper-half non-hatched portion shows pixels (region corresponding to the transfer range) which are transferred, and a lower-half hatched portion shows pixels (region not corresponding to the transfer range) which are not transferred. As shown in FIG. 9(*b*), after a certain period from a rising edge of a vertical synchronization signal 21*b*, electric charge remained in the vertical CCDs is swept out to the horizontal CCDs at a high level of a signal 22*b*, is transferred from the photodiode of the CCD sensor to the vertical transfer CCDs at a timing of a high level of a signal 23*b*, and is sequentially transferred in the vertical CCDs and the horizontal CCDs at a high level of a signal 24*b*, and the analog signal is converted into the digital signal that is the image pickup signal and is input in the image pickup signal input portion 133. Note that the transfer range when the FO is 2 is set to a half, which is transferred first, of the transfer range when the FO is 1.

The transfer time (period in which the signal 24*b* is the high level) of the electric charge when the transfer range flag FO is 2 (second operating mode) is substantially half of the transfer time (period in which the signal 24*a* is the high level) of the electric charge when the transfer range flag FO is 1 (first operating mode). Therefore, a time interval for transferring one image is shortened when the transfer range flag FO is 2 (second operating mode). Note that since the sweep-out of the electric charge is not carried out when the FO is 1 (first operating mode), but the sweep-out of the electric charge is carried out when the FO is 2 (second operating mode), a time for the sweep-out of the electric charge is unnecessary when the FO is 1 (first operating mode). This prevents an increase in the time interval for transferring one image when the FO is 1 (first operating mode). Moreover, when the FO is 2 (second operating mode), the sweep-out of the electric charge of only the vertical CCDs (to be specific, the vertical CCDs in V0/2 columns in Embodiment 1) which have not been transferred last time is done as the sweep-out of the electric charge. Therefore, it is possible to minimize the increase in the time interval for transferring one image as compared to a case of carrying out the sweep-out of the vertical CCDs of all columns.

The preprocessing portion 134 is constituted by a logic circuit and the like. The preprocessing portion 134 cuts out an image from the image pickup signal I0, carries out an intensity correction, and sequentially transfers the image to the input buffer 135. Since the transfer range is the image pickup signals generated by all of the image pickup regions when the FO is 1, a first image pickup signal I1, a second image pickup signal I2, a third image pickup signal I3, and a fourth image pickup signal I4 are generated and sequentially transferred to the input buffer 135. The first image pickup signal I1, the second image pickup signal I2, the third image pickup signal I3, and the fourth image pickup signal I4 are obtained from the subject images, respectively, formed by the first lens portion 113*a*, the second lens portion 113*b*, the third lens portion 113*c*, and the fourth lens portion 114*d*, respectively. As shown in FIG. 8(*a*) and Formula 2 below, the first image pickup signal I1 is obtained by cutting out from the image pickup signal I0 a signal having an origin point (x01, y01), H1 pixels in the x direction, and V1 pixels in the y direction, and correcting the signal by a first intensity correction coefficient ks1. As shown in FIG. 8(*a*) and Formula 3 below, the second image pickup signal I2 is obtained by cutting out from the image pickup signal I0 a signal having an origin point (x02, y02), H1 pixels in the x direction, and V1 pixels in the y direction, and correcting the signal by a second intensity correction coefficient ks2. As shown in FIG. 8(*a*) and Formula 4 below, the third image pickup signal I3 is obtained by cutting out from the image pickup signal I0 a signal having an origin point (x03, y03), H1 pixels in the x direction, and V1 pixels in the y direction, and correcting the signal by a third intensity correction coefficient ks3. As shown in FIG. 8(*a*) and Formula 5 below, the fourth image pickup signal I4 is obtained by cutting out from the image pickup signal I0 a signal having an origin point (x04, y04), H1 pixels in the x direction, and V1 pixels in the y direction, and correcting the signal by a fourth intensity correction coefficient ks4.

$$I1(x, y) = ks1(x, y) * I0(x + x01, y + y01) \quad \text{Formula 2}$$

$$I2(x, y) = ks2(x, y) * I0(x + x02, y + y02) \quad \text{Formula 3}$$

$$I3(x, y) = ks3(x, y) * I0(x + x03, y + y03) \quad \text{Formula 4}$$

$$I4(x, y) = ks4(x, y) * I0(x + x04, y + y04) \quad \text{Formula 5}$$

The first intensity correction coefficient $ks1(x, y)$, the second intensity correction coefficient $ks2(x, y)$, the third intensity correction coefficient $ks3(x, y)$, and the fourth intensity correction coefficient $ks4(x, y)$ denote intensity correction coefficients of the first image pickup signal I1, the second image pickup signal I2, the third image pickup signal I3, and the fourth image pickup signal I4, respectively, at coordinates (x, y), are determined by shooting a specific chart in a checking step for example, and are stored in an EEPROM or a flash memory. Note that the apparatus may not have the coefficients of respective pixels but have representative points, and the first intensity correction coefficient $ks1(x, y)$, the second intensity correction coefficient $ks2(x, y)$, the third intensity correction coefficient $ks3(x, y)$, and the fourth intensity correction coefficient $ks4(x, y)$ may be obtained by linear interpolation using the representative points. Moreover, an approximation formula may be formulated, the apparatus may have only coefficients of the approximation formula, and the first intensity correction coefficient $ks1(x, y)$, the second intensity correction coefficient $ks2(x, y)$, the third intensity correction coefficient $ks3(x, y)$, and the fourth intensity correction coefficient $ks4(x, y)$ of respective coordinates may be determined based on the coefficients. Moreover, a coordinate transformation may be suitably carried out to correct, for example, displacement of the optical axis of the lens.

Meanwhile, since the transfer range is the image pickup signals generated by the half of the image pickup regions when the FO is 2, the first image pickup signal I1 and the second image pickup signal I2 are generated and sequentially transferred to the input buffer 135. In this case, processes for the third image pickup signal I3 and the fourth image pickup signal I4 are omitted as compared to a case where the FO is 1 (a case where all of the image pickup regions are transferred). Since processes for the first image pickup signal I1 and the second image pickup signal I2 are the same as the above processes, explanations thereof are omitted.

When the FO is 1, the first input buffer 135a constituted by a DRAM (Dynamic Random Access Memory) and the like sequentially loads the first image pickup signal I1, and stores data of H1*V1 pixels (H1 pixels in the x direction and V1 pixels in the y direction). The second input buffer 135b constituted by a DRAM and the like sequentially loads the second image pickup signal I2, and stores data of H1*V1 pixels (H1 pixels in the x direction and V1 pixels in the y direction). The third input buffer 135c constituted by a DRAM and the like sequentially loads the third image pickup signal I3, and stores data of H1*V1 pixels (H1 pixels in the x direction and V1 pixels in the y direction). The fourth input buffer 135d constituted by a DRAM and the like sequentially loads the fourth image pickup signal I4, and stores data of H1*V1 pixels (H1 pixels in the x direction and V1 pixels in the y direction).

Meanwhile, when the FO is 2, the first image pickup signal I1 and the second image pickup signal I2 are generated and sequentially input to the input buffer 135. In this case, processes for the third input buffer 135c and the fourth input buffer 135d are omitted as compared to a case where the FO is 1 (a case where all of the image pickup regions are transferred). Since processes for the first input buffer 135a and the second input buffer 135b are the same as the above processes, explanations thereof are omitted.

The calculating portion 136 is constituted by: the first calculating buffer 141a and the second calculating buffer 141b, each of which is constituted by a SRAM (Static Random Access Memory); the parallax calculating portion 142 constituted by a logic circuit, a CPU, and the like; the distance calculating portion 143 constituted by a logic circuit, a CPU, and the like; and the transfer range determining portion 144 constituted by a logic circuit, a CPU, and the like. When the FO is 1, the calculating portion 136 loads the first image pickup signal I1, the second image pickup signal I2, the third image pickup signal I3, and the fourth image pickup signal I4 by the block, stores the signals in the first calculating buffer 141a and the second calculating buffer 141b, calculates the parallax by the parallax calculating portion 142 based on, for example, data of the first calculating buffer 141a and the second calculating buffer 141b, calculates a distance by the distance calculating portion 143 based on the obtained parallax, and transfers the obtained distance data to the output buffer 137.

Meanwhile, when the FO is 2, the transfer range is the image pickup signals generated by the half of the image pickup regions, and therefore, only the first image pickup signal I1 and the second image pickup signal I2 are transferred. On this account, the calculating portion 136 loads the first image pickup signal I1 and the second image pickup signal I2 by the block, stores the signals in the first calculating buffer 141a and the second calculating buffer 141b, calculates the parallax by the parallax calculating portion 142 based on, for example, data of the first calculating buffer 141a and the second calculating buffer 141b, calculates a distance by the distance calculating portion 143 based on the obtained parallax, and transfers the obtained distance data to the output buffer 137.

The output buffer 137 is constituted by a DRAM and the like, stores the image data transferred from the input buffer 135 and the distance data transferred from the calculating portion 136, and sequentially transfers the data to the input/output portion 138.

The input/output portion 138 communicates with the host CPU (not shown), and outputs the image data and the distance data to the host CPU, an external memory (not shown), and an external display apparatus (not shown), such as a liquid crystal display.

Figure 10A:
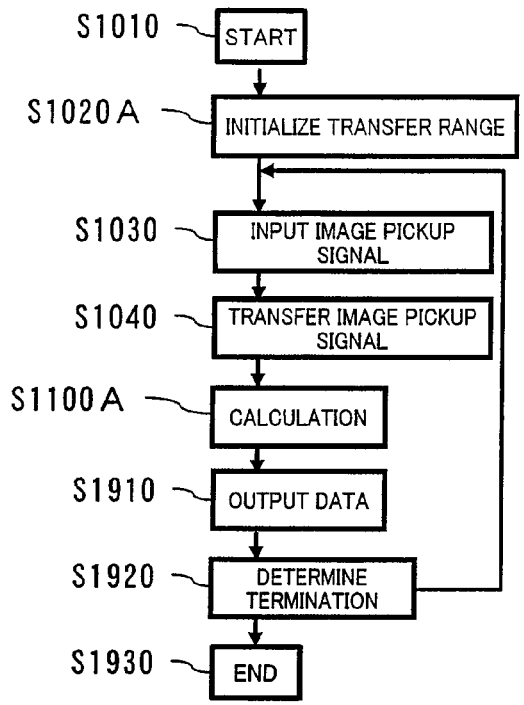
FIG. 10A is a flow chart showing the operation of the image pickup apparatus according to Embodiment 1 of the present invention.

FIG. 10A is a flow chart showing the operation of the image pickup apparatus according to Embodiment 1 of the present invention. The image pickup apparatus 101 is operated by the system control portion 131 of the SLSI 125 in accordance with this flow chart.

In Step S1010, the image pickup apparatus 101 starts operating. For example, the host CPU (not shown) commands the image pickup apparatus 101 via an input/output portion 136 to start operating. Thus, the image pickup apparatus 101 starts operating. Next, Step S1020A is executed.

In Step S1020A, initialization of the transfer range is carried out. In the present embodiment, the transfer range flag FO is set to 1 (first operating mode) by this initialization. Next, Step S1030 is executed.

In Step S1030, the image pickup signal is input. In accordance with the command of the system control portion 131, the image pickup element driving portion 132 outputs as needed to the image pickup element 123 a signal for carrying out electronic shutter or transfer. As a result, when the transfer range flag FO is 1 (first operating mode), the image pickup signal input portion 133 inputs the image pickup signal I0(x, y) of H0 pixels in the x direction and V0 pixels of the y direction, to be specific, inputs the image pickup signal I0(x, y) in order of I0(0,0)((x, y)=(0, 0)), I0(1, 0), I0(2, 0), . . . , and I0(H0−1, V0−1), and sequentially transfers the signal to the preprocessing portion 134. The preprocessing portion 134 cuts out images from the image pickup signal I0, carries out the intensity correction, generates the first image pickup signal I1, the second image pickup signal I2, the third image pickup signal I3, and the fourth image pickup signal I4, and sequentially transfers the first image pickup signal I1, the second image pickup signal I2, the third image pickup signal I3, and the fourth image pickup signal I4 to the first input buffer 135a, the second input buffer 135b, the third input buffer 135c, and the fourth input buffer 135d, respectively.

Meanwhile, when the transfer range flag FO is 2 (second operating mode), the image pickup signal input portion 133 inputs the image pickup signal I0(x, y) of H0 pixels in the x direction and V0/2 pixels in the y direction, to be specific, inputs the image pickup signal I0(x, y) in order of I0(0,0) ((x, y)=(0, 0)), I0(1, 0), I0(2, 0), . . . , and I0(H0−1, V0/2−1), and sequentially transfers the signal to the preprocessing portion 134. The preprocessing portion 134 cuts out images from the image pickup signal I0, carries out the intensity correction, generates the first image pickup signal I1 and the second image pickup signal I2, and sequentially transfers the first image pickup signal I1 and the second image pickup signal to the first input buffer 135a and the second input buffer 135b, respectively. Next, Step S1040 is executed.

In Step S1040, the first image pickup signal I1 stored in the first input buffer 135a is transferred to the first output buffer 137a, and the first output buffer 137a stores the first image pickup signal I1 as image data. Next, Step S1100A is executed.

In Step S1100A, the distance data is generated and sequentially transferred to the second output buffer 137b. Moreover, the transfer range is determined, and the transfer range flag FO is set. Details of this operation will be described later. Next, Step S1910 is executed.

In Step S1910, data is output to outside. The input/output portion 138 outputs the image data of the first output buffer 137a and the distance data of the second output buffer 137b to the host CPU (not shown) and the external display apparatus (not shown). Next, S1920 is executed.

In Step S1920, whether or not the operation is terminated is determined. For example, the system control portion 131 communicates with the host CPU (not shown) via the input/output portion 136 to request a command indicating whether or not to terminate the operation. When the host CPU commands the termination, the operation is terminated, and next, Step S1930 is executed. On the other hand, when the host CPU does not command the termination, the operation continues, and next, Step S1030 is executed. That is, as long as the host CPU does not command the termination, the loop of Steps S1030, S1040, S1100A, and S1910 is continuously executed.

In Step S1930, the operation is terminated.

Next, details of the operation of Step S1100A will be explained. FIG. 1 IA is a flow chart showing the operation of the calculating portion of the image pickup apparatus according to Embodiment 1 of the present invention. The flow chart of FIG. 1 IA shows the details of the operation of Step S1100A. In the calculation of Step S1100A, first, Step S1110 is executed.

In Step S1110, a calculating operation is started. Next, Step S1200 is executed.

Figure 12:
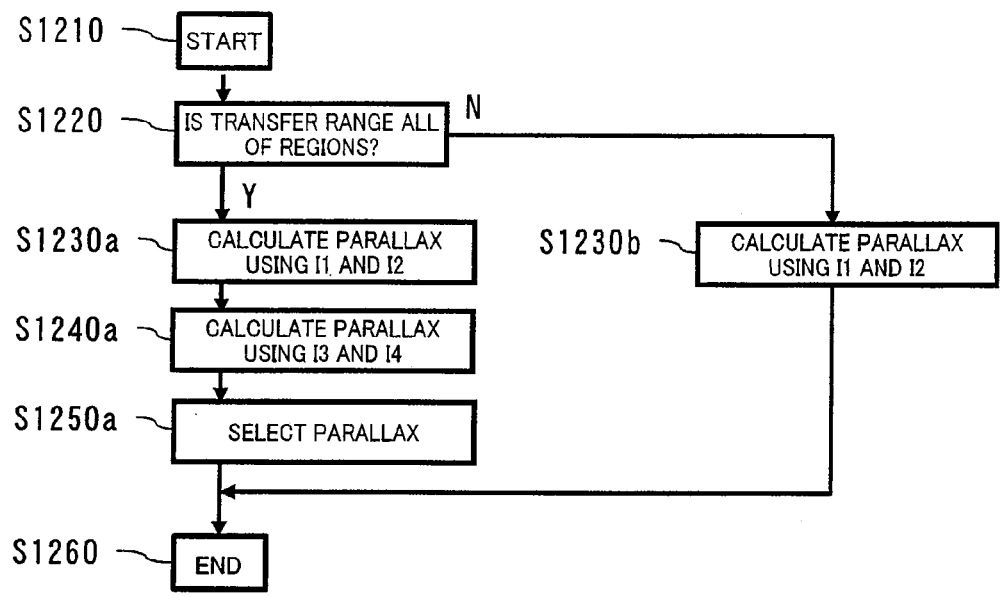
FIG. 12 is a flow chart showing the operation of a parallax calculation of the image pickup apparatus according to Embodiment 1 of the present invention.

In Step S1200, the parallax calculation is executed. FIG. 12 is a flow chart showing the operation of the parallax calculation of the image pickup apparatus according to Embodiment 1 of the present invention. The flow chart of FIG. 12 shows details of the operation of Step S1200. In the calculation of Step S1200, first, Step S1210 is executed.

In Step S1210, the parallax calculation is started. Next, Step S1220 is executed.

In Step S1220, the process branches off by the transfer range flag FO. When the transfer range flag FO is 1 (Y in S1220), the transfer range becomes the image pickup signals generated by all of the image pickup regions, and next, Step S1230a is executed. Meanwhile, when the transfer range flag FO is 2 (N in S1220), the transfer range becomes the image pickup signals generated by the half of the image pickup regions, and next, Step 1230b is executed.

Figure 13:
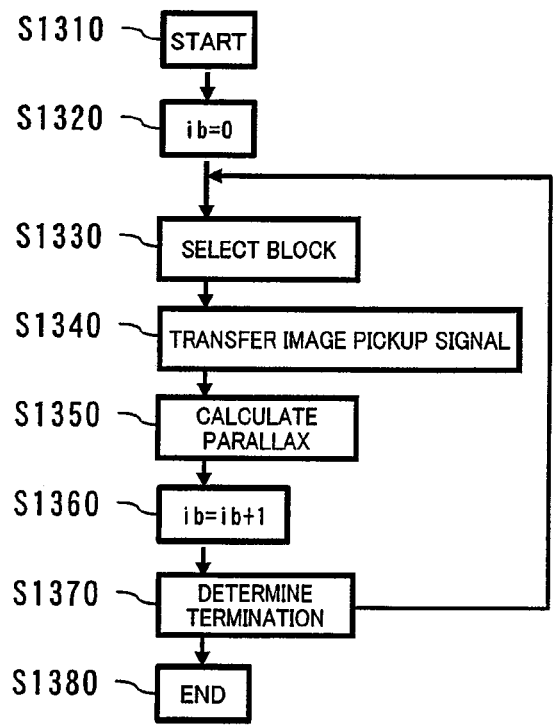
FIG. 13 is a flow chart showing the operation of the parallax calculation utilizing a first image pickup signal and a second image pickup signal in the image pickup apparatus according to Embodiment 1 of the present invention.

In Step S1230a, the parallax calculation utilizing the first image pickup signal and the second image pickup signal is executed. FIG. 13 is a flow chart showing the operation of the parallax calculation utilizing the first image pickup signal and the second image pickup signal in the image pickup apparatus according to Embodiment 1 of the present invention. The flow chart of FIG. 13 shows details of the operation of Step S1230a. In the calculation of Step S1230, first, Step S1310 is executed.

In Step S1310, the parallax calculation utilizing the first image pickup signal and the second image pickup signal is started. Next, Step S1320 is executed.

In Step S1320, initialization of setting a block index ib to 0 is carried out. Next, Step S1330 is executed.

Figure 14:
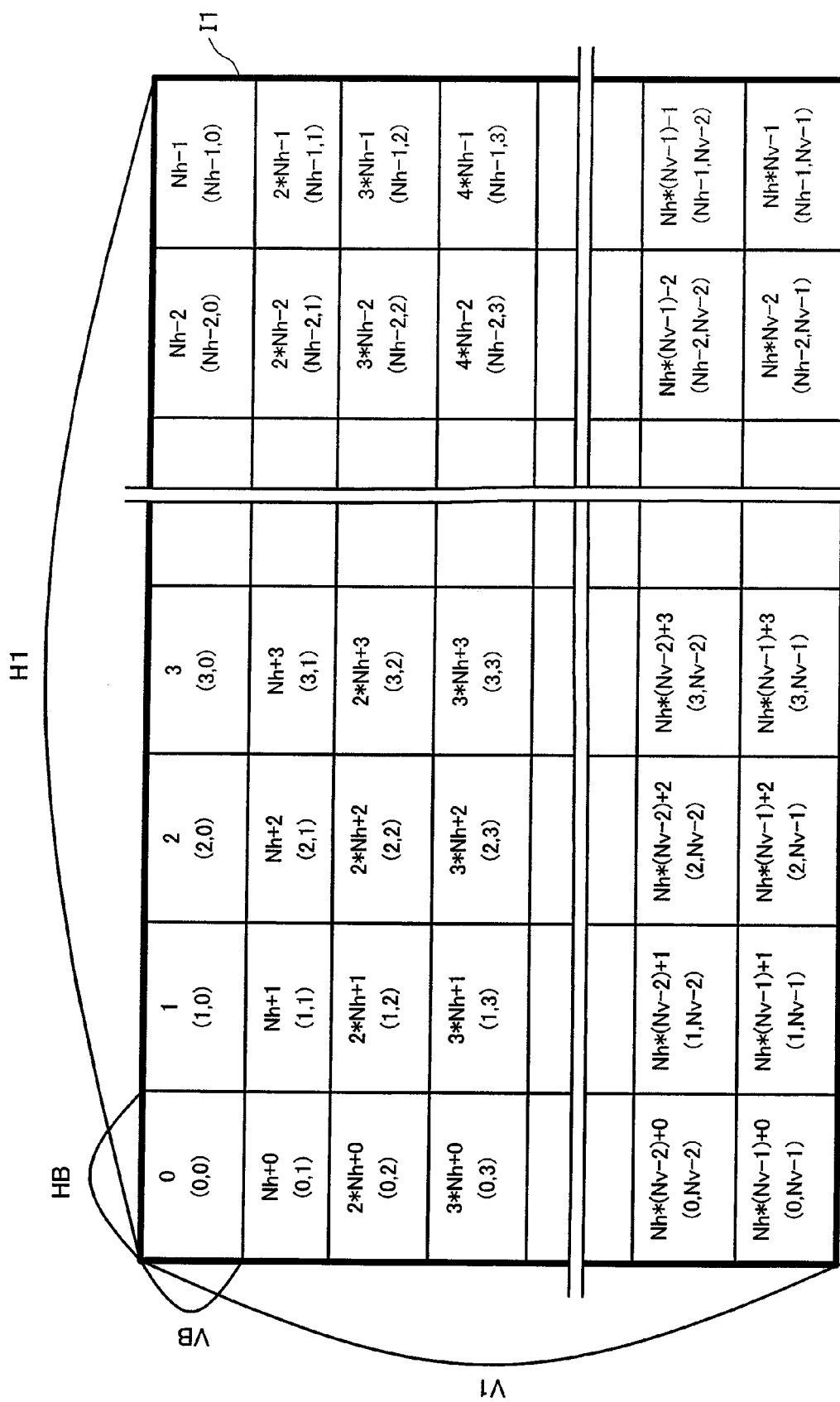
FIG. 14 is a diagram for explaining divided blocks and calculation order of the first image pickup signal in the parallax calculation utilizing the first image pickup signal and the second image pickup signal in the image pickup apparatus according to Embodiment 1 of the present invention.
Figure 15:
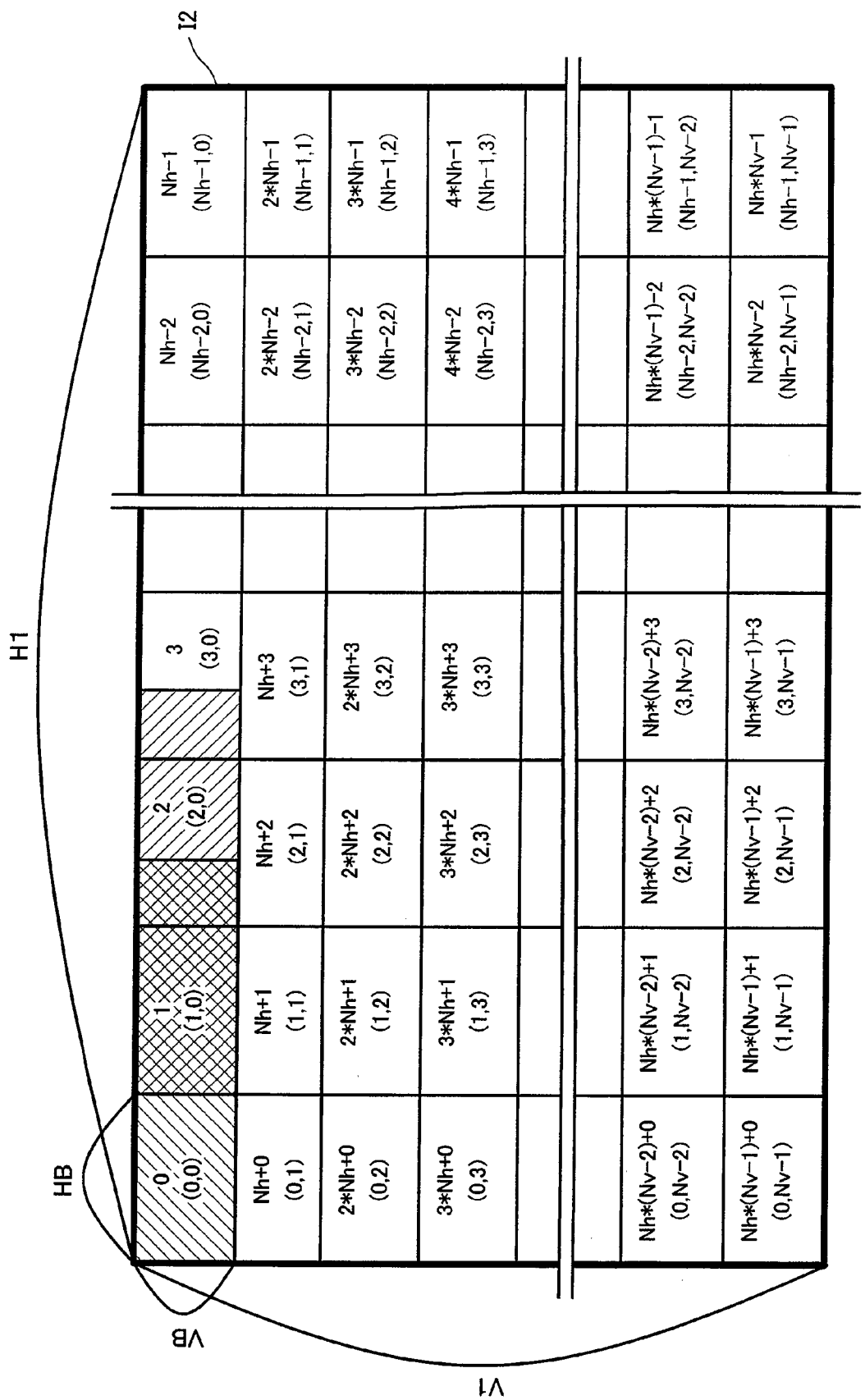
FIG. 15 is a diagram for explaining the divided blocks and calculation order of the second image pickup signal in the parallax calculation utilizing the first image pickup signal and the second image pickup signal in the image pickup apparatus according to Embodiment 1 of the present invention.

In Step S1330, the block is selected. FIG. 14 is a diagram for explaining divided blocks and calculation order of the first image pickup signal in the parallax calculation utilizing the first image pickup signal and the second image pickup signal in the image pickup apparatus according to Embodiment 1 of the present invention. FIG. 15 is a diagram for explaining the divided blocks and calculation order of the second image pickup signal in the parallax calculation utilizing the first image pickup signal and the second image pickup signal in the image pickup apparatus according to Embodiment 1 of the present invention. In FIG. 14, the first image pickup signal I1 is divided into rectangular blocks each having HB pixels in the x direction and VB pixels in the y direction. Adjacent rectangular blocks are arranged so as to be displaced from each other by HB pixels in the x direction or VB pixels in the y direction. The first image pickup signal I1 has Nh blocks in the x direction and Nv blocks in the y direction. Therefore, the blocks do not overlap each other in the x direction or the y direction. In FIG. 15, the second image pickup signal I2 is divided into rectangular blocks each having (HB+SB) pixels in the x direction and VB pixels in the y direction. Adjacent rectangular blocks are arranged so as to be displaced from each other by HB pixels in the x direction or VB pixels in the y direction. The second image pickup signal I2 has Nh blocks in the x direction and Nv blocks in the y direction. Therefore, adjacent blocks overlap each other in the x direction, but do not overlap each other in the y direction. Moreover, in FIG. 15, regarding a block which is located on a right side and cannot have (HB+SB) pixels in the x direction, an x-direction right end thereof is suitably omitted. Hereinafter, Embodiment 1 will explain an example in which HB is 32 and VB is 32.

In FIGS. 14 and 15, a number shown on an upper level in each block denotes a block index ib. Moreover, in FIGS. 14 and 15, coordinates (ibx, iby) shown on a lower level in each block denote that the block is an ibx-th block in the x direction and an iby-th block in the y direction. Here, ibx is from 0 to Nh−1, and iby is from 0 to Vh−1. In Step S1320, the block shown by the block index ib (block shown by the coordinates (ibx, iby)) in FIGS. 14 and 15 is selected. Next, Step S1340 is executed.

In Step S1340, the image pickup signal is transferred. In Step S1340, the first image pickup signal I1 of the selected block is transferred to the first calculating buffer 141a. Then, a value at the coordinates (x, y) in the first calculating buffer 141a is set as Bc1(x, y). Here, since HB is 32 and VB is 32, x is from 0 to 31 and y is from 0 to 31. In Step S1340, the second image pickup signal I2 of the selected block is transferred to the second calculating buffer 141b. Then, a value at the coordinates (x, y) in the second calculating buffer 141b is set as Bc2(x, y). Here, since HB is 32 and VB is 32, x is from 0 to 31+SB and y is from 0 to 31. For example, when ib is 0, the image pickup signal 11 of 1,024 pixels surrounded by the coordinates (0, 0) and the coordinates (31, 31) is transferred to the first calculating buffer 141a. Moreover, the image pickup signal I2 of (1,024+32*SB) pixels which are marked with diagonal lines extending in a diagonally upper right direction in FIG. 15 and surrounded by the coordinates (0, 0) and the coordinates (31+SB, 31) is transferred to the second calculating buffer 141b. Next, when ib is 1, the image pickup signal I1 of 1,024 pixels surrounded by the coordinates (32, 0) and the coordinates (63, 31) is transferred to the first calculating buffer 141a. Moreover, the second calculating buffer 141b requires the image pickup signal I2 of (1,024+32*SB) pixels which are marked with diagonal lines extending in a diagonally lower right direction in FIG. 15 and surrounded by the coordinates (32, 0) and the coordinates (63+SB, 31). However, since a portion (region of 32*SB pixels surrounded by the coordinates (32, 0) and the coordinates (31+SB, 31)) which overlaps the block whose ib is 0 has already been transferred to the second calculating buffer 141b, only 1,024 pixels surrounded by the coordinates (32+SB, 0) and the coordinates (63+SB, 31) are newly transferred to the second calculating buffer 141b. Thus, it is possible to prevent the increase in the transfer time. Next, Step S1350 is executed.

Figure 16:
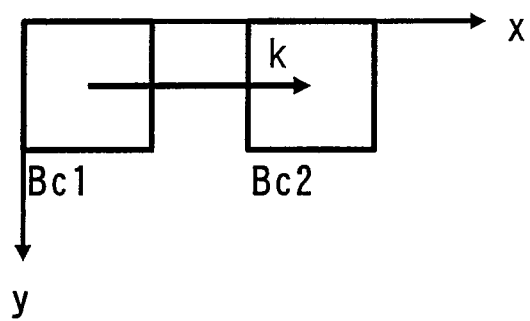
FIG. 16 is a diagram for explaining a calculation region of a parallax evaluated value in the parallax calculation utilizing the first image pickup signal and the second image pickup signal in the image pickup apparatus according to Embodiment 1 of the present invention.

In Step S1350, the parallax calculation is executed. First, a parallax evaluated value R(k) is calculated. Here, k denotes a displacement amount showing how much amount an image is displaced, and k is changed to be 0, 1, 2, . . . , and SB. FIG. 16 is a diagram for explaining a calculation region of the parallax evaluated value in the parallax calculation utilizing the first image pickup signal and the second image pickup signal in the image pickup apparatus according to Embodiment 1 of the present invention. In FIG. 16, a region in which data Bc1 is stored is a region in the first calculating buffer 141*a*. Moreover, a region indicated by data Bc2 is a region which is in the second calculating buffer 141*b* and is away from the block indicated by Bc1 in FIG. 16 in the x direction by the displacement amount k. Then, a SAD (Sum of Absolute Differences) shown by Formula 6 below is calculated in a case where the displacement amount k is from 0 to SB, thereby obtaining the parallax evaluated value R(k).

$$R(k) = \Sigma\Sigma |Bc1(x, y) - Bc2(x+k, y)| \qquad \text{Formula 6}$$

This parallax evaluated value R(k) shows how much the data Bc1 of the first calculating buffer 141*a* and the data Bc2 of the second calculating buffer 141*b* in the region away from the data Bc1 in the x direction by k are correlated to each other. The smaller the parallax evaluated value R(k) is, the stronger the correlation therebetween is (that is, in a case where the parallax evaluated value R(k) is small, the data Bc1 and the data Bc2 are similar to each other). Here, since the data Bc1 of the first calculating buffer 141*a* is the transferred first image pickup signal I1, and the data Bc2 of the second calculating buffer 141*b* is the transferred second image pickup signal I2, this parallax evaluated value R(k) shows how much the first image pickup signal I1 and the corresponding second image pickup signal I2 are correlated to each other.

Figure 17:
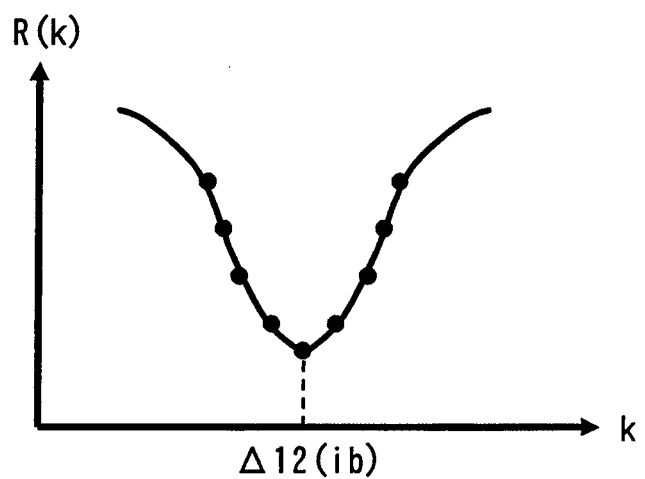
FIG. 17 is a diagram for explaining a relation between the parallax and the parallax evaluated value in the parallax calculation utilizing the first image pickup signal and the second image pickup signal in the image pickup apparatus according to Embodiment 1 of the present invention.

FIG. 17 is a diagram for explaining a relation between the parallax and the parallax evaluated value in the parallax calculation utilizing the first image pickup signal and the second image pickup signal in the image pickup apparatus according to Embodiment 1 of the present invention. As shown in shown FIG. 17, the parallax evaluated value R(k) changes depending on the value of the displacement amount k, and is a minimal value when the displacement amount k is A. This shows that the data Bc1 of the first calculating buffer 141*a* is most strongly correlated to (is most similar to) the data Bc2 of the second calculating buffer 141*b* which is located in the region away from the data Bc1 of the first calculating buffer 141*a* in the x direction by k. Therefore, it is found that the parallax in the x direction between the data Bc1 of the first calculating buffer 141*a* and the data Bc2 of the second calculating buffer 141*b* is Δ. Here, this Δ is called the parallax value Δ in this block.

Figure 18:
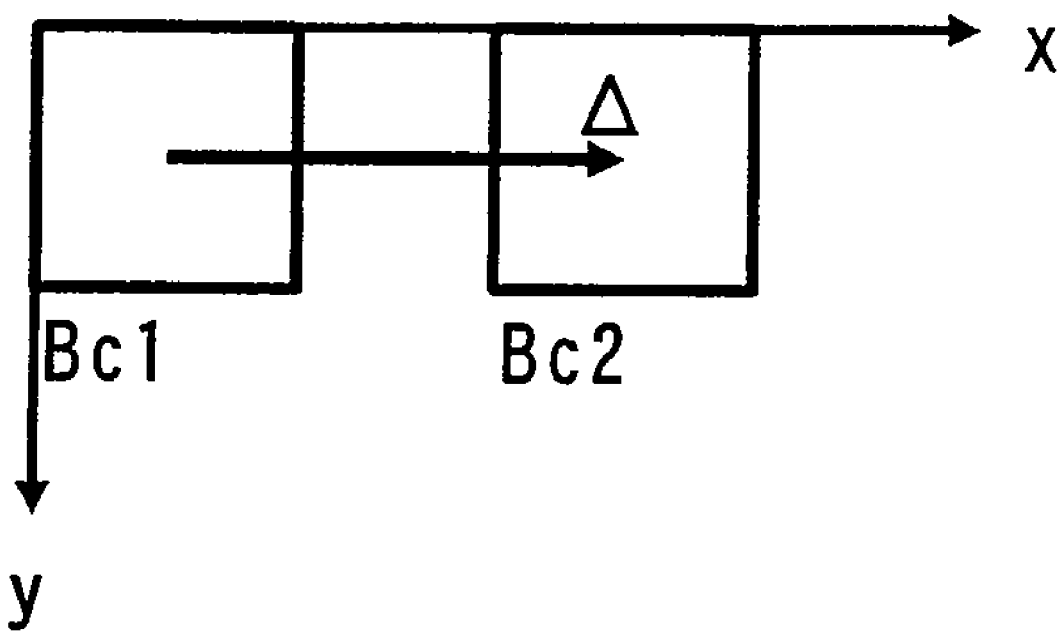
FIG. 18 is a diagram for explaining the calculation region of reliability of the parallax evaluated value in the parallax calculation utilizing the first image pickup signal and the second image pickup signal in the image pickup apparatus according to Embodiment 1 of the present invention.

Next, reliability of the parallax value Δ is calculated. FIG. 18 is a diagram for explaining the calculation region of the reliability of the parallax evaluated value in the parallax calculation utilizing the first image pickup signal and the second image pickup signal in the image pickup apparatus according to Embodiment 1 of the present invention. The region in which the data Bc1 is stored is a region in the first calculating buffer 141*a*. The region in which the data Bc2 is stored is a region which is in the second calculating buffer 141*b* and is away from the data Bc1 in the x direction by Δ. Then, as shown by Formula 7 below, a normalized correlation coefficient regarding the data Bc1(x, y) and the data Bc2(x+Δ, y) in respective regions is regarded as reliability E.

$$E(1, 2)(ibx, iby) = \sum\sum [\{Bc1(x, y) - avg(Bc1(x, y))\} * \qquad \text{Formula 7}$$
$$\{Bc2(x+\Delta, y) - avg(Bc2(x+\Delta, y))\}] /$$
$$\sqrt{\sum\sum [\{Bc1(x, y) - avg(Bc1(x, y))\} *}$$
$$\{Bc1(x, y) - avg(Bc1(x, y))\}] / \sqrt{\sum\sum [}$$
$$\{Bc2(x+\Delta, y) - avg(Bc2(x+\Delta, y))\} *$$
$$\{Bc2(x+\Delta, y) - avg(Bc2(x+\Delta, y))\}]$$

Then, in the parallax calculation utilizing the first image pickup signal and the second image pickup signal, the reliability E is stored as the reliability E(1, 2)(ibx, iby) of the parallax value Δ(1, 2)(ibx, iby) in the block shown by the coordinates (ibx, iby) and having 32*32 pixels. Here, (1, 2) denotes that each of the parallax value and the reliability utilizes the first image pickup signal and the second image pickup signal, and (ibx, iby) denotes the block shown by the block index ib, and the coordinates shown on the lower level of each block in FIG. 14. Next, Step S1360 is executed.

In Step S1360, 1 is added to the block index ib. Next, Step S1370 is executed.

In Step S1370, whether or not the parallax calculation utilizing the first image pickup signal and the second image pickup signal is terminated is determined. When the block index ib is less than Nh*Nv, next, Step S1330 is executed to calculate the parallax of the next block. Meanwhile, when the block index ib is Nh*Nv or more, it is determined that the parallaxes of all the blocks are calculated, and next, Step S1380 is executed.

In Step S1380, the parallax calculation utilizing the first image pickup signal and the second image pickup signal is terminated, and the process returns to an upper routine. Thus, the parallax value Δ(1, 2)(ibx, iby) and its reliability E(1, 2)(ibx, iby) of the block shown by the block index ib and having 32*32 pixels are obtained by resolution of 32*32 pixels in the parallax calculation utilizing the first image pickup signal and the second image pickup signal. Here, (1, 2) denotes that the first image pickup signal and the second image pickup signal are utilized, and (ibx, iby) denotes the coordinates shown on the lower level of each block in FIG. 14 (ibx changes from 0 to Nh−1, and iby changes from 0 to Nv−1). Next, Step S1240*a* of FIG. 12 is executed.

In Step S1240*a*, the parallax calculation utilizing the third image pickup signal and the fourth image pickup signal is executed. Step S1240*a* is similar to Step S1230*a* except that the first image pickup signal I1 is replaced with the third image pickup signal I3, and the second image pickup signal I2 is replaced with the fourth image pickup signal I4. To be specific, the third image pickup signal I3 is divided into the blocks and transferred to the first calculating buffer 141*a*, the fourth image pickup signal I4 is divided into the blocks and transferred to the second calculating buffer 141*b*, and the same operation as in Step S1230*a* is carried out, thereby obtaining the parallax value Δ(3, 4)(ibx, iby) and its reliability E(3, 4)(ibx, iby) by the resolution of 32*32 pixels. Here, (3, 4) denotes that the third image pickup signal and the fourth image pickup signal are utilized, and (ibx, iby) denotes the coordinates shown on the lower level in each block of FIG. 14 (as shown in FIG. 14, ibx changes from 0 to Nh−1, and iby changes from 0 to Nv−1). Next, Step S1250*a* is executed.

In Step S1250*a*, the parallax is selected. The reliability E(1, 2)(ibx, iby) and the reliability E(3, 4)(ibx, iby) are compared to each other in each block, and the parallax which gives the highest reliability is set as the parallax value Δ(ibx, iby) of the block. Moreover, the reliability in this case is E(ibx, iby). Next, Step S1260 is executed.

In Step S1230b, the parallax calculation utilizing the first image pickup signal and the second image pickup signal is executed. Step S1230b is similar to Step S1230a, so that an explanation thereof is omitted. Note that the obtained parallax and reliability are the parallax value Δ(ibx, iby) and the reliability E(ibx, iby), respectively, of each block. Next, Step S1260 is executed.

In Step S1260, the parallax calculation is terminated, and the process returns to the upper routine. Thus, the parallax value Δ(ibx, iby) is obtained for each block. Here, (ibx, iby) denotes the coordinates shown on the lower level of each block of FIG. 14, ibx changes from 0 to Nh−1, and iby changes from 0 to Nv−1. When the transfer range flag FO is 1 (first operating mode), the reliability of the parallax (parallax by the near infrared light) by the first image pickup signal I1 and the second image pickup signal I2 and the reliability of the parallax (parallax by the green light) by the third image pickup signal I3 and the fourth image pickup signal I4 are compared to each other, and the parallax having higher reliability is adopted. Meanwhile, when the transfer range flag FO is 2 (second operating mode), such selection is not carried out, and the parallax (parallax by the near infrared light) by the first image pickup signal I1 and the second image pickup signal I2 is adopted. Next, Step S1700 is executed.

In Step S1700, the distance calculating portion 143 carries out a distance calculation, and sequentially transfers the result of the distance calculation to the second output buffer 137b as the distance data. Formula 1 can be represented by Formula 8 below by solving Formula 1 for the distance A. Therefore, the subject distance A(ibx, iby) in the block having the parallax value Δ(ibx, iby) is calculated as shown by Formula 9 below. Then, the distance data A(ibx, iby) is transferred to the second output buffer 137b.

$$A = f \cdot D / \Delta \quad \text{Formula 8}$$

$$A(ibx, iby) = f \cdot D / \Delta(ibx, iby) \quad \text{Formula 9}$$

Next, Step S1800 is executed.

In Step S1800, the transfer range determining portion 144 determines the transfer range and sets the transfer range flag. As shown by Formula 10 below, when the minimum value of the reliability E(ibx, iby) in each block (ibx, iby) is smaller than a certain set value, the transfer range flag FO is set to 1. Meanwhile, when the minimum value of the reliability E(ibx, iby) in each block (ibx, iby) is a certain set value or higher, the transfer range flag FO is set to 2.

$$FO=1 \text{ (when } \min(E(ibx, iby)) < E0)$$

$$FO=2 \text{ (when } \min(E(ibx, iby)) \geq E0) \quad \text{Formula 10}$$

Next, Step S1900 is executed.

In Step S1900, the calculation is terminated, and the process returns to the upper routine. Next, Step S1910 is executed.

The following effects are obtained by configuring and operating the image pickup apparatus of the present invention as above.

In accordance with the image pickup apparatus according to Embodiment 1 of the present invention, based on the reliability E(ibx, iby) generated from the image pickup signal, the transfer range determining portion 144 sets the transfer range flag FO to 1 (first operating mode) when the reliability E(ibx, iby) is small and sets the transfer range flag FO to 2 (the transfer range is the half of the image pickup regions) when the reliability E(ibx, iby) is large. With this, when the reliability E(ibx, iby) is large, it is determined that there is room for increasing the speed. Therefore, by setting the output flag FO to 2 (second operating mode), the image pickup apparatus capable of carrying out the high-speed parallax calculation and distance calculation is realized. Meanwhile, when the reliability E(ibx, iby) is small, it is determined that the accuracy is further required. Therefore, by setting the output flag FO to 1 (first operating mode), the image pickup apparatus capable of carrying out the highly-accurate parallax calculation and distance calculation is realized.

As above, in the image pickup apparatus of the present embodiment, the operating mode is switched to change the transfer range depending on the reliability E. Here, the reliability E is a value which changes according to, for example, the movement of the subject. Therefore, in other words, the image pickup apparatus of the present embodiment changes the transfer range according to information about the subject, such as the movement of the subject.

Moreover, in the image pickup apparatus of the present invention, when the FO is 2 (second operating mode), the transfer range is the substantially half, which is earlier in order of transfer, of the image pickup regions. To be specific, the time necessary for the transfer is cut in half as shown by 24b of FIG. 9(b), and the electric charge remained in the vertical CCDs is swept out to the horizontal CCDs in a period of 22b of FIG. 9(b). Thus, the time necessary for the transfer is cut in half, thereby realizing the image pickup apparatus capable of carrying out the high-speed parallax calculation and distance calculation.

In the image pickup apparatus of Embodiment 1, the image pickup signal to be transferred has V0 pixels in the vertical direction when the FO is 1 (first operating mode), and the image pickup signal to be transferred has V0/2 pixels in the vertical direction when the FO is 2 (second operating mode). However, some changes may be made. For example, by setting the pixels in the vertical direction of the transfer range when the FO is 2 (second operating mode) to pixels of 0 to y01+V1−1, it is possible to further reduce the transfer time. Moreover, when the lenses vary largely, and respective optical axes are displaced largely, the pixels in the vertical direction of the transfer range when the FO is 2 (second operating mode) is made larger than V0/2, thereby increasing room for adjustment of the origin point in accordance with the increase of the pixels in the vertical direction of the transfer range.

Moreover, in the image pickup apparatus of Embodiment 1, the transfer range is changed depending on the reliability E(ibx, iby). However, the present invention is not limited to this. An essence of the present invention is to carry out the parallax calculation and the distance calculation such that the relation between the speed and the accuracy becomes appropriate by changing the transfer range. Note that the transfer range may be changed by the command of the host CPU. For example, the host CPU may change the transfer range by using the image data. Or, the host CPU may command the transfer range based on subject information specified by a user.

Figure 10B:
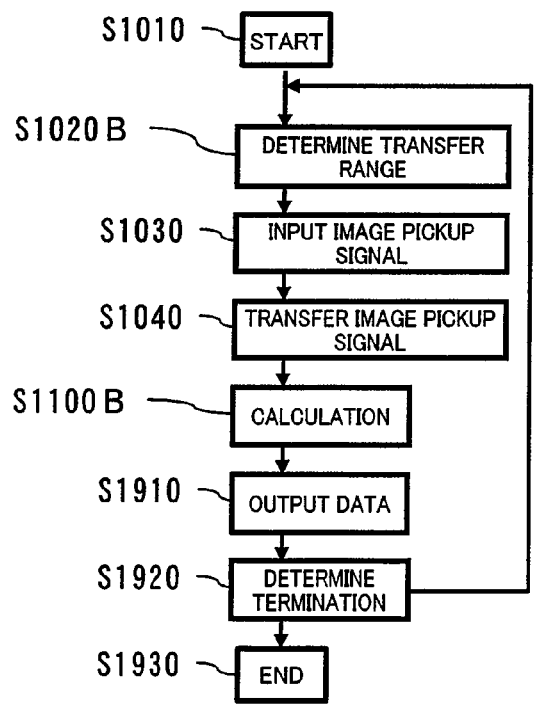
FIG. 10B is a flow chart showing a modification example of the operation of the image pickup apparatus according to Embodiment 1 of the present invention.
Figure 11A:
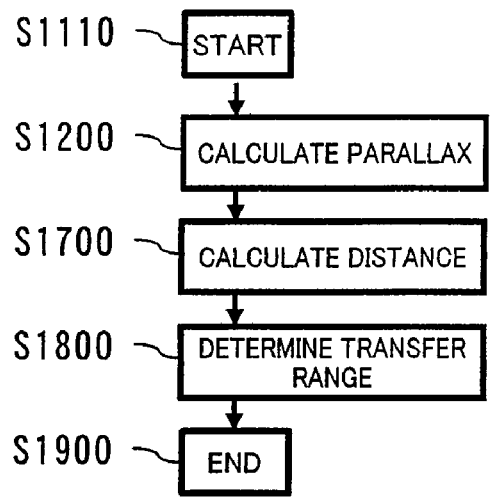
FIG. 11A is a flow chart showing the operation of a calculating portion of the image pickup apparatus according to Embodiment 1 of the present invention.
Figure 11B:
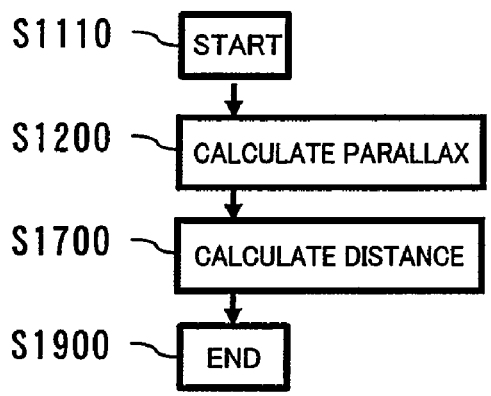
FIG. 11B is a flow chart showing a modification example of the operation of the calculating portion of the image pickup apparatus according to Embodiment 1 of the present invention.

FIG. 10B is a flow chart showing a modification example of the operation of the image pickup apparatus according to Embodiment 1 of the present invention. FIG. 11B is a flow chart showing a modification example of the operation of the calculating portion of the image pickup apparatus according to Embodiment 1 of the present invention. The flow chart of FIG. 11B shows detailed process steps of the calculation (S1100B) of FIG. 10B.

In this modification example, the transfer range is determined without being based on the information about the subject. To be specific, the transfer range is determined in accordance with a predetermined standard regardless of what image the image pickup signal shows. For example, the first operating mode and the second operating mode are alternately switched, or the operating mode is switched such that the ratio of the first operating mode (or the second operating mode) to the entire operation becomes a predetermined ratio.

In the modification example, the transfer range is determined in Step S1020B in the flow chart of FIG. 10B. In the calculation of Step S1100B, the above-described start process (S1110), the parallax calculation (S1200), the distance calculation (S1700), and the termination process (S1900) are executed as shown in FIG. 11B. In the modification example, since the transfer range is determined in Step S1020B, it is unnecessary to carry out a determination process of the transfer range in Step S1800 shown in FIG. 11A.

Note that the user may suitably set the transfer range. For this purpose, for example, when the user gives an instruction of a transfer range setting (operating mode switching) via a switch operable by the user, the host CPU which has received the instruction may command the image pickup apparatus to carry out the transfer range setting (operating mode switching).

Moreover, in the image pickup apparatus of Embodiment 1, an initial value of the transfer range flag FO is 1 (first operating mode). However, the initial value of the transfer range flag FO may be 2 (second operating mode).

Moreover, in the image pickup apparatus of Embodiment 1, the size of the first calculating buffer is 32*32 pixels (32 pixels in the horizontal direction and 32 pixels in the vertical direction). However, the present embodiment is not limited to this. For example, the size of the first calculating buffer may be 4*4 pixels, 8*8 pixels, or 16*16 pixels. Moreover, the size of the first calculating buffer may be suitably changed. Moreover, the parallaxes of a plurality of blocks of different sizes may be calculated, and the parallax may be selected. Further, instead of the rectangular block, the block division may be carried out by extracting an edge or the like. Moreover, the present embodiment is not limited to the calculation of the parallax of the block, but the calculation of the parallax of a line segment that is the edge may be carried out.

Moreover, in the image pickup apparatus of Embodiment 1, the first image pickup signal I1 is transferred to the first output buffer 137a and output from the input/output portion 138. However, the other image pickup signal (the second image pickup signal I2, the third image pickup signal I3, or the fourth image pickup signal I4) may be output. Moreover, a plurality of image pickup signals may be output. Further, the image pickup signal to be output from the input/output portion 138 may be changed depending on a condition of the image pickup signal. For example, the image pickup signals may be compared to one another, thereby outputting the brightest image pickup signal (it is determined that, for example, the average of the amplitude of the image pickup signals is the largest) or the most sharply-defined image pickup signal (it is determined that, for example, the average of derivatives or the maximum value is the largest).

Moreover, in the image pickup apparatus of Embodiment 1, the CCD sensor is used as the image pickup element. However, the other image pickup element (CMOS sensor for example) may be used.

Figure 19:
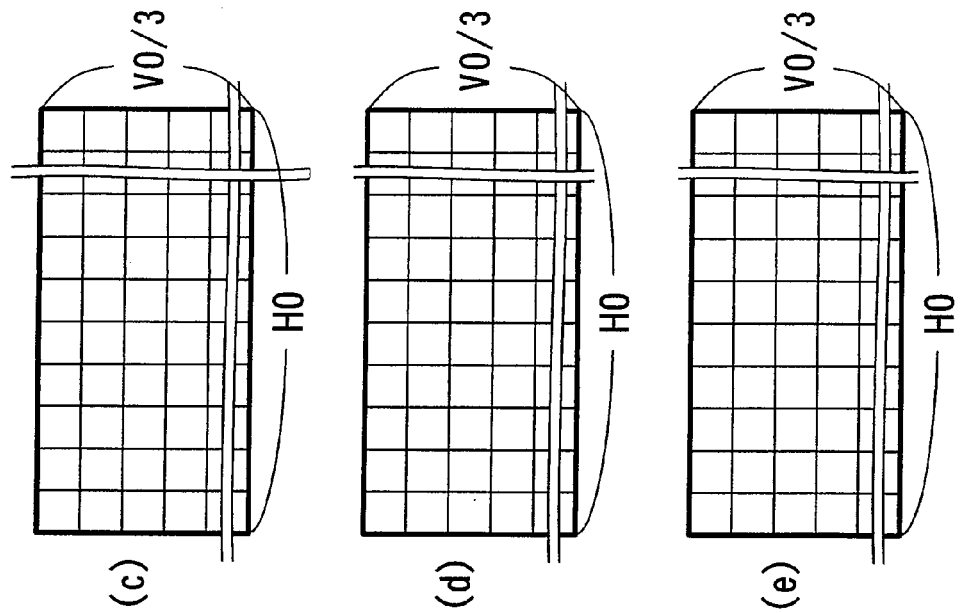
FIG. 19 are diagrams for explaining a field image of a modification of the image pickup apparatus according to Embodiment 1 of the present invention.
Figure 19:
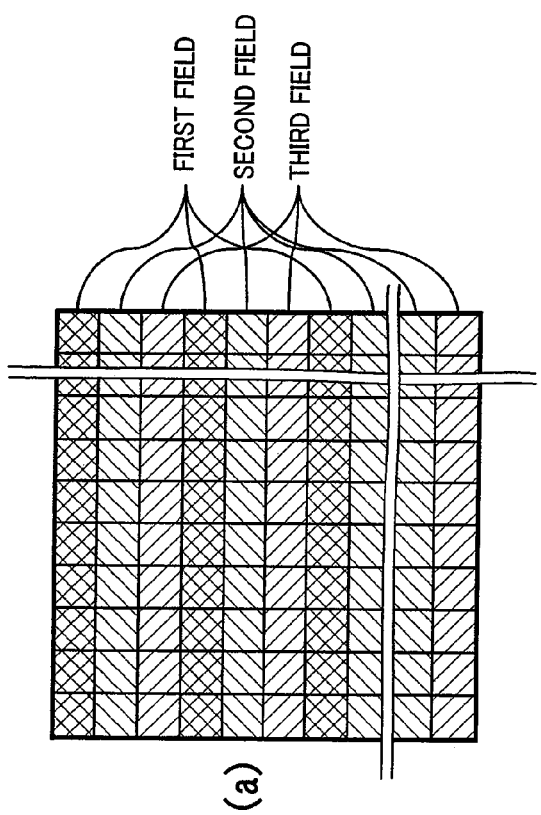
Figure 19:
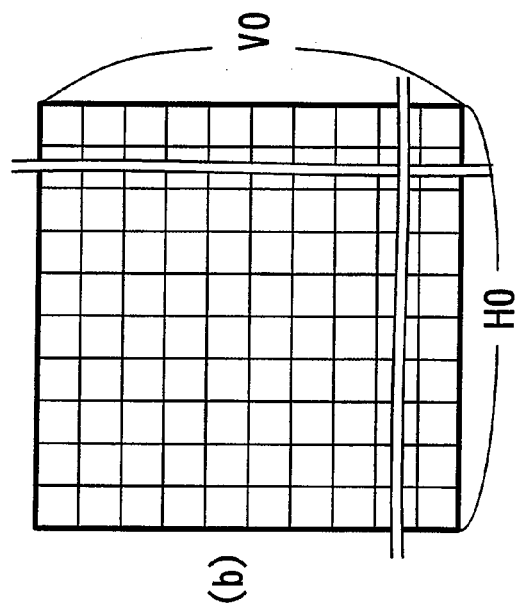

Moreover, in the image pickup element of Embodiment 1, not only the progressive CCD but also an interlace CCD may be utilized as the image pickup element 123. FIG. 19 are diagrams for explaining a field image of a modification of the image pickup apparatus according to Embodiment 1 of the present invention. For example, in the case of utilizing the interlace CCD having three fields, the entire image is, as shown in FIG. 19(a) such that a first field image, a second field image, and a third field image are arranged in order. First, the image pickup signal forming the first field image is transferred. Next, the image pickup signal forming the second field image is transferred. Third, the image pickup signal forming the third field image is transferred. In the case of a normal black-and-white image, these are arranged in order for each line to reproduce the entire image. In a case where the width and height of the entire image (frame image) are H0 and V0, respectively, as shown in FIG. 19(b), the width and height of each of the first field image, the second field image, and the third field image are H0 and V0/3, respectively, as shown in FIGS. 19(c), 19(d), and 19(e).

Figure 20:
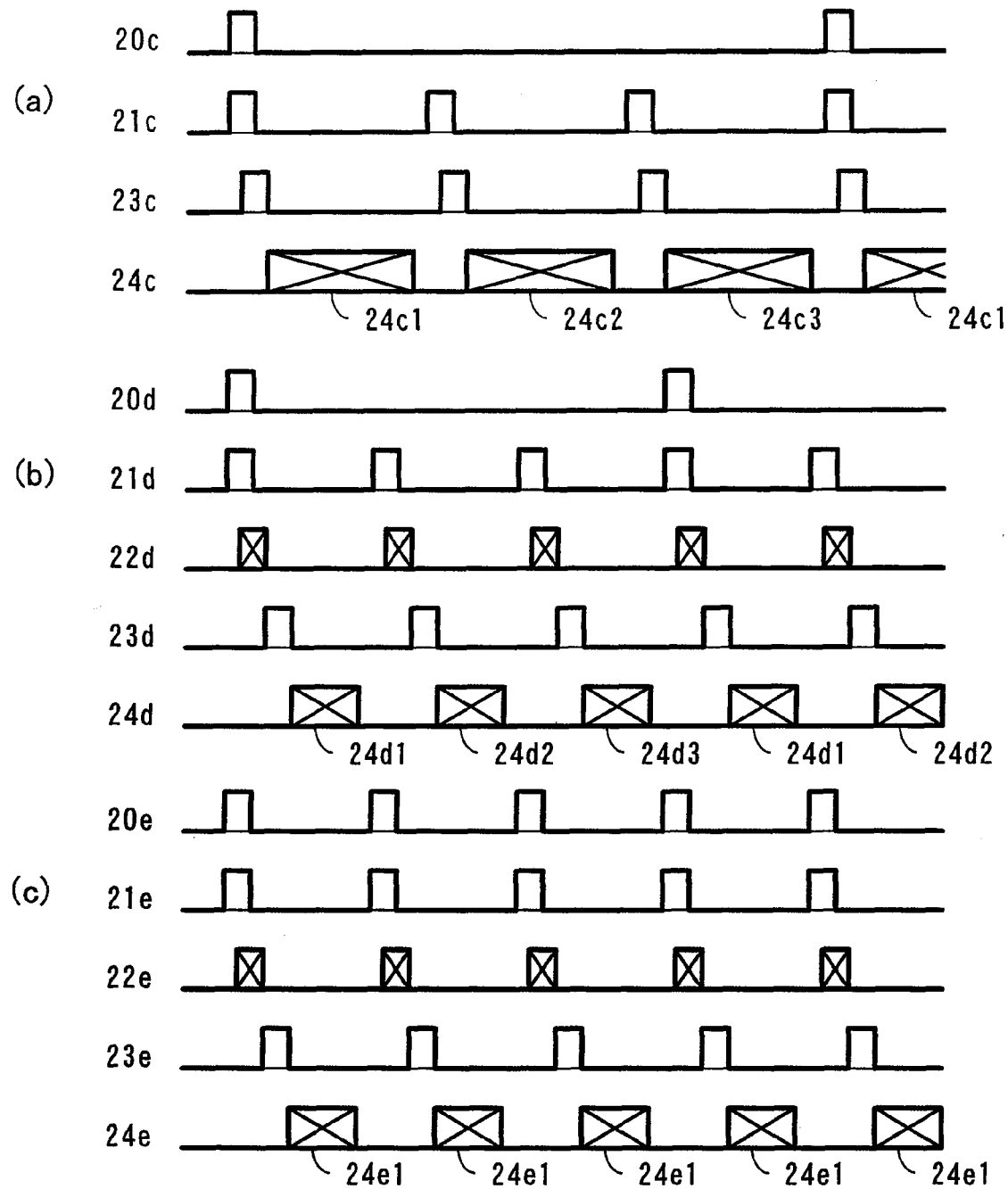
FIG. 20 are timing charts showing the transfer of the image pickup signals of a modification of the image pickup apparatus according to Embodiment 1 of the present invention.

FIG. 20 are timing charts showing the transfer of the image pickup signals of a modification of the image pickup apparatus according to Embodiment 1 of the present invention. When the transfer range flag FO is 1, the transfer range is the image pickup signals generated by all of the image pickup regions. Therefore, as shown in FIG. 8(a), the image pickup signal of H0 pixels in the horizontal direction and V0 pixels in the vertical direction is transferred. To be specific, the image pickup signal I0(x, y) input to the image pickup signal input portion 133 has H0 pixels in the x direction and V0 pixels in the y direction, is input in order of I0(0,0)((x, y)=(0, 0)), I0(1, 0), I0(2, 0), . . . , and I0(H0−1, V0−1), and is sequentially transferred to the preprocessing portion 134. As shown in FIG. 20(a), a signal 20c which is generated once in one frame is generated, and a vertical synchronization signal 21c is generated once in one field. In the case of the interlace CCD of three fields, three vertical synchronization signals 21c are generated per one signal 20c. After a certain period from the rising edge of the vertical synchronization signal 21c, the electric charge is transferred from the photodiode of the CCD sensor to the vertical transfer CCDs at a timing of a high level of the signal 23c and is sequentially transferred in the vertical CCDs and the horizontal CCDs at a high level of the signal 24a, and the analog signal is converted into the digital signal that is the image pickup signal and is input in the image pickup signal input portion 133. Immediately after the generation of the signal 20c, the image pickup signal of the first field is transferred (period shown by 24c1). Next, the image pickup signal of the second field is transferred (period shown by 24c2). Next, the image pickup signal of the third field is transferred (period shown by 24c3).

Meanwhile, when the transfer range flag FO is 2, the transfer range is the image pickup signals generated by the half of the image pickup regions. Therefore, as shown in FIG. 8(b), the image pickup signal of H0 pixels in the horizontal direction and V0/2 pixels in the vertical direction is transferred. To be specific, the image pickup signal I0(x, y) input to the image pickup signal input portion 133 has H0 pixels in the x direction and V0/2 pixels in the y direction, is input in order of I0(0,0)((x, y)=(0, 0)), I0(1, 0), I0(2, 0), . . . , and I0(H0−1, V0/2−1), and is sequentially transferred to the preprocessing portion 134. As shown in FIG. 20(b), a signal 20d which is generated once in one frame is generated, and a vertical synchronization signal 21d is generated once in one field. In the case of the interlace CCD of three fields, three vertical synchronization signals 21d are generated per one signal 20d. After a certain period from the rising edge of the vertical synchronization signal 21d, the electric charge remained in the vertical CCDs is swept out to the horizontal CCDs at a high level of the signal 22d, is transferred from the photodiode of the CCD sensor to the vertical transfer CCDs at a timing of a high level of the signal 23d, and is sequentially transferred in the vertical CCDs and the horizontal CCDs at a high level of the signal 24d, and the analog signal is converted into the digital signal that is the image pickup signal and is input in the image pickup signal input portion 133. Immediately after the generation of the signal 20d, the image pickup signal of the first field is transferred (period shown by 24d1). Next, the image pickup signal of the second field is transferred (period shown by 24d2). Next, the image pickup signal of the third field is transferred (period shown by 24d3). Therefore, the transfer time (period in which the signal 24d is a high level) of the electric charge when the transfer range flag FO is 2 (second operating mode) is substantially half of the transfer time (period in which the signal 24c is a high level) of the electric charge when the transfer range flag FO is 1 (first operating mode). On this account, the time interval for transferring one image is shortened when the transfer range flag FO is 2.

Further, by using only one field image without using all of the field images, the time interval for transferring one image is further shortened. Moreover, the transfer range flag FO may be set to 3. When the transfer range flag FO is 3, the transfer range is the half (transfer region is shown in FIG. 8(b)) of the image pickup regions, and the image of only the first field is transferred. To be specific, the image pickup signal I0(x, y) input from the image pickup signal input portion 133 has H0 pixels in the x direction and V0/6 pixels in the y direction, is input in order of I0(0,0)((x, y)=(0, 0)), I0(1, 0), I0(2, 0), ..., I0(0, 3), I0(1, 3), I0(2, 3), ..., and I0(H0−1, V0/2−3), and is sequentially transferred to the preprocessing portion 134. As shown in FIG. 20(c), the timing of generation of the signal 20e and the timing of generation of the vertical synchronization signal 21e are substantially the same as each other. After a certain period from the rising edge of the vertical synchronization signal 21d, the electric charge remained in the vertical CCDs is swept out to the horizontal CCDs at a high level of the signal 22e, is transferred from the photodiode of the CCD sensor to the vertical transfer CCDs at a timing of a high level of the signal 23e, and is sequentially transferred in the vertical CCDs and the horizontal CCDs at a high level of the signal 24e, and the analog signal is converted into the digital signal that is the image pickup signal and is input in the image pickup signal input portion 133. Note that only the image pickup signal of the first field is always transferred (period shown by 24e1). Therefore, the transfer time (period in which the signal 24e is a high level) of the electric charge when the transfer range flag FO is 3 (the transfer range is the half of the image pickup regions, and only the first field image is transferred) is substantially one sixth of the transfer time (period in which the signal 24c is a high level) of the electric charge when the transfer range flag FO is 1 (first operating mode). On this account, the time interval for transferring one image is shortened when the transfer range flag FO is 3.

Here, by transferring only one field, the number of pixels in the vertical direction decreases, but the number of pixels in the horizontal direction does not decrease. A direction in which the parallax is generated is the horizontal direction, so that the deterioration of the accuracy of the parallax calculation is small. Therefore, in the case of transferring only one field, the increase in speed can be realized while maintaining the accuracy of the parallax calculation.

Here, when the high speed is required in the parallax calculation, the transfer range flag FO is set to 3 (third operating mode), the transfer range is the image pickup signals generated by the half of the image pickup regions, and only the first field is always transferred. Moreover, when some degree of both the high speed and the high accuracy are required, the transfer range flag FO is set to 2 (second operating mode), the transfer range is the image pickup signals generated by the half of the image pickup regions, and the first to third frames are transferred. Moreover, when the high accuracy is required, the transfer range flag FO is set to 1 (first operating mode), the transfer range is the image pickup signals generated by all of the image pickup regions, and the first to third frames are transferred. By the above operations, the high speed and the high accuracy can be suitably changed depending on situations.

Whether or not the high speed and/or the high accuracy of the parallax calculation are required is determined by the SLSI 125 based on the information about the subject. To be specific, for example, the SLSI 125 determines in accordance with the value of the reliability E obtained as above whether or not the high speed and/or the high accuracy are required, and the SLSI 125 selects any one of the first to third operating modes in accordance with the result of the determination.

By adding a case where the transfer range is the image pickup signal generated by all of the image pickup regions, and only the first field is transferred, it is possible to deal with situations further precisely. Moreover, instead of the first field, the second field or the third field may be transferred.

Embodiment 2

In the image pickup apparatus according to Embodiment 1 of the present invention, the color filters (the first color filter 124a and the second color filter 124b) which mainly transmit the near infrared light component are disposed horizontally, the color filters (the third color filter 124c and the fourth color filter 124d) which mainly transmit the green light component are disposed horizontally, the corresponding image pickup components (the first image pickup signal I1 and the second image pickup signal I2; the third image pickup signal I3 and the fourth image pickup signal I4) are compared to each other to calculate the parallax, and the distance is calculated based on the parallax. In contrast, in the image pickup apparatus according to Embodiment 2 of the present invention, the color filters which mainly transmit the near infrared light component are disposed diagonally, the color filters which mainly transmit the green light component are disposed diagonally, the corresponding image pickup components are compared to each other to calculate the parallax, and the distance is calculated based on the parallax.

Hereinafter, the image pickup apparatus according to Embodiment 2 of the present invention will be explained in reference to the drawings.

Figure 21:
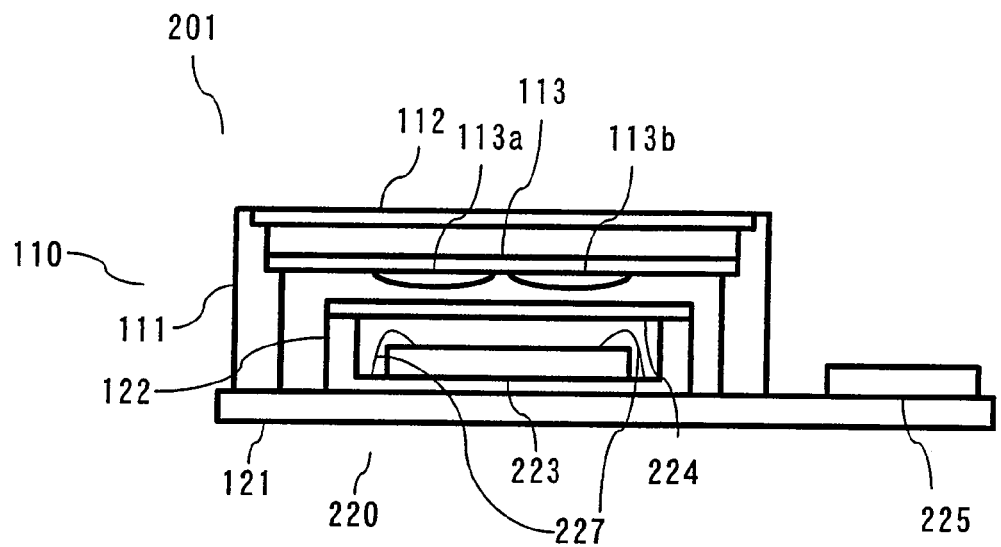
FIG. 21 is a cross-sectional view showing the configuration of the image pickup apparatus according to Embodiment 2 of the present invention.

FIG. 21 is a cross-sectional view showing the configuration of the image pickup apparatus according to Embodiment 2 of the present invention. In FIG. 21, an image pickup apparatus 201 includes the lens module portion 110 and a circuit portion 220.

The lens module portion 110 includes the lens barrel 111, the upper cover glass 112, and the lens 113. The circuit portion 220 includes the substrate 121, the package 122, an image pickup element 223, a package cover glass 224, and a system LSI (hereinafter referred to as SLSI) 225.

The lens barrel 111, the upper cover glass 112, and the lens 113 are the same as those of Embodiment 1, so that explanations thereof are omitted.

The substrate 121 and the package 122 are the same as those of Embodiment 1, so that explanations thereof are omitted.

The image pickup element 223 is a CMOS sensor that is a solid image pickup element. The image pickup element 223 is disposed such that a light receiving surface thereof is substantially perpendicular to the optical axes of the first lens portion 113a, the second lens portion 113b, the third lens portion 113c, and the fourth lens portion 113d. Each terminal of the image pickup element 223 is connected to the metal terminal at a bottom portion inside the package 122 by a gold wire 227 using wire bonding, and is electrically connected to the SLSI 225 via the substrate 121. Light emanating from the first lens portion 113a, the second lens portion 113b, the third lens portion 113c, and the fourth lens portion 113d form images on the light receiving surface of the image pickup element 223, this light information is converted into electric information by a photodiode, and this electric information is transferred to the SLSI 225.

Figure 22:
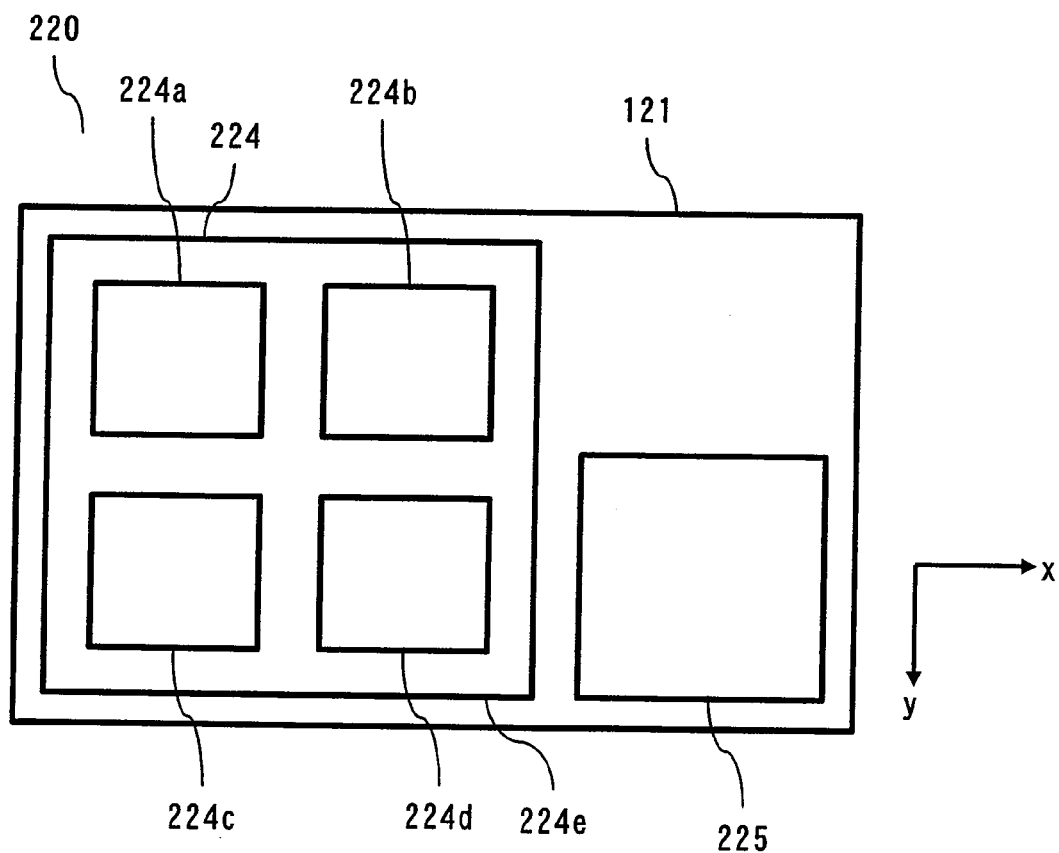
FIG. 22 is a plan view showing the configuration of the circuit portion of the image pickup apparatus according to Embodiment 2 of the present invention.

FIG. 22 is a plan view showing the configuration of the circuit portion of the image pickup apparatus according to Embodiment 2 of the present invention. The package cover glass 224 has a flat plate shape, is formed by transparent resin, and is fixed to an upper surface of the package 122 by adhesive or the like. A first color filter 224a, a second color filter 224b, a third color filter 224c, a fourth color filter 224d, and a light shielding portion 224e are disposed on an upper surface of the package cover glass 224 by vapor deposition or the like. An antireflection coating is disposed on a lower surface of the package cover glass 224 by vapor deposition or the like.

As with Embodiment 1, the image pickup element 223 is constituted by a first image pickup region 223a, a second image pickup region 223b, a third image pickup region 223c, and a fourth image pickup region 223d. The first to fourth image pickup regions 223a to 223d are arranged in two rows and two columns such that light receiving surfaces thereof are substantially perpendicular to the optical axes of the first to fourth lens portions 113a to 113d, respectively. As with Embodiment 1, a plurality of image pickup regions may be included by providing a plurality of image pickup elements each having one image pickup region.

Figure 23:
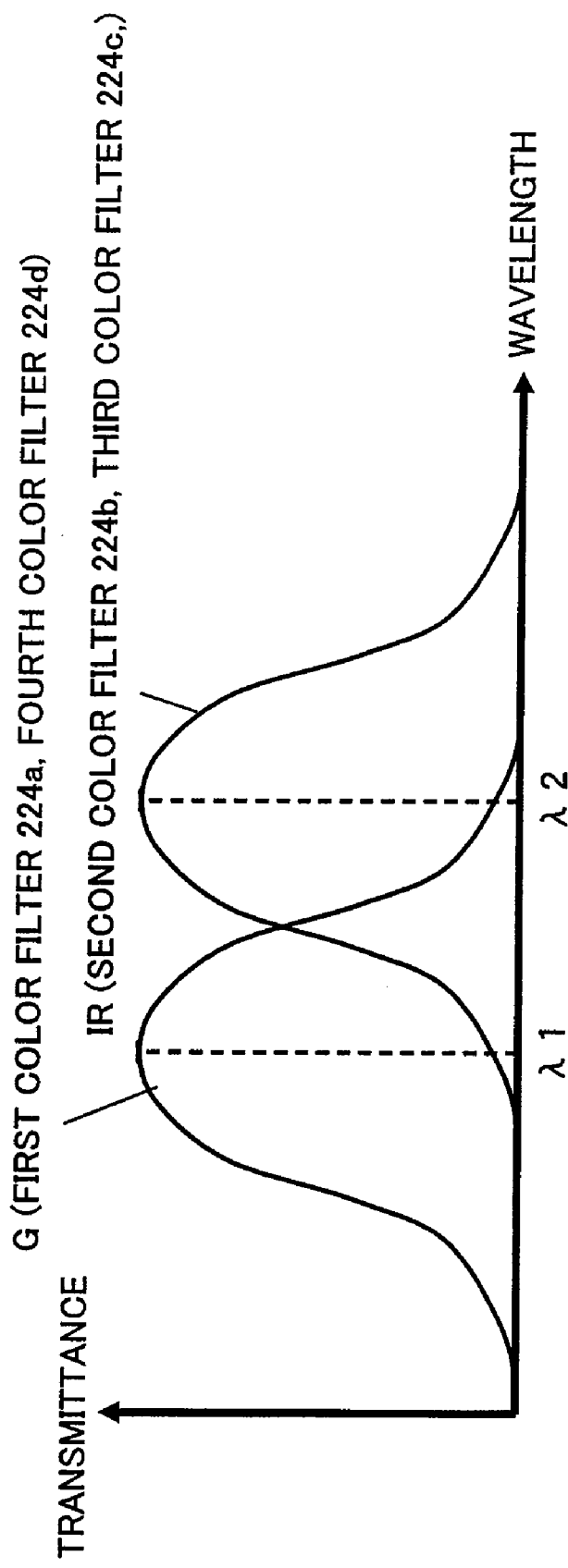
FIG. 23 is a characteristic diagram of the color filters of the camera module according to Embodiment 2 of the present invention.

FIG. 23 is a characteristic diagram of the color filters of the camera module according to Embodiment 2 of the present invention. Each of the second color filter 224b and the third color filter 224c has a spectral transmission characteristic (transmission characteristic centering on the wavelength λ2; for example, λ2 is 870 nm) which is shown by IR in FIG. 23 and mainly transmits the near infrared light. Each of the first color filter 224a and the fourth color filter 224d has a spectral transmission characteristic (transmission characteristic centering on the wavelength λ1; for example, λ1 is 500 nm) which is shown by G in FIG. 23 and mainly transmits the green light.

Therefore, the object light which has been incident on the upper portion of the first lens portion 113a emanates from the lower portion of the first lens portion 113a, and the green light is transmitted mainly by the first color filter 224a and forms an image on the light receiving portion of the first image pickup region 223a. On this account, the first image pickup region 223a receives the green light component of the object light. The object light which has been incident on the upper portion of the second lens portion 113b emanates from the lower portion of the second lens portion 113b, and the near infrared light is transmitted mainly by the second color filter 224b and forms an image on the light receiving portion of the second image pickup region 223b. On this account, the second image pickup region 223b receives the near infrared light component of the object light. The object light which has been incident on the upper portion of the third lens portion 113c emanates from the lower portion of the third lens portion 113c, and the near infrared light is transmitted mainly by the third color filter 224c and forms an image on the light receiving portion of the third image pickup region 223c. On this account, the third image pickup region 223c receives the near infrared light component of the object light. The object light which has been incident on the upper portion of the fourth lens portion 113d emanates from the lower portion of the fourth lens portion 113d, and the green light is transmitted mainly by the fourth color filter 224d and forms an image on the light receiving portion of the fourth image pickup region 223d. On this account, the fourth image pickup region 223d receives the green light component of the object light.

The SLSI 225 drives the image pickup element 223 in the following manner, receives electric information from the image pickup element 223, carries out various calculations, communicates with the host CPU, and outputs the image information, the distance information, and the like to outside. Note that the SLSI 225 is connected to the power supply (3.3 V for example) and the ground (0 V for example).

Figure 24:
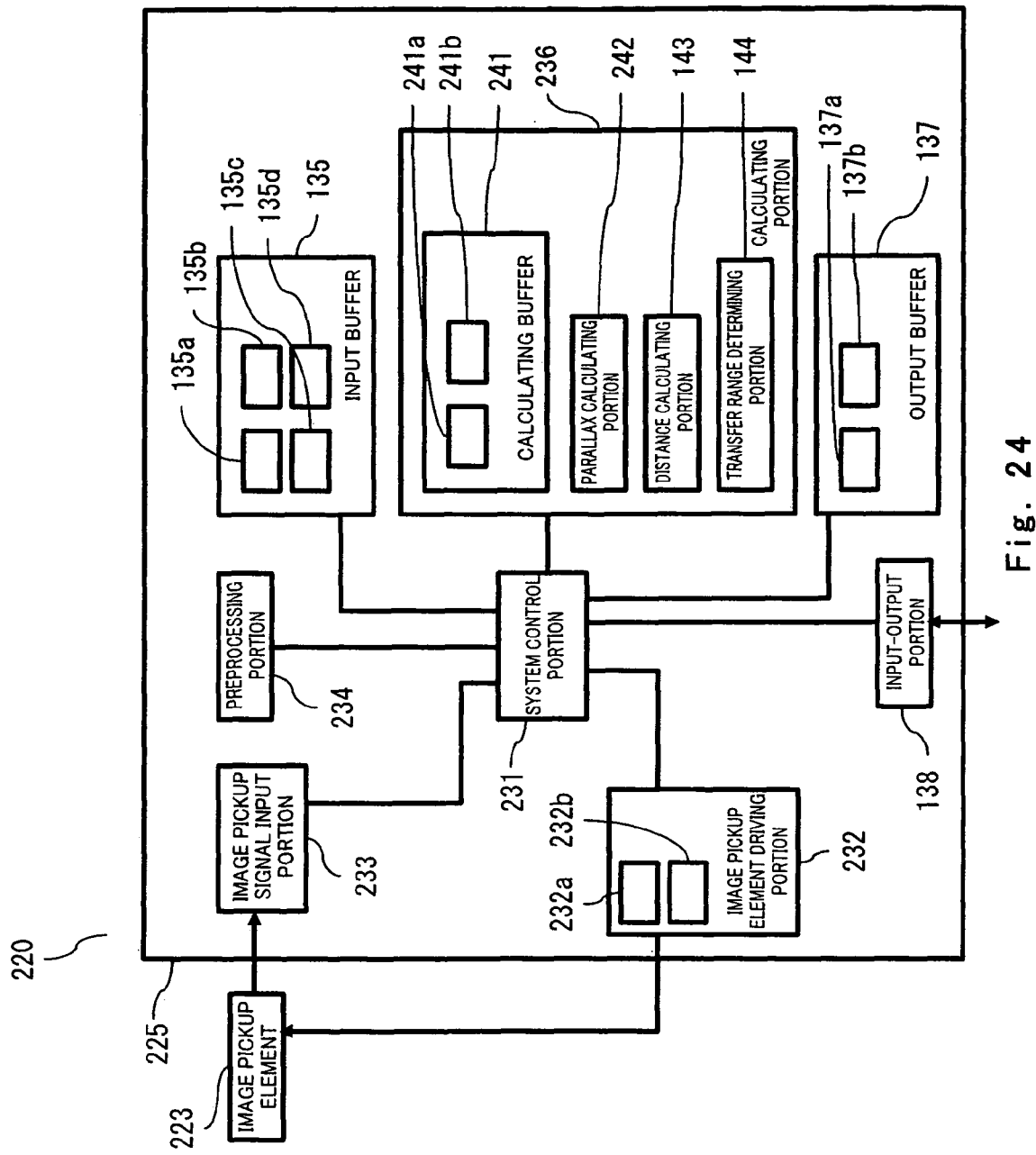
FIG. 24 is a block diagram showing the configuration of the image pickup apparatus according to Embodiment 2 of the present invention.

Next, the operation of the image pickup apparatus according to Embodiment 2 of the present invention will be explained. FIG. 24 is a block diagram showing the configuration of the image pickup apparatus according to Embodiment 2 of the present invention. The SLSI 225 includes a system control portion 231, an image pickup element driving portion 232, an image pickup signal input portion 233, a preprocessing portion 234, the input buffer 135, a calculating portion 236, the output buffer 137, and the input/output portion 138. The image pickup element driving portion 232 includes a first image pickup element driving portion 232a and a second image pickup element driving portion 232b. The input buffer 135 includes the first input buffer 135a, the second input buffer 135b, the third input buffer 135c, and the fourth input buffer 135d. The calculating portion 236 includes a calculating buffer 241, a parallax calculating portion 242, the distance calculating portion 143, and the transfer range determining portion 144. The calculating buffer 241 includes a first calculating buffer 241a and a second calculating buffer 241b. The output buffer 137 includes the first output buffer 137a and the second output buffer 137b.

The system control portion 231 is constituted by a CPU (Central Processing Unit), a logic circuit, and the like, and controls the entire SLSI 225.

The image pickup element driving portion 232 is constituted by a logic circuit and the like, generates a signal for driving the image pickup element 223, and applies to the image pickup element 223 a voltage corresponding to this signal. The image pickup element driving portion 232 is constituted by the first image pickup element driving portion 232a and the second image pickup element driving portion 232b. As described below, the first image pickup element driving portion 232a operates when the transfer range flag FO is 1 (first operating mode), and the second image pickup element driving portion 232b operates when the transfer range flag FO is 2 (second operating mode). Thus, by providing two kinds of circuits (image pickup element driving portions), it is possible to easily change the transfer range (switch the operating mode).

The image pickup signal input portion 233 is constituted by connecting in series a CDS circuit (Correlated Double Sampling Circuit), an AGC (Automatic Gain Controller), and an ADC (Analog Digital Converter), receives an electric signal from the image pickup element 223, removes a fixed noise by the CDS circuit, adjusts a gain by the AGC, and converts by the ADC an analog signals into digital values to generate the first image pickup signal I1, the second image pickup signal I2, the third image pickup signal I3, and the fourth image pickup signal I4 as described below.

The transfer range determining portion 144 determines the transfer range flag FO in the following manner. When the transfer range flag FO is 1, the transfer range is the image pickup signals generated by all of the image pickup regions.

When the transfer range flag FO is 2, the transfer range is the image pickup signals generated by the half of the image pickup regions. Note that the transfer range flag FO is initialized to 1.

Figure 25:
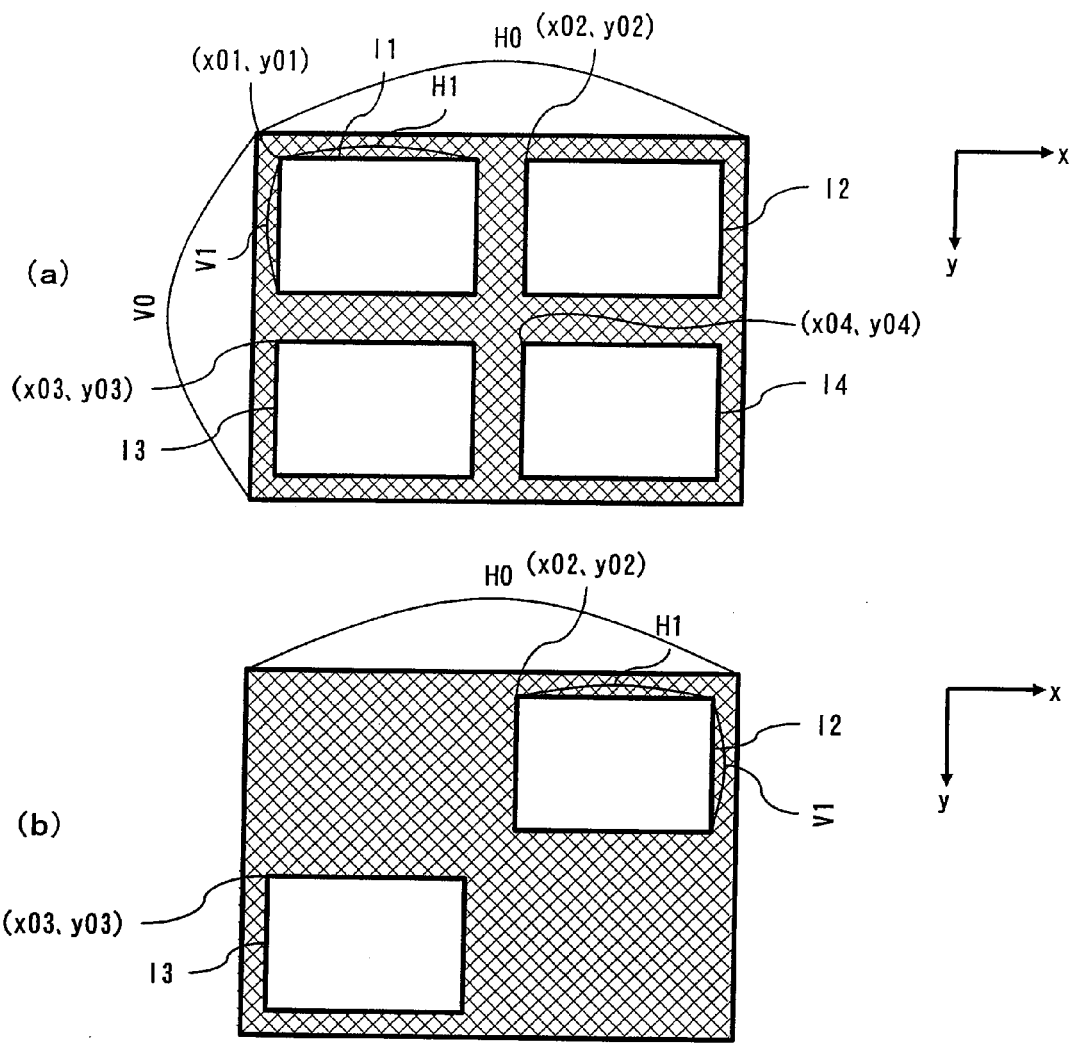
FIG. 25 are diagrams for explaining the cut-out position of the image pickup signal of the image pickup apparatus according to Embodiment 2 of the present invention.
Figure 26:
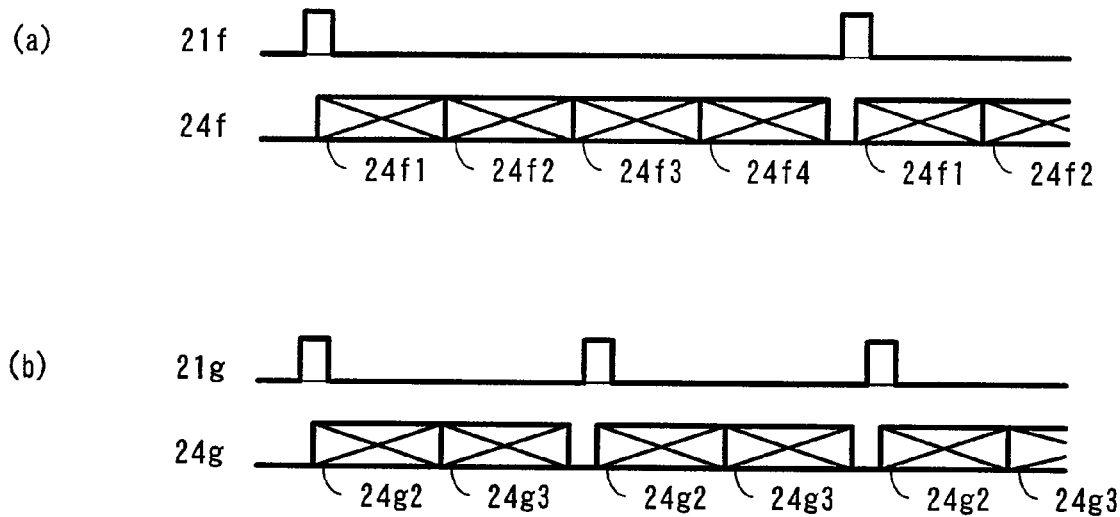
FIG. 26 are timing charts showing the transfer of the image pickup signals of the image pickup apparatus according to Embodiment 2 of the present invention.

FIG. 25 are diagrams for explaining the cut-out position of the image pickup signal of the image pickup apparatus according to Embodiment 2 of the present invention. FIG. 26 are timing charts showing the transfer of the image pickup signals of the image pickup apparatus according to Embodiment 2 of the present invention. When the transfer range flag FO is 1, the transfer range is the image pickup signals generated by all of the image pickup regions. Therefore, as shown in FIG. 25(a), a region (region having the origin point (x01, y01), H1 pixels as horizontal pixels, and V1 pixels as vertical pixels) corresponding to the first image pickup signal I1, a region (region having the origin point (x02, y02), H1 pixels as horizontal pixels, and V1 pixels as vertical pixels) corresponding to the second image pickup signal I2, a region (region having the origin point (x03, y03), H1 pixels as horizontal pixels, and V1 pixels as vertical pixels) corresponding to the third image pickup signal I3, and a region (region having the origin point (x04, y04), H1 pixels as horizontal pixels, and V1 pixels as vertical pixels) corresponding to the fourth image pickup signal I4 are transferred. As shown in FIG. 26(a), after a certain period from the rising edge of a vertical synchronization signal 21f, the image pickup signals are sequentially transferred at a high level of a signal 24f, and the analog signals are converted into the digital signals that are the image pickup signals and are input in the image pickup signal input portion 233. To be specific, the first image pickup signal I1 is input in order of I1(0, 0), I1(1, 0), I1(2, 0), . . . , and I1(H1−1, V1−1) in a period shown by 24f1, the second image pickup signal I2 is input in order of I2(0, 0), I2(1, 0), I2(2, 0), . . . , and I2(H1−1, V1−1) in a period shown by 24f2, the third image pickup signal I3 is input in order of I3(0, 0), I3(1, 0), I3(2, 0), . . . , and I3(H1−1, V1−1) in a period shown by 24f3, the fourth image pickup signal I4 is input in order of I4(0, 0), I4(1, 0), I4(2, 0), . . . , and I4(H1−1, V1−1) in a period shown by 24f4, and the signals are transferred to the preprocessing portion 234.

When the transfer range flag FO is 2, the transfer range is the image pickup signals generated by the half of the image pickup regions. Therefore, as shown in FIG. 25(b), the region (region having the origin point (x02, y02), H1 pixels as horizontal pixels, and V1 pixels as vertical pixels) corresponding to the second image pickup signal I2 and the region (region having the origin point (x03, y03), H1 pixels as horizontal pixels, and V1 pixels as vertical pixels) corresponding to the third image pickup signal I3 are transferred. As shown in FIG. 26(b), after a certain period from the rising edge of the vertical synchronization signal 21g, the image pickup signals are sequentially transferred at a high level of the signal 24g, and the analog signals are converted into the digital signals that are the image pickup signals and are input in the image pickup signal input portion 233. To be specific, the second image pickup signal I2 is input in order of I2(0, 0), I2(1, 0), I2(2, 0), . . . , and I2(H1−1, V1−1) in a period shown by 24g2, the third image pickup signal I3 is input in order of I3(0, 0), I3(1, 0), I3(2, 0), . . . , and I3(H1−1, V1−1) in a period shown by 24g3, and the signals are transferred to the preprocessing portion 234.

The transfer time (period in which the signal 24g is a high level) of the electric charge when the transfer range flag FO is 2 (second operating mode) is substantially half of the transfer time (period in which the signal 24f is a high level) of the electric charge when the transfer range flag FO is 1 (first operating mode). Therefore, the time interval for transferring one image is shortened when the transfer range flag FO is 2.

The preprocessing portion 234 is constituted by a logic circuit and the like, carries out the intensity correction of the image pickup signals, and sequentially transfers the signals to the input buffer 135.

When the FO is 1, the transfer range is the image pickup signals generated by all of the image pickup regions. Therefore, the intensities of the first image pickup signal I1, the second image pickup signal I2, the third image pickup signal I3, and the fourth image pickup signal I4 are corrected, and the signals are sequentially transferred to the input buffer 135. The first image pickup signal I1, the second image pickup signal I2, the third image pickup signal I3, and the fourth image pickup signal are obtained by subject images, respectively, formed by the first lens portion 113a, the second lens portion 113b, the third lens portion 113c, and the fourth lens portion 114d, respectively. As shown by Formula 11 below, the first image pickup signal I1 is corrected by the first intensity correction coefficient ks1. As shown by Formula 12 below, the second image pickup signal I2 is corrected by the second intensity correction coefficient ks2. As shown by Formula 13 below, the third image pickup signal I3 is corrected by the third intensity correction coefficient ks3. As shown by Formula 14 below, the fourth image pickup signal I4 is corrected by the fourth intensity correction coefficient ks4.

$$I1(x, y) = ks1(x, y) * I1(x, y) \quad \text{Formula 11}$$

$$I2(x, y) = ks2(x, y) * I2(x, y) \quad \text{Formula 12}$$

$$I3(x, y) = ks3(x, y) * I3(x, y) \quad \text{Formula 13}$$

$$I4(x, y) = ks4(x, y) * I4(x, y) \quad \text{Formula 14}$$

Note that the first intensity correction coefficient ks1 (x, y), the second intensity correction coefficient ks2(x, y), the third intensity correction coefficient ks3(x, y), and the fourth intensity correction coefficient ks4(x, y) denote intensity correction coefficients of the first image pickup signal I1, the second image pickup signal I2, the third image pickup signal I3, and the fourth image pickup signal I4, respectively, at the coordinates (x, y), are determined by shooting a specific chart in a checking step for example, and are stored in an EEPROM or a flash memory. Note that the apparatus may not have the coefficients of respective pixels but have representative points, and the first intensity correction coefficient ks1(x, y), the second intensity correction coefficient ks2(x, y), the third intensity correction coefficient ks3(x, y), and the fourth intensity correction coefficient ks4(x, y) may be obtained by linear interpolation using the representative points. Moreover, an approximation formula may be formulated, the apparatus may have only coefficients of the approximation formula, and the first intensity correction coefficient ks1(x, y), the second intensity correction coefficient ks2(x, y), the third intensity correction coefficient ks3(x, y), and the fourth intensity correction coefficient ks4(x, y) of respective coordinates may be determined based on the coefficients. Moreover, a coordinate transformation may be suitably carried out to correct, for example, displacement of the optical axis of the lens.

Meanwhile, since the transfer range is the image pickup signals generated by the half of the image pickup regions when the FO is 2, the second image pickup signal I2 and the third image pickup signal I3 are generated and sequentially transferred to the input buffer 135. In this case, processes for the first image pickup signal I1 and the fourth image pickup signal I4 are omitted as compared to a case where the FO is 1 (first operating mode). Since processes for the second image pickup signal I2 and the third image pickup signal I3 are the same as the above processes, explanations thereof are omitted.

When the FO is 1, the first input buffer 135a constituted by a DRAM (Dynamic Random Access Memory) and the like sequentially loads the first image pickup signal I1, and stores data of H1*V1 pixels (H1 pixels in the x direction and V1 pixels in the y direction). The second input buffer 135b constituted by a DRAM and the like sequentially loads the second image pickup signal I2, and stores data of H1*V1 pixels (H1 pixels in the x direction and V1 pixels in the y direction). The third input buffer 135c constituted by a DRAM and the like sequentially loads the third image pickup signal I3, and stores data of H1*V1 pixels (H1 pixels in the x direction and V1 pixels in the y direction). The fourth input buffer 135d constituted by a DRAM and the like sequentially loads the fourth image pickup signal I4, and stores data of H1*V1 pixels (H1 pixels in the x direction and V1 pixels in the y direction).

Meanwhile, when the FO is 2, the second image pickup signal I2 and the third image pickup signal I3 are generated and sequentially input to the input buffer 135. In this case, processes for the first input buffer 135a and the fourth input buffer 135d are omitted as compared to a case where the FO is 1 (a case where all of the image pickup regions are transferred). Since processes for the second input buffer 135b and the third input buffer 135c are the same as the above processes, explanations thereof are omitted.

The calculating portion 236 is constituted by: the first calculating buffer 241a and the second calculating buffer 241b, each of which is constituted by a SRAM; the parallax calculating portion 242 constituted by a logic circuit, a CPU, and the like; the distance calculating portion 143 constituted by a logic circuit, a CPU, and the like; and the transfer range determining portion 144 constituted by a logic circuit, a CPU, and the like. The calculating portion 236 loads the first image pickup signal I1, the second image pickup signal I2, the third image pickup signal I3, and the fourth image pickup signal I4 by the block, and stores the signals in the first calculating buffer 241a and the second calculating buffer 241b. Then, the parallax calculating portion 242 calculates the parallax based on, for example, data of the first calculating buffer 241a and the second calculating buffer 241b, and the distance calculating portion 143 calculates the distance based on the obtained parallax, and transfers the obtained distance data to the output buffer 137.

The output buffer 137 and the input/output portion 138 are the same as those of Embodiment 1, so that explanations thereof are omitted.

Figure 27:
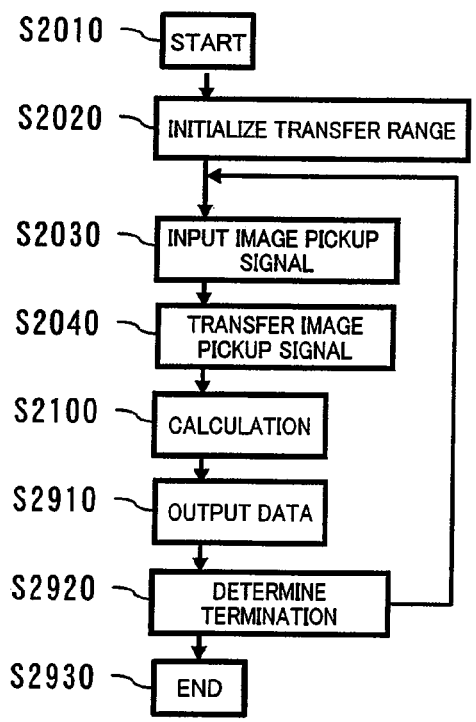
FIG. 27 is a flow chart showing the operation of the image pickup apparatus according to Embodiment 2 of the present invention.

FIG. 27 is a flow chart showing the operation of the image pickup apparatus according to Embodiment 2 of the present invention. The image pickup apparatus 201 is operated by the system control portion 231 of the SLSI 225 in accordance with this flow chart.

In Step S2010, the operation starts. For example, the host CPU (not shown) commands the image pickup apparatus 201 via the input/output portion 138 to start operating. Thus, the image pickup apparatus 201 starts operating. Next, Step S2020 is executed.

In Step S2020, the initialization of the transfer range is carried out. In the present embodiment, the transfer range flag FO is set to 1 (first operating mode) by this initialization. Next, Step S2030 is executed.

In Step S2030, the image pickup signal is input. In accordance with the command of the system control portion 231, the image pickup element driving portion 232 outputs as needed a signal for carrying out the transfer. When the transfer range flag FO is 1 (first operating mode), the first image pickup signal driving portion 232a operates. In this case, the image pickup signal input portion 233 inputs the first image pickup signal I1(x, y) of H1 pixels in the x direction and V1 pixels in the y direction, to be specific, inputs the first image pickup signal I1(x, y) in order of I1(0, 0)((x, y)=(0, 0)), I1(1, 0), I1(2, 0), . . . , and I1(H1−1, V1−1), and sequentially transfers the signal to the preprocessing portion 234. Next, the image pickup signal input portion 233 inputs the second image pickup signal I2(x, y) of H1 pixels in the x direction and V1 pixels in the y direction, to be specific, inputs the second image pickup signal I2(x, y) in order of I2(0, 0)((x, y)=(0, 0)), I2(1, 0), I2(2, 0), . . . , and I2(H1−1, V1−1), and sequentially transfers the signal to the preprocessing portion 234. Next, the image pickup signal input portion 233 inputs the third image pickup signal I3(x, y) of H1 pixels in the x direction and V1 pixels in the y direction, to be specific, inputs the third image pickup signal I3(x, y) in order of I3(0, 0)((x, y)=(0, 0)), I3(1, 0), I3(2, 0), . . . , and I3(H1−1, V1−1), and sequentially transfers the signal to the preprocessing portion 234. Next, the image pickup signal input portion 233 inputs the fourth image pickup signal I4(x, y) of H1 pixels in the x direction and V1 pixels in the y direction, to be specific, inputs the fourth image pickup signal I4(x, y) in order of I4(0, 0)((x, y)=(0, 0)), I4(1, 0), I4(2, 0), . . . , and I4(H1−1, V1−1), and sequentially transfers the signal to the preprocessing portion 234. The preprocessing portion 234 carries out the intensity correction, generates the first image pickup signal I1, the second image pickup signal I2, the third image pickup signal I3, and the fourth image pickup signal I4, and sequentially transfers the first image pickup signal I1, the second image pickup signal I2, the third image pickup signal I3 and the fourth image pickup signal I4 to the first input buffer 135a, the second input buffer 135b, the third input buffer 135c, and the fourth input buffer 135d, respectively.

Meanwhile, when the transfer range flag FO is 2 (second operating mode), the second image pickup signal driving portion 232b operates, and the image pickup signal input portion 233 inputs the second image pickup signal I2(x, y) of H1 pixels in the x direction and V1 pixels in the y direction, to be specific, inputs the second image pickup signal I2(x, y) in order of I2(0, 0)((x, y)=(0, 0)), I2(1, 0), I2(2, 0), . . . , and I2(H1−1, V1−1), and sequentially transfers the signal to the preprocessing portion 234. Next, the image pickup signal input portion 233 inputs the third image pickup signal I3(x, y) of H1 pixels in the x direction and V1 pixels in the y direction, to be specific, inputs the third image pickup signal I3(x, y) in order of I3(0, 0)((x, y)=(0, 0)), I3(1, 0), I3(2, 0), . . . , and I3(H1−1, V1−1), and sequentially transfers the signal to the preprocessing portion 234. The preprocessing portion 234 carries out the intensity correction, generates the second image pickup signal I2 and the third image pickup signal I3, and sequentially transfers the second image pickup signal I2 and the third image pickup signal I3 to the second input buffer 135b and the third input buffer 135c, respectively.

In Step S2040, the second image pickup signal I2 stored in the second input buffer 135a is transferred to the first output buffer 137a, and the first output buffer 137a stores the second image pickup signal I2 as image data. Next, Step S2100 is executed.

In Step S2100, the distance data is generated and sequentially transferred to the second output buffer 137b. Moreover, the transfer range is determined, and the transfer range flag FO is set. Details of this operation will be described later. Next, Step S2910 is executed.

In Step S2910, data is output to outside. The input/output portion 138 outputs the image data of the first output buffer 137a and the distance data of the second output buffer 137b to the host CPU (not shown) and the external display apparatus (not shown). Next, S2920 is executed.

In Step S2920, whether or not the operation is terminated is determined. For example, the system control portion 231 communicates with the host CPU (not shown) via the input/output portion 138 to request a command indicating whether or not to terminate the operation. When the host CPU commands the termination, the operation is terminated, and next, Step S2930 is executed. On the other hand, when the host CPU does not command the termination, the operation continues, and next, Step S2030 is executed. That is, as long as the host CPU does not command the termination, the loop of Steps S2030, S2040, S2100, and S2910 is continuously executed.

In Step S2930, the operation is terminated.

Figure 28:
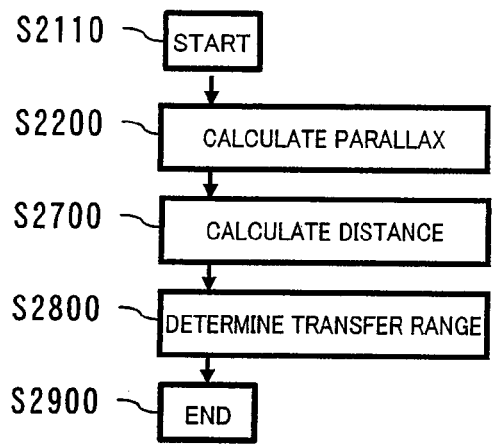
FIG. 28 is a flow chart showing the operation of the calculating portion of the image pickup apparatus according to Embodiment 2 of the present invention.

Next, details of the operation of Step S2100 will be explained. FIG. 28 is a flow chart showing the operation of the calculating portion of the image pickup apparatus according to Embodiment 2 of the present invention. The flow chart of FIG. 28 shows the details of the operation of Step S2100. In the calculation of Step S2100, first, Step S2110 is executed.

In Step S2110, the calculating operation is started. Next, Step S2200 is executed.

Figure 29:
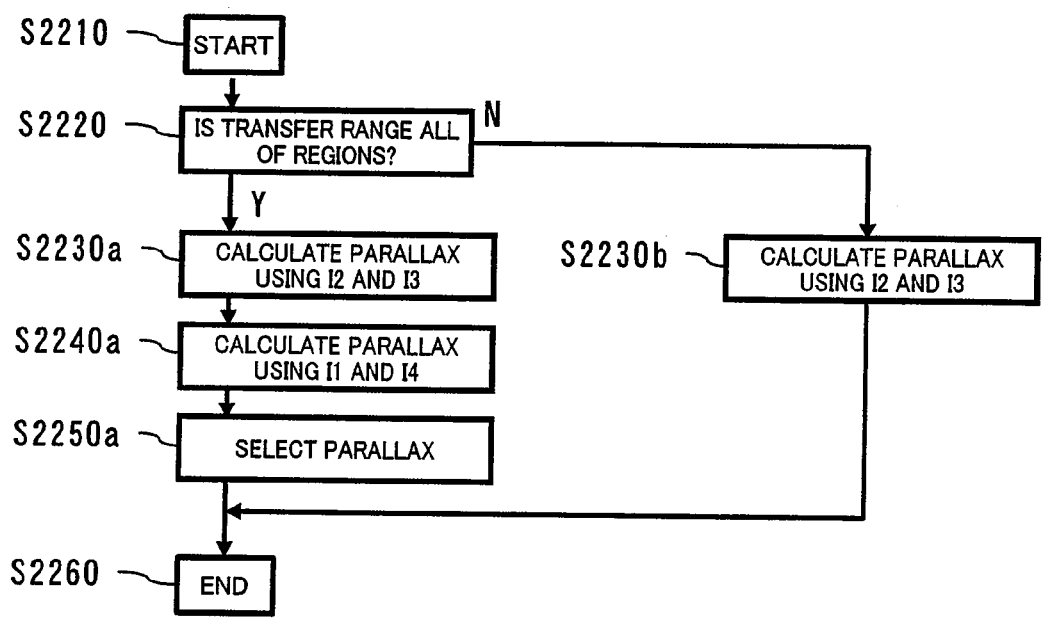
FIG. 29 is a flow chart showing the operation of the parallax calculation of the image pickup apparatus according to Embodiment 2 of the present invention.

In Step S2200, the parallax calculation is executed. FIG. 29 is a flow chart showing the operation of the parallax calculation of the image pickup apparatus according to Embodiment 2 of the present invention. The flow chart of FIG. 29 shows details of the operation of Step S2200. In the calculation of Step S2200, first, Step S2210 is executed.

In Step S2210, the parallax calculation is started. Next, Step S2220 is executed.

In Step S2220, the process branches off by the transfer range flag FO. When the transfer range flag FO is 1 (Y in S2220), the transfer range becomes the image pickup signals generated by all of the image pickup regions, and next, Step S2230a is executed. Meanwhile, when the transfer range flag FO is 2 (N in S2220), the transfer range becomes the image pickup signals generated by the half of the image pickup regions, and next, Step 2230b is executed.

Figure 30:
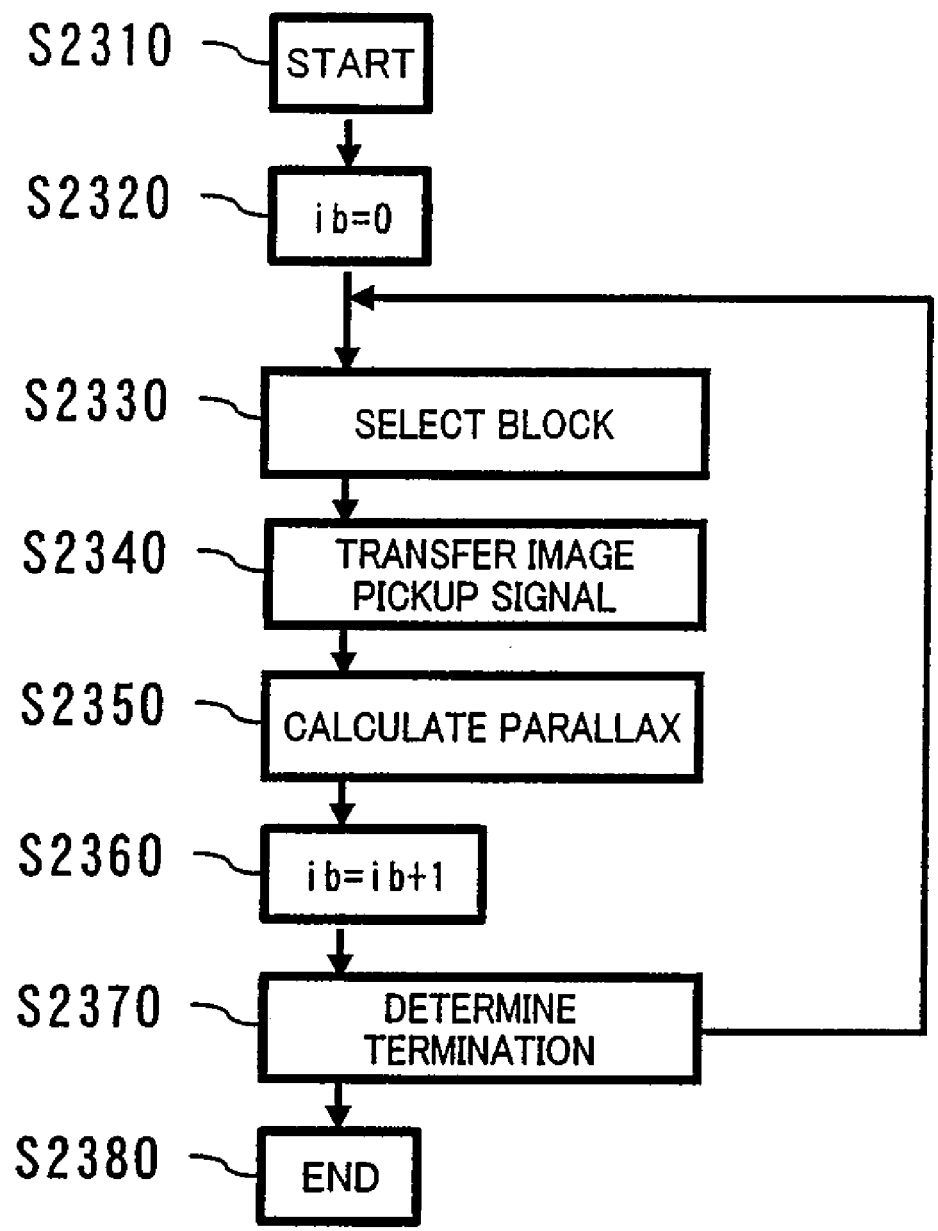
FIG. 30 is a flow chart showing the operation of the parallax calculation utilizing the second image pickup signal and a third image pickup signal in the image pickup apparatus according to Embodiment 2 of the present invention.

In Step S2230a, the parallax calculation utilizing the second image pickup signal and the third image pickup signal is executed. FIG. 30 is a flow chart showing the operation of the parallax calculation utilizing the second image pickup signal and the third image pickup signal in the image pickup apparatus according to Embodiment 2 of the present invention. The flow chart of FIG. 30 shows details of the operation of Step S2230a. In the calculation of Step S2230a, first, Step S2310 is executed.

In Step S2310, the parallax calculation utilizing the second image pickup signal and the third image pickup signal is started. Next, Step S2320 is executed.

In Step S2320, the block index ib is initialized to 0. Next, Step S2330 is executed.

Figure 31:
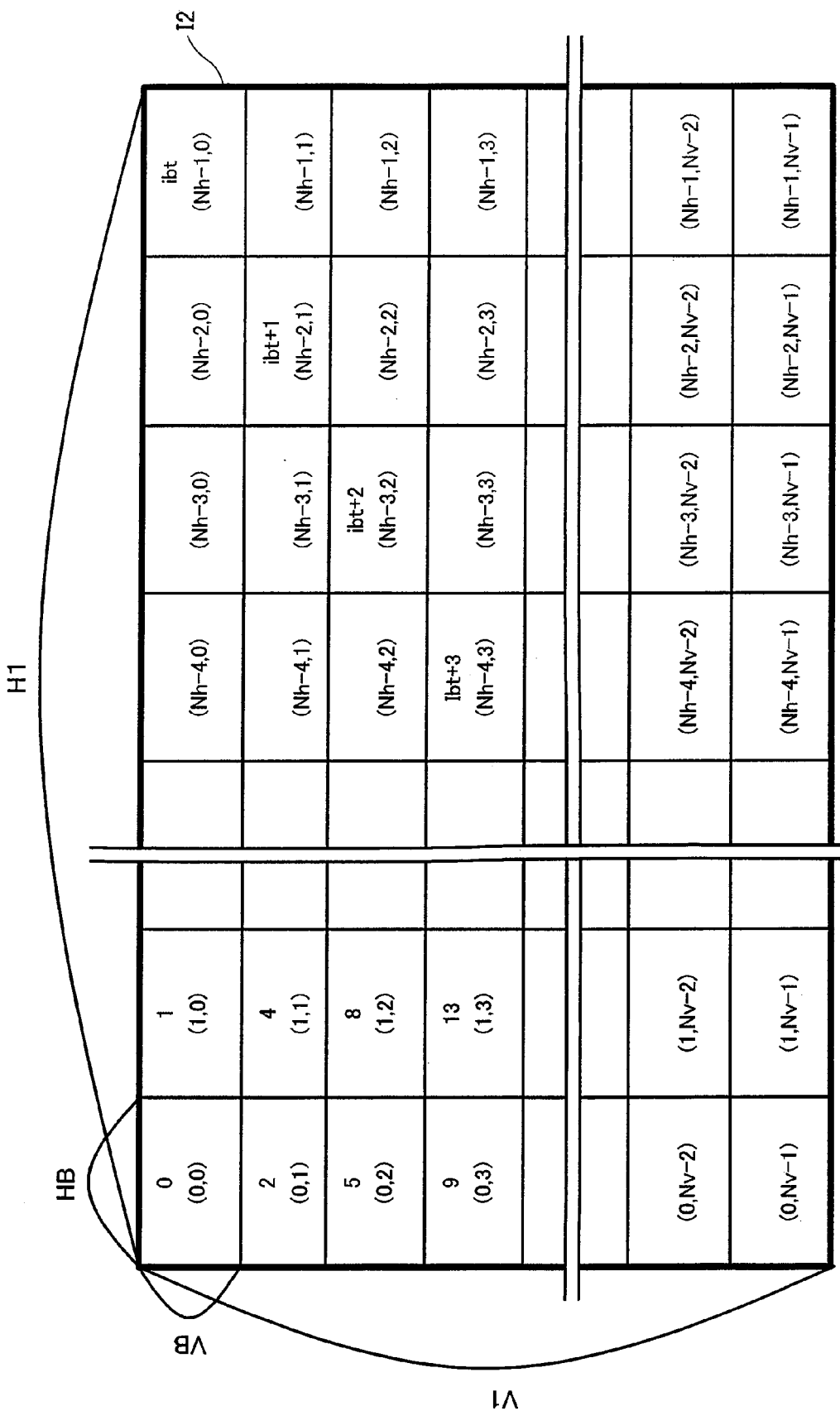
FIG. 31 is a diagram for explaining the divided blocks and calculation order of the second image pickup signal in the parallax calculation utilizing the second image pickup signal and the third image pickup signal in the image pickup apparatus according to Embodiment 2 of the present invention.
Figure 32:
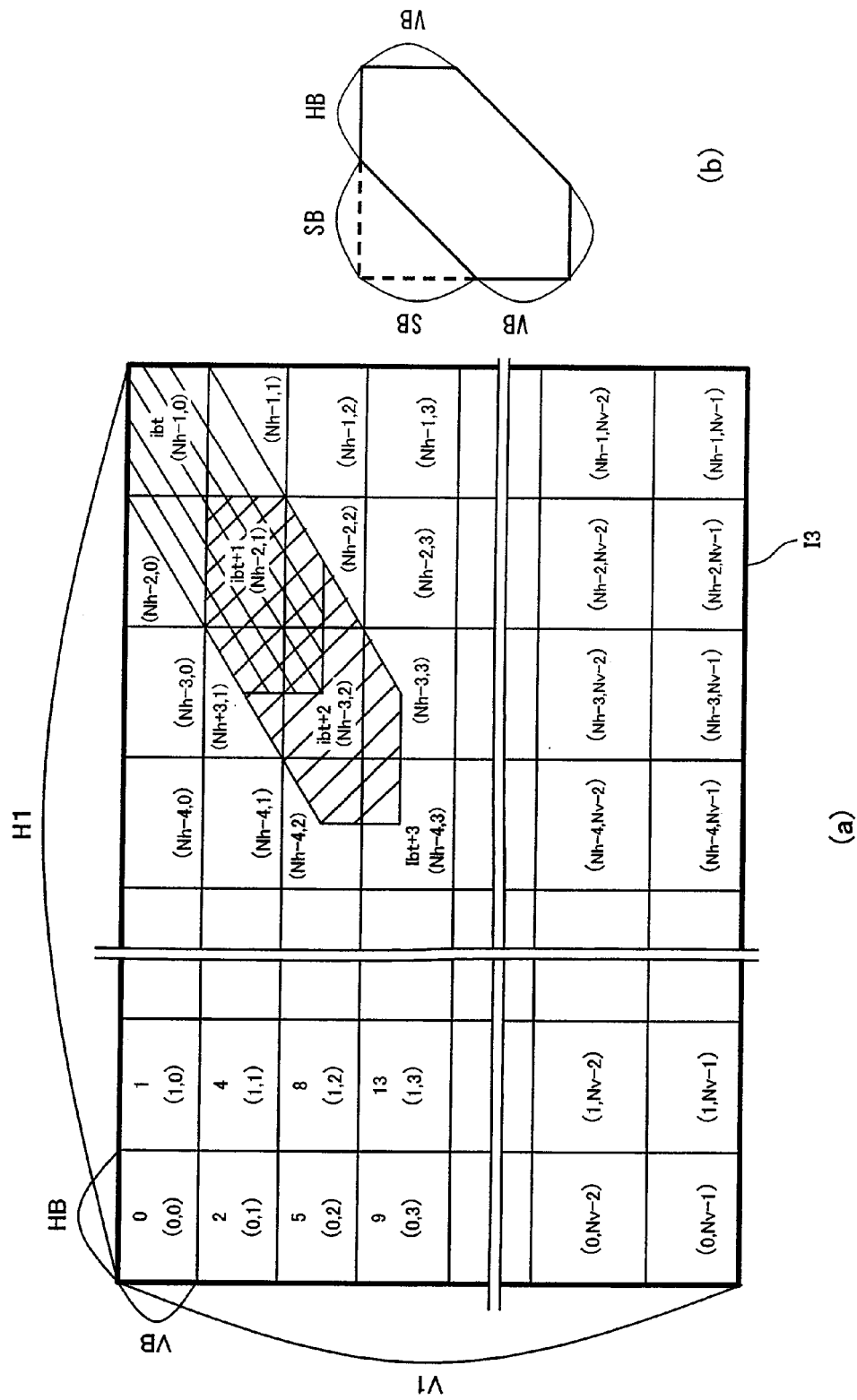
FIG. 32 are diagrams for explaining the divided blocks and calculation order of the third image pickup signal in the parallax calculation utilizing the second image pickup signal and the third image pickup signal in the image pickup apparatus according to Embodiment 2 of the present invention.

In Step S2330, the block is selected. FIG. 31 is a diagram for explaining the divided blocks and calculation order of the second image pickup signal in the parallax calculation utilizing the second image pickup signal and the third image pickup signal in the image pickup apparatus according to Embodiment 2 of the present invention. FIG. 32 is a diagram for explaining the divided blocks and calculation order of the third image pickup signal in the parallax calculation utilizing the second image pickup signal and the third image pickup signal in the image pickup apparatus according to Embodiment 2 of the present invention. In FIG. 31, the second image pickup signal I2 is divided into rectangular blocks each having HB pixels in the x direction and VB pixels in the y direction. Adjacent rectangular blocks are arranged so as to be displaced from each other by HB pixels in the x direction or VB pixels in the y direction. The second image pickup signal I2 has Nh blocks in the x direction and Nv blocks in the y direction. Therefore, the blocks do not overlap each other in the x direction or the y direction. In FIG. 32, the third image pickup signal I3 is divided into blocks each having (HB+SB)*(VB+SB)−SB*SB pixels as shown in FIG. 32(b). Adjacent blocks are arranged so as to be displaced from each other by HB pixels in the x direction and/or VB pixels in the y direction. The third image pickup signal I3 has Nh blocks in the x direction and Nv blocks in the y direction. Moreover, in FIG. 32, regarding the block (upper left, lower right, and lower left blocks for example) which cannot have the shape of the block shown in FIG. 32(b), a part of the block is suitably omitted (for example, the upper left block is a rectangular block of HB*VB pixels). Hereinafter, Embodiment 2 will explain an example in which HB is 32 and VB is 32. In FIGS. 31 and 32, a number shown on the upper level of each block denotes the block index ib. Moreover, in FIGS. 31 and 32, the coordinates (ibx, iby) shown on the lower level of each block denote that the block is an ibx-th block in the x direction and an iby-th block in the y direction. Here, ibx is from 0 to Nh−1, and iby is from 0 to Vh−1. In Step S2330, the block shown by the block index ib (block shown by the coordinates (ibx, iby)) in FIGS. 31 and 32 is selected. Next, Step S2340 is executed.

In Step S2340, the image pickup signal is transferred. Herein, the second image pickup signal I2 of the block selected in Step S2330 is transferred to the first calculating buffer 241a. A value at the coordinates (x, y) in the calculating buffer is set as Bc1(x, y). Here, since HB is 32 and VB is 32, x is from 0 to 31 and y is from 0 to 31. In Step S2340, further, the third image pickup signal I3 of the selected block is transferred to the second calculating buffer 241b. A value at the coordinates (x, y) in the calculating buffer is set as Bc2(x, y). Here, since HB is 32 and VB is 32, x is from 31−SB to 31, and y is from 0 to 31+SB. For example, when ib is ibt, the image pickup signal I1 of 1,024 pixels surrounded by the coordinates (H1−1, 0) and the coordinates (H1−32, 31) is transferred to the first calculating buffer 241a, and the image pickup signal I3 of (1,024+2*32*SB) pixels which are marked with diagonal lines extending in the diagonally upper right direction in FIG. 32 and surrounded by the coordinates (H1−10, 0) and the coordinates (H1−32−SB, 31+SB) is transferred to the second calculating buffer 241b. Next, when ib is ibt+1, the image pickup signal I1 of 1,024 pixels surrounded by the coordinates (H1−33, 32) and the coordinates (H1−64, 63) is transferred to the first calculating buffer 241a. Moreover, the second calculating buffer 241b requires the image pickup signal I3 of (1,024+2*32*SB) pixels which are marked with diagonal lines extending in the diagonally upper right direction in FIG. 32 and surrounded by the coordinates (H1−33, 32) and the coordinates (H1−64−SB, 63+SB). However, since a portion (region of 2*32*SB pixels surrounded by the coordinates (H1−33, 32) and the coordinates (H1−32−SB, 31+SB)) which overlaps the block whose ib is ibt has already been transferred to the second calculating buffer 241b, only 2,048 pixels surrounded by the coordinates (H1−33−SB, 31+SB) and the coordinates (H1−64−SB, 63+SB) are newly transferred to the second calculating buffer 241b. Thus, the transfer time can be reduced. Next, Step S2350 is executed.

Figure 33:
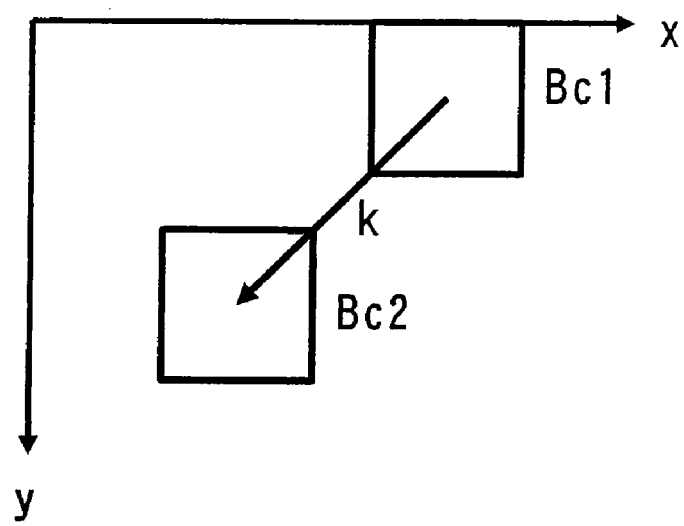
FIG. 33 is a diagram for explaining the calculation region of the parallax evaluated value in the parallax calculation utilizing the second image pickup signal and the third image pickup signal in the image pickup apparatus according to Embodiment 2 of the present invention.

In Step S2350, the parallax calculation is executed. First, the parallax evaluated value R(k) is calculated. Here, k denotes the displacement amount showing how much amount an image is displaced, and k is changed to be 0, 1, 2, . . . , and SB. FIG. 33 is a diagram for explaining the calculation region of the parallax evaluated value in the parallax calculation utilizing the second image pickup signal and the third image pickup signal in the image pickup apparatus according to Embodiment 2 of the present invention. As shown in FIG. 33, a region in which the data Bc1 is stored is a region in the first calculating buffer 241a. The region in which the data Bc2 is stored is a region which is in the second calculating buffer 241b and is away from the block indicated by Bc1 in FIG. 33 in a negative x direction by the displacement amount k and in a positive y direction by the displacement amount k. Then, the SAD (Sum of Absolute Differences) shown by Formula 15 below is calculated in a case where the displacement amount k is from 0 to SB, thereby obtaining the parallax evaluated value R(k).

$$R(k) = \Sigma\Sigma |Bc1(x, y) - Bc2(x-k, y+k)| \quad \text{Formula 15}$$

This parallax evaluated value R(k) shows how much the data Bc1 of the first calculating buffer 241a and the data Bc2 of the second calculating buffer 241b in the region away from the data Bc1 in the negative x direction by k and in the positive y direction by k are correlated to each other. The smaller the parallax evaluated value R(k) is, the stronger the correlation therebetween is (that is, in a case where the parallax evaluated value R(k) is small, the data Bc1 and the data Bc2 are similar to each other). Here, since the data Bc1 of the first calculating buffer 241a is the transferred second image pickup signal I2, and the data Bc2 of the second calculating buffer 241b is the transferred third image pickup signal I3, this parallax evaluated value R(k) shows how much the second image pickup signal I2 and the corresponding third image pickup signal I3 are correlated to each other.

As shown in FIG. 17, the parallax evaluated value R(k) changes depending on the value of the displacement amount k, and is a minimal value when the displacement amount k is Δ. This shows that the data Bc1 of the first calculating buffer 241a is most strongly correlated to (is most similar to) the data Bc2 of the second calculating buffer 241b which is located in the region away from the data Bc1 of the first calculating buffer 241a in the negative x direction by k and in the positive y direction by k. Therefore, it is found that the parallax between the data Bc1 of the first calculating buffer 241a and the data Bc2 of the second calculating buffer 241b is Δ. Here, this Δ is called the parallax value Δ in this block.

Figure 34:
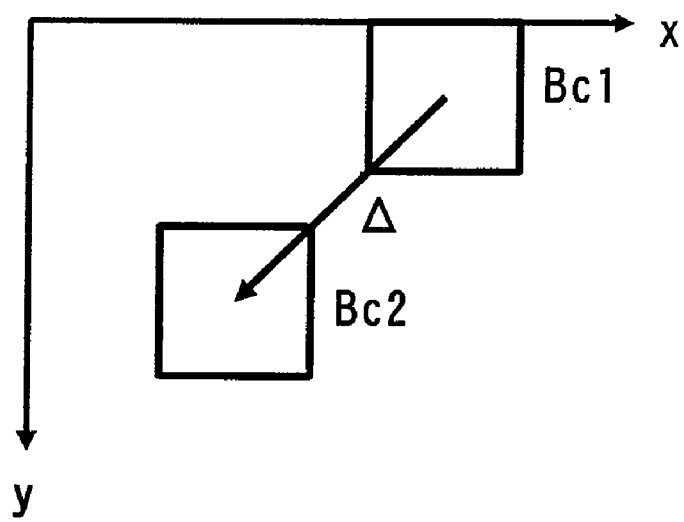
FIG. 34 is a diagram for explaining the calculation region of the reliability of the parallax evaluated value in the parallax calculation utilizing the second image pickup signal and the third image pickup signal in the image pickup apparatus according to Embodiment 2 of the present invention.

Next, the reliability of the parallax value A is calculated. FIG. 34 is a diagram for explaining the calculation region of the reliability of the parallax evaluated value in the parallax calculation utilizing the second image pickup signal and the third image pickup signal in the image pickup apparatus according to Embodiment 2 of the present invention. The region in which the data Bc1 is stored is a region in the first calculating buffer 241a. The region in which the data Bc2 is stored is a region which is in the second calculating buffer 241b and is away from the data Bc1 in the negative x direction by Δ and in the positive y direction by Δ. Then, as shown by Formula 16 below, the normalized correlation coefficient regarding the data Bc1(x, y) and the data Bc2(x−Δ, y+Δ) in respective regions is regarded as the reliability E.

$$E(2, 3)(ibx, iby) = \sum\sum [\{Bc1(x, y) - avg(Bc1(x, y))\} * \quad \text{Formula 16}$$
$$\{Bc2(x-\Delta, y+\Delta) - avg(Bc2(x-\Delta, y+\Delta))\}] /$$
$$\sqrt{\sum\sum [\{Bc1(x, y) - avg(Bc1(x, y))\} *}$$
$$\{Bc1(x, y) - avg(Bc1(x, y))\}] /$$
$$\sqrt{\sum\sum [\{Bc2(x-\Delta, y+\Delta) - avg(Bc2(x-}$$

-continued
$$\Delta, y+\Delta))\} * \{Bc2(x-\Delta, y+$$
$$\Delta) - avg(Bc2(x-\Delta, y+\Delta))\}]$$

Then, in the parallax calculation utilizing the second image pickup signal and the third image pickup signal, the reliability E of the parallax value Δ is stored as the parallax value Δ(2,3)(ibx, iby) in the block shown by the coordinates (ibx, iby) and having 32*32 pixels, and its reliability E(2,3)(ibx, iby). Here, (2,3) denotes that each of the parallax value and the reliability utilizes the second image pickup signal and the third image pickup signal, and (ibx, iby) denotes the block shown by the block index ib, and the coordinates shown on the lower level of each block in FIG. 31. Next, Step S2360 is executed.

In Step S2360, 1 is added to the block index ib. Next, Step S2370 is executed.

In Step S2370, whether or not the parallax calculation utilizing the second image pickup signal and the third image pickup signal is terminated is determined. When the block index ib is less than Nh*Nv, next, Step S2330 is executed to calculate the parallax of the next block. Meanwhile, when the block index ib is Nh*Nv or more, it is determined that the parallaxes of all the blocks are calculated, and next, Step S2380 is executed.

In Step S2380, the parallax calculation utilizing the second image pickup signal and the third image pickup signal is terminated, and the process returns to the upper routine. Thus, the parallax value Δ(2,3)(ibx, iby) and its reliability E(2,3)(ibx, iby) of the block shown by the block index ib and having 32*32 pixels are obtained by resolution of 32*32 pixels in the parallax calculation utilizing the second image pickup signal and the third image pickup signal. Here, (2,3) denotes that the second image pickup signal and the third image pickup signal are utilized, and (ibx, iby) denotes the coordinates shown on the lower level of each block in FIG. 31 (ibx changes from 0 to Nh−1, and iby changes from 0 to Nv−1). Next, Step S2240a of FIG. 29 is executed.

Figure 35:
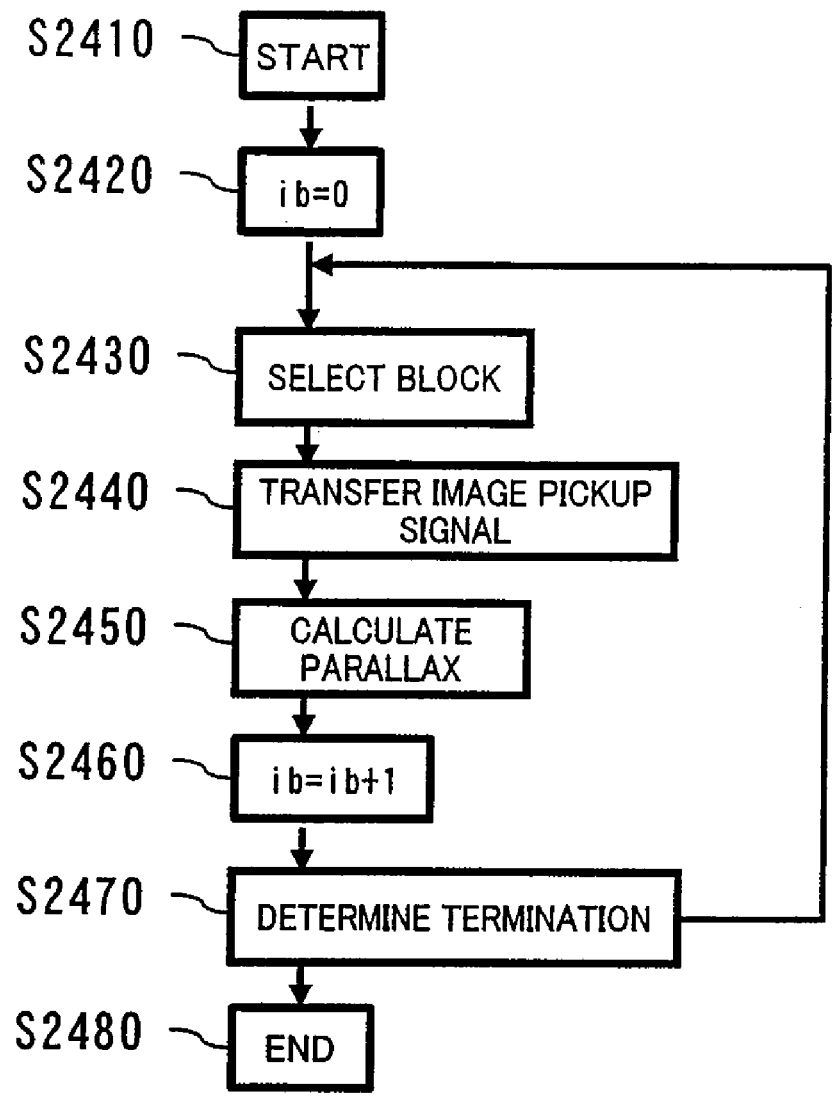
FIG. 35 is a flow chart showing the operation of the parallax calculation utilizing the first image pickup signal and a fourth image pickup signal in the image pickup apparatus according to Embodiment 2 of the present invention.

In Step S2240a, the parallax calculation utilizing the first image pickup signal and the fourth image pickup signal is executed. FIG. 35 is a flow chart showing the operation of the parallax calculation utilizing the first image pickup signal and the fourth image pickup signal in the image pickup apparatus according to Embodiment 2 of the present invention. The flow chart of FIG. 35 shows details of the operation of Step S2240a. In the calculation of Step S2240a, first, Step S2410 is executed.

In Step S2410, the parallax calculation utilizing the first image pickup signal and the fourth image pickup signal is started. Next, Step S2420 is executed.

In Step S2420, the block index ib is initialized to 0. Next, Step S2430 is executed.

Figure 36:
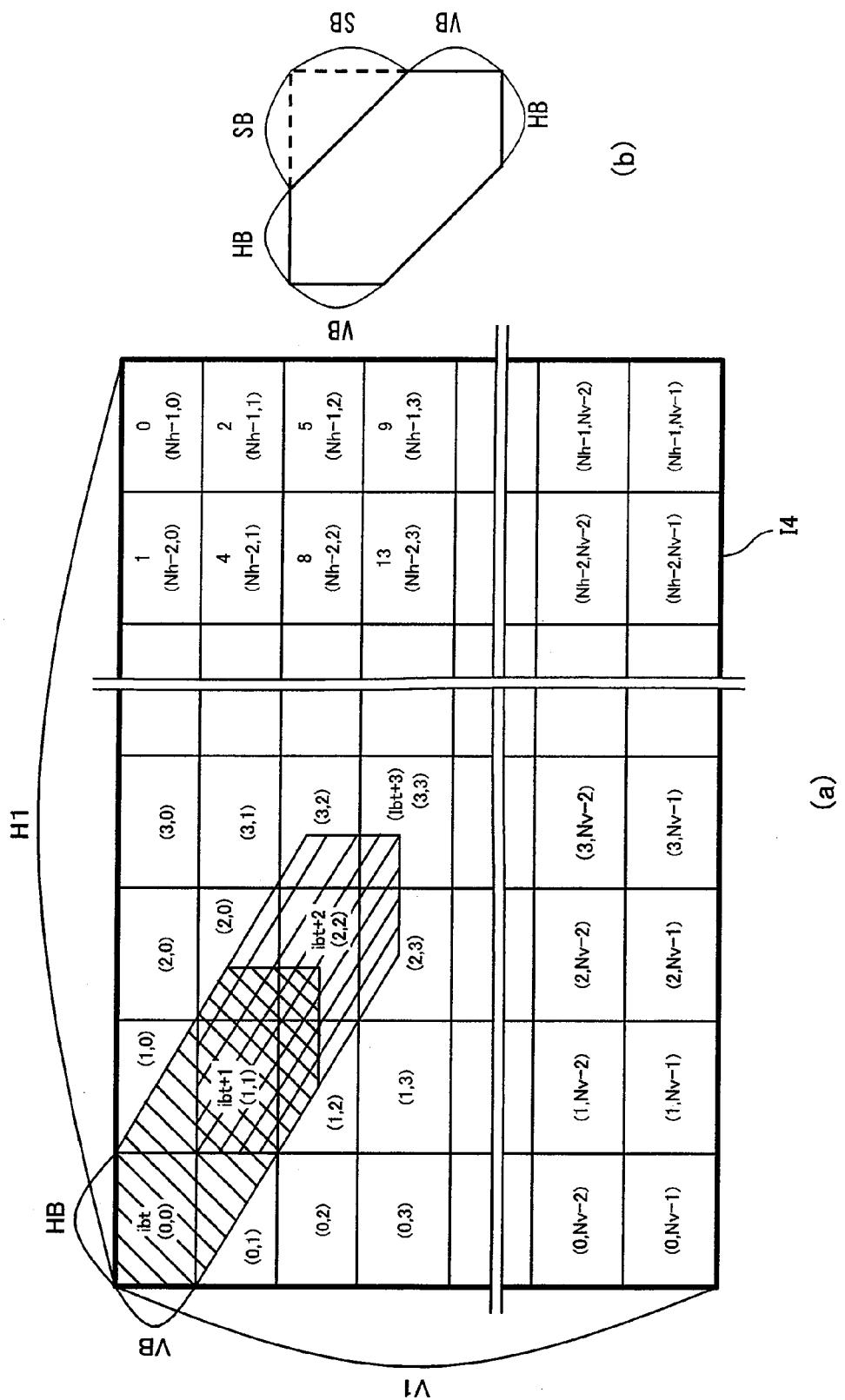
FIG. 36 are diagrams for explaining the divided blocks and calculation order of the fourth image pickup signal in the parallax calculation utilizing the first image pickup signal and the fourth image pickup signal in the image pickup apparatus according to Embodiment 2 of the present invention.

In Step S2430, the block is selected. The block division of the first image pickup signal is the same as that of the second image pickup signal of Step S2330, so that an explanation thereof is omitted. Note that the block index ib is changed so as to be similar to that of FIG. 36 described below. FIG. 36 is a diagram for explaining the divided blocks and calculation order of the fourth image pickup signal in the parallax calculation utilizing the first image pickup signal and the fourth image pickup signal in the image pickup apparatus according to Embodiment 2 of the present invention. As with the second image pickup signal I2 of FIG. 31, the first image pickup signal I1 is divided into rectangular blocks each having HB pixels in the x direction and VB pixels in the y direction.

Adjacent rectangular blocks are arranged so as to be displaced from each other by HB pixels in the x direction or VB pixels in the y direction. The first image pickup signal I1 has Nh blocks in the x direction and Nv blocks in the y direction. Therefore, the blocks do not overlap each other in the x direction or the y direction. In FIG. 36, the fourth image pickup signal I4 is divided into blocks each having (HB+SB)*(VB+SB)−SB*SB pixels as shown in FIG. 36(b). Adjacent blocks are arranged so as to be displaced from each other by HB pixels in the x direction and/or VB pixels in the y direction. The fourth image pickup signal I4 has Nh blocks in the x direction and Nv blocks in the y direction. Moreover, in FIG. 36, regarding the block (upper right, lower right, and lower left blocks for example) which cannot have the shape of the block shown in FIG. 36(b), a part of the block is suitably omitted (for example, the upper right block is a rectangular block of HB*VB pixels). Hereinafter, Embodiment 2 will explain an example in which HB is 32 and VB is 32.

In FIG. 36, a number shown on the upper level of each block denotes the block index ib. Moreover, in FIG. 36, the coordinates (ibx, iby) shown on the lower level of each block denote that the block is an ibx-th block in the x direction and an iby-th block in the y direction. Here, ibx is from 0 to Nh−1, and iby is from 0 to Vh−1. In Step S2320, the block shown by the block index ib (block shown by the coordinates (ibx, iby)) in FIG. 36 is selected. Next, Step S2440 is executed.

In Step S2440, the image pickup signal is transferred. Herein, the first image pickup signal I1 of the block selected in Step S2430 is transferred to the first calculating buffer 241a. A value at the coordinates (x, y) in the first calculating buffer 241a is set as Bc1(x, y). Here, since HB is 32 and VB is 32, x is from 0 to 31 and y is from 0 to 31. In Step S2430, the fourth image pickup signal I4 of the selected block is transferred to the second calculating buffer 241b. A value at the coordinates (x, y) in the second calculating buffer 241b is set as Bc2 (x, y). Here, since HB is 32 and VB is 32, x is from 0 to 31+SB, and y is from 0 to 31+SB. For example, when ib is ibt, the image pickup signal I1 of 1,024 pixels surrounded by the coordinates (0, 0) and the coordinates (31, 31) is transferred to the first calculating buffer 241a, and the image pickup signal I4 of (1,024+2*32*SB) pixels which are marked with diagonal lines extending in the diagonally lower right direction in FIG. 36 and surrounded by the coordinates (0, 0) and the coordinates (31+SB, 31+SB) is transferred to the second calculating buffer 241b. Next, when ib is ibt+1, the image pickup signal I1 of 1,024 pixels surrounded by the coordinates (32, 32) and the coordinates (63, 63) is transferred to the first calculating buffer 241a. Moreover, the second calculating buffer 241b requires the image pickup signal I4 of (1,024+2*32*SB) pixels which are marked with diagonal lines extending in the diagonally lower right direction in FIG. 36 and surrounded by the coordinates (32, 32) and the coordinates (63+SB, 63+SB). However, since a portion (region of 2*32* SB pixels surrounded by the coordinates (32, 32) and the coordinates (31+SB, 31+SB)) which overlaps the block whose ib is ibt has already been transferred to the second calculating buffer 241b, only 2,048 pixels surrounded by the coordinates (32+SB, 32+SB) and the coordinates (63+SB, 63+SB) may be newly transferred to the second calculating buffer 241b. Next, Step S2450 is executed.

Figure 37:
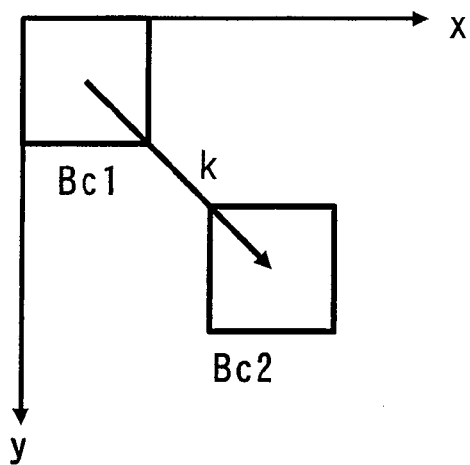
FIG. 37 is a diagram for explaining the calculation region of the parallax evaluated value in the parallax calculation utilizing the first image pickup signal and the fourth image pickup signal in the image pickup apparatus according to Embodiment 2 of the present invention.

In Step S2450, the parallax calculation is executed. First, the parallax evaluated value R(k) is calculated. Here, k denotes the displacement amount showing how much amount an image is displaced, and k is changed to be 0, 1, 2, . . . , and SB. FIG. 37 is a diagram for explaining the calculation region of the parallax evaluated value in the parallax calculation utilizing the first image pickup signal and the fourth image pickup signal in the image pickup apparatus according to Embodiment 2 of the present invention. As shown in FIG. 37, the region in which the data Bc1 is stored is a region in the first calculating buffer 241a. The region in which the data Bc2 is stored is a region which is in the second calculating buffer 241b and is away from the block indicated by Bc1 in FIG. 37 in a positive x direction by the displacement amount k and in the positive y direction by the displacement amount k. Then, the SAD (Sum of Absolute Differences) shown by Formula 17 below is calculated in a case where the displacement amount k is from 0 to SB, thereby obtaining the parallax evaluated value R(k).

$$R(k) = \Sigma\Sigma |Bc1(x, y) - Bc2(x+k, y+k)| \quad \text{Formula 17}$$

This parallax evaluated value R(k) shows how much the data Bc1 of the first calculating buffer 241a and the data Bc2 of the second calculating buffer 241b in the region away from the data Bc1 in the positive x direction by k and in the positive y direction by k are correlated to each other. In a case where the parallax evaluated value R(k) is small, the correlation therebetween is strong (that is, the data Bc1 and the data Bc2 are similar to each other). Here, since the data Bc1 of the first calculating buffer 241a is the transferred first image pickup signal I1, and the data Bc2 of the second calculating buffer 241b is the transferred fourth image pickup signal I4, this parallax evaluated value R(k) shows how much the first image pickup signal I1 and the corresponding fourth image pickup signal I4 are correlated to each other.

As shown in FIG. 17, the parallax evaluated value R(k) changes depending on the value of the displacement amount k, and is a minimal value when the displacement amount k is Δ. This shows that the data Bc1 of the first calculating buffer 241a is most strongly correlated to (is most similar to) the data Bc2 of the second calculating buffer 241b which is located in the region away from the data Bc1 of the first calculating buffer 241a in the positive x direction by k and in the positive y direction by k. Therefore, it is found that the parallax between the data Bc1 of the first calculating buffer 241a and the data Bc2 of the second calculating buffer 241b is Δ. Here, this Δ is called the parallax value Δ in this block.

Figure 38:
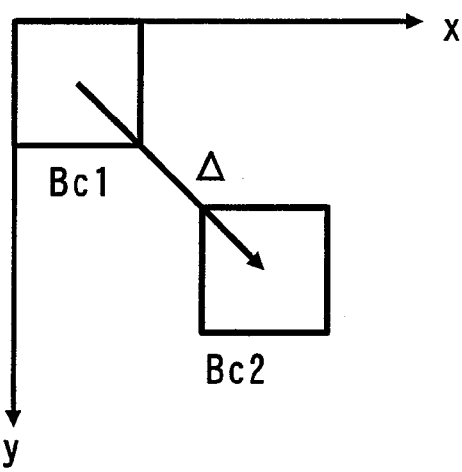
FIG. 38 is a diagram for explaining the calculation region of the reliability of the parallax evaluated value in the parallax calculation utilizing the first image pickup signal and the fourth image pickup signal in the image pickup apparatus according to Embodiment 2 of the present invention.

Next, the reliability of the parallax value Δ is calculated. FIG. 38 is a diagram for explaining the calculation region of the reliability of the parallax evaluated value in the parallax calculation utilizing the first image pickup signal and the fourth image pickup signal in the image pickup apparatus according to Embodiment 2 of the present invention. The region in which the data Bc1 is stored is a region in the first calculating buffer 241a. The region in which the data Bc2 is stored is a region which is in the second calculating buffer 241b and is away from the data Bc1 in the positive x direction by Δ and in the positive y direction by Δ. Then, as shown by Formula 18 below, the normalized correlation coefficient regarding the data Bc1(x, y) and the data Bc2(x+Δ, y+Δ) in respective regions is regarded as the reliability E.

$$E(1, 4)(ibx, iby) = \sum\sum [\{Bc1(x, y) - avg(Bc1(x, y))\} * \quad \text{Formula 18}$$
$$\{Bc2(x + \Delta, y + \Delta) - avg(Bc2(x + \Delta, y + \Delta))\}] /$$
$$\sqrt{\sum\sum [\{Bc1(x, y) - avg(Bc1(x, y))\} *}$$
$$\{Bc1(x, y) - avg(Bc1(x, y))\}] /$$
$$\sqrt{\sum\sum \{Bc2(x + \Delta, y + \Delta) - avg(Bc2(x + \Delta,}$$
$$y + \Delta))\} * \{Bc2(x + \Delta, y + \Delta) -$$
$$avg(Bc2(x + \Delta, y + \Delta))\}]$$

Then, in the parallax calculation utilizing the first image pickup signal and the fourth image pickup signal, the reliability E of the parallax value Δ is stored as the parallax value Δ(1, 4)(ibx, iby) in the block shown by the coordinates (ibx, iby) and having 32*32 pixels, and its reliability E(1, 4)(ibx, iby). Here, (1, 4) denotes that each of the parallax value and the reliability utilizes the first image pickup signal and the fourth image pickup signal, and (ibx, iby) denotes the block shown by the block index ib, and the coordinates shown on the lower level of each block in FIG. 31. Next, Step S2460 is executed.

In Step S2460, 1 is added to the block index ib. Next, Step S2470 is executed.

In Step S2470, whether or not the parallax calculation utilizing the first image pickup signal and the fourth image pickup signal is terminated is determined. When the block index ib is less than Nh*Nv, next, Step S2430 is executed to calculate the parallax of the next block. Meanwhile, when the block index ib is Nh*Nv or more, it is determined that the parallaxes of all the blocks are calculated, and next, Step S2480 is executed.

In Step S2480, the parallax calculation utilizing the first image pickup signal and the fourth image pickup signal is terminated, and the process returns to the upper routine. Thus, the parallax value Δ(1, 4)(ibx, iby) and its reliability E(1, 4)(ibx, iby) of the block shown by the block index ib and having 32*32 pixels are obtained by resolution of 32*32 pixels in the parallax calculation utilizing the first image pickup signal and the fourth image pickup signal. Here, (1, 4) denotes that the first image pickup signal and the fourth image pickup signal are utilized, and (ibx, iby) denotes the coordinates shown on the lower level of each block in FIG. 31 (ibx changes from 0 to Nh−1, and iby changes from 0 to Nv−1). Next, Step S2250a of FIG. 29 is executed.

In Step S2250a, the parallax is selected. The reliability E(2,3)(ibx, iby) and the reliability E(1, 4)(ibx, iby) are compared to each other in each block, and the parallax which gives the highest reliability is set as the parallax value Δ(ibx, iby) of the block. Moreover, the reliability in this case is E(ibx, iby). Next, Step S2260 is executed.

In Step S2230b, the parallax calculation utilizing the second image pickup signal and the third image pickup signal is executed. Step S2230b is similar to Step S2230a, so that an explanation thereof is omitted. Note that the obtained parallax and reliability are the parallax value Δ(ibx, iby) and the reliability E(ibx, iby), respectively, of each block. Next, Step S2260 is executed.

In Step S2260, the parallax calculation is terminated, and the process returns to the upper routine. Thus, the parallax value Δ(ibx, iby) is obtained for each block. Here, (ibx, iby) denotes the coordinates shown on the lower level of each block of FIG. 31, ibx changes from 0 to Nh−1, and iby changes from 0 to Nv−1. In the present embodiment, when the flag FO is 1 (first operating mode), the reliability of the parallax (parallax by the near infrared light) by the second image pickup signal I2 and the third image pickup signal I3 and the reliability of the parallax (parallax by the green light) by the first image pickup signal I1 and the fourth image pickup signal I4 are compared to each other, and the parallax having higher reliability is adopted. Meanwhile, when the transfer range flag FO is 2 (second operating mode), such selection based on the reliability is not carried out, and the parallax (parallax by the near infrared light) by the second image pickup signal I2 and the third image pickup signal I3 is adopted. Next, Step S2700 is executed.

In Step S2700, the distance calculating portion 143 carries out the distance calculation, and sequentially transfers the result of the distance calculation to the second output buffer 137b as the distance data. Step S2700 is similar to Step S1700 of Embodiment 1, so that an explanation thereof is omitted. Next, Step S2800 is executed.

In Step S2800, the transfer range determining portion 144 determines the transfer range and sets the transfer range flag. Step S2800 is similar to S1800 of Embodiment 1, so that an explanation thereof is omitted. Next, Step S2900 is executed.

In Step S2900, the calculation is terminated, and the process returns to the upper routine. Next, Step S2910 is executed.

The same effects as in Embodiment 1 are obtained by configuring and operating the image pickup apparatus of the present embodiment as above. To be specific, in accordance with the image pickup apparatus according to Embodiment 2 of the present invention, based on the reliability E(ibx, iby) generated from the image pickup signal, the transfer range determining portion 144 sets the transfer range flag FO to 1 (first operating mode) when the reliability E(ibx, iby) is small and sets the transfer range flag FO to 2 (second operating mode) when the reliability E(ibx, iby) is large. With this, when the reliability E(ibx, iby) is large, it is determined that there is room for increasing the speed. Therefore, by setting the output flag FO to 2 (second operating mode), the image pickup apparatus capable of carrying out the high-speed parallax calculation and distance calculation is realized. Meanwhile, when the reliability E(ibx, iby) is small, it is determined that the accuracy is further required. Therefore, by setting the output flag FO to 1 (first operating mode), the highly-accurate parallax calculation and distance calculation can be carried out.

Moreover, by carrying out the parallax calculation utilizing the image pickup signals (the second image pickup signal I2 and the third image pickup signal I3; the first image pickup signal I1 and the fourth image pickup signal) corresponding to the diagonally arranged lens portions (the second lens portion 113b and the third lens portion 113c; the first lens portion 113a and the fourth lens portion 114d), the parallax of a subject (for example, a stop line in front of a vehicle) having a horizontally elongated shape can be detected accurately.

In the image pickup apparatus of Embodiment 2, each of the first image pickup signal I1, the second image pickup signal I2, the third image pickup signal I3, and the fourth image pickup signal I4 has H1 pixels in the horizontal direction and V1 pixels in the vertical direction, and the parallax calculation is carried out using all of the regions. However, all of the regions do not have to be used. To be specific, the image pickup signal utilized in the parallax calculation may be made smaller than the image pickup signal of H1 pixels in the horizontal direction and V1 pixels in the vertical direction.

Moreover, in the image pickup apparatus of Embodiment 2, the transfer range is changed depending on the reliability E(ibx, iby). However, the present invention is not limited to this. An essence of the present invention is to carry out the parallax calculation and distance calculation such that the relation between the speed and the accuracy becomes appropriate by changing the transfer range. Note that the transfer range may be changed by the command of the host CPU. For example, the host CPU may change the transfer range by using the image data. Or, the host CPU may command the transfer range based on subject information specified by a user.

As with Embodiment 1, the transfer range may be determined without being based on the image pickup signal.

Moreover, in the image pickup apparatus of Embodiment 2, the initial value of the transfer range flag FO is set to 1 (transfer range is all of the image pickup regions). However, the initial value of the transfer range flag FO may be set to 2 (transfer range is the half of the image pickup regions).

Moreover, in the image pickup apparatus of Embodiment 2, the size of the first calculating buffer is 32*32 pixels (32 pixels in the horizontal direction and 32 pixels in the vertical direction). However, the present embodiment is not limited to this. For example, the size of the first calculating buffer may be 4*4 pixels, 8*8 pixels, or 16*16 pixels. Moreover, the size of the first calculating buffer may be suitably changed. Moreover, the parallaxes of a plurality of blocks of different sizes may be calculated, and the parallax may be selected. Further, instead of the rectangular block, the block division may be carried out by extracting an edge or the like. Moreover, the present embodiment is not limited to the calculation of the parallax of the block, but the calculation of the parallax of the line segment that is the edge may be carried out.

Moreover, in the image pickup apparatus of Embodiment 2, the second image pickup signal I2 is transferred to the first output buffer 137a and output from the input/output portion 138. However, the other image pickup signal (the first image pickup signal I1, the third image pickup signal I3, or the fourth image pickup signal I4) may be output. Moreover, a plurality of image pickup signals may be output. Further, the image pickup signal to be output from the input/output portion 138 may be changed depending on a condition of the image pickup signal. For example, the image pickup signals may be compared to one another, thereby outputting the brightest image pickup signal (it is determined that, for example, the average of the amplitude of the image pickup signals is the largest) or the most sharply-defined image pickup signal (it is determined that, for example, the average of derivatives or the maximum value is the largest).

Moreover, in the image pickup apparatus of Embodiment 2, the image pickup element 223 that is the CMOS sensor and the SLSI 225 are formed separately. However, the SLSI 225 may be constituted by a CMOS process, and the image pickup element 223 and the SLSI 225 may be formed on the same semiconductor substrate. With this, since wires and the like on the substrate 121 can be omitted as compared to a case where the image pickup element 223 and the SLSI 225 are formed separately, it is possible to realize cost reduction. Moreover, it is possible to improve noise immunity.

In FIG. 25(a), the region (region shown by I1) corresponding to the first image pickup signal I1, the region (region shown by I2) corresponding to the second image pickup signal I2, the region (region shown by I3) corresponding to the third image pickup signal I3, and the region (region shown by I4) corresponding to the fourth image pickup signal I4 are shown so as to be symmetric about the center of the image pickup element. However, needless to say, these regions do not have to be symmetric about the center of the image pickup element. The origin point (x01, y01) of the image pickup signal I1, the origin point (x02, y02) of the image pickup signal I2, the origin point (x03, y03) of the image pickup signal I3, and the origin point (x04, y04) of the image pickup signal I4 may be set by, for example, adjustment after the assembling such that the center of the optical axis of the first lens portion 113a, the center of the optical axis of the second lens portion 113b, the center of the optical axis of the third lens portion 113c, and the center of the optical axis of the fourth lens portion 113d correspond to pixels, corresponding to one another, of the corresponding image pickup signals, respectively, by, for example, the manufacturing variation of the lens 113 and the assembly accuracy of the lens module 110. A flash memory, an EEPROM, or the like may be mounted in the SLSI 225 or on the substrate 121, and store information, and the information may be suitably used.

Figure 39:
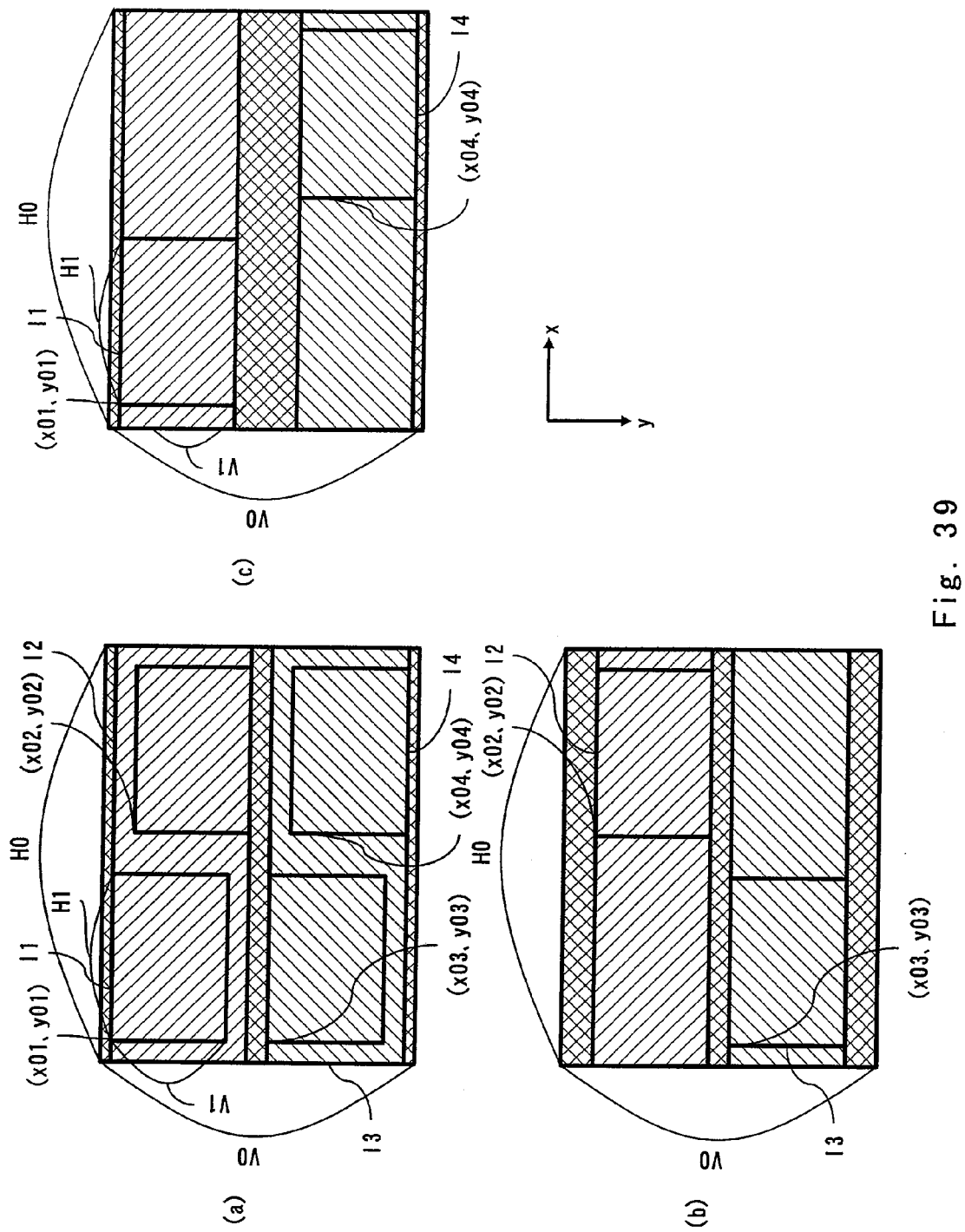
FIG. 39 are diagrams for explaining the cut-out position of the image pickup signal of a modification of the image pickup apparatus according to Embodiment 2 of the present invention.

Moreover, the image pickup apparatus of Embodiment 2 obtains the image pickup signal having an arbitrary size (As shown in FIG. 25, the image pickup signal I1 has H1 pixels in the horizontal direction and V1 pixels in the vertical direction.) cut out from an arbitrary position (As shown in FIG. 25, the image pickup signal I1 has the origin point (x01, y01)). Here, the following modification is made in a case where the arbitrary position can be specified only in the vertical direction. FIG. 39 are diagrams for explaining the cut-out position of the image pickup signal of a modification of the image pickup apparatus according to Embodiment 2 of the present invention. FIG. 39 show a case where the region (region shown by I1) corresponding to the first image pickup element I1 is located on a negative vertical direction side of the region corresponding to the second image pickup element I2 (to be specific, the y coordinate y01 of the origin point of the first image pickup signal I1 is smaller than the y coordinate y02 of the origin point of the second image pickup signal I2), and the region (region shown by I3) corresponding to the third image pickup element I3 is located on the negative vertical direction side of the region corresponding to the fourth image pickup element I4 (to be specific, the y coordinate y03 of the origin point of the third image pickup signal I3 is smaller than the y coordinate y04 of the origin point of the fourth image pickup signal I4). When the FO is 1 (first operating mode), as shown in FIG. 39(a), a region (region marked with diagonal lines extending in a lower right direction) of H0 pixels in the horizontal direction and V1+y02−y01 pixels whose y-coordinates are from y01 to y02+V1−1 in the vertical direction, and a region (region marked with diagonal lines extending in an upper right direction) of H0 pixels in the horizontal direction and V1+y04−y03 pixels whose y-coordinates are from y03 to y04+V1−1 in the vertical direction are loaded, preprocessing is suitably carried out, and the regions corresponding to the first image pickup signal I1, the second image pickup signal I2, the third image pickup signal I3, and the fourth image pickup signal I4 are used. When the FO is 2 (second operating mode), as shown in FIG. 39(b), a region (region marked with diagonal lines extending in the lower right direction) of H0 pixels in the horizontal direction and V1 pixels whose y-coordinates are from y02 to y02+V1−1 in the vertical direction, and a region (region marked with diagonal lines extending in the upper right direction) of H0 pixels in the horizontal direction and V1 pixels whose y-coordinates are y03 to y03+V1−1 in the vertical direction are loaded, preprocessing is suitably carried out, and the second image pickup signal I2 and the third image pickup signal I3 are used.

V1+y02−y01 loaded pixels (that is the number of loaded pixels in the vertical direction in the region marked with diagonal lines extending in the lower right direction in an upper portion) and V1+y04−y03 pixels (that is the number of loaded pixels in the vertical direction in the region marked with diagonal lines extending in the upper right direction in a lower portion) in the vertical direction which are necessary when the transfer range flag FO is 1 (first operating mode) are reduced to V1 pixels (that is the number of loaded pixels in the vertical direction in the region marked with diagonal lines extending in the lower right direction in the upper region) and V1 pixels (that is the number of loaded pixels in the vertical direction in the region marked with diagonal lines extending in the upper right direction in the lower direction), respectively, in the vertical direction which are necessary when the transfer range flag FO is 2 (second operating mode). That is, y02−y01+y04−y03 pixels are reduced. Thus, the time necessary for transferring an image can be shortened by this reduction. With this, when the reliability E(ibx, iby) is large, it is determined that there is room for increasing the speed. Therefore, by setting the output flag FO to 2 (second operating mode), the image pickup apparatus capable of carrying out the high-speed parallax calculation and distance calculation is realized. Meanwhile, when the reliability E(ibx, iby) is small, it is determined that the accuracy is further required. Therefore, by setting the output flag FO to 1 (first operating mode), the highly-accurate parallax calculation and distance calculation can be carried out.

For example, as a case where the transfer range flag FO is 3 (third operating mode), a case of carrying out only the parallax calculation utilizing the first image pickup signal I1 and the fourth image pickup signal I4 may be added. In this case, when the FO is 3, as shown in FIG. 39(*c*), a region (region marked with diagonal lines extending in the lower right direction) of H0 pixels in the horizontal direction and VH1 pixels whose y-coordinates are from y01 to y01+V1−1 in the vertical direction, and a region (region marked with diagonal lines extending in the upper right direction) of H0 pixels in the horizontal direction and V1 pixels whose y-coordinates are from y04 to y04+V1−1 in the vertical direction are loaded, preprocessing is suitably carried out, and the first image pickup signal I1 and the fourth image pickup signal I4 are used. If the position where the loading is started is not changed, a width equal to or more than a width (2×V1) in the vertical direction needs to be loaded as shown in FIG. 39(*a*) in order to deal with a case where the FO is 2 and a case where the FO is 3. However, by suitably changing the vertical position where the loading is started depending on the operating mode, such as switching between a case where the FO is 2 and a case where the FO is 3, and by not changing the loaded pixels in the vertical direction (by maintaining 2×V1), the time necessary for transferring the pixels is prevented from increasing.

Moreover, in FIG. 39, rows in the region marked with diagonal lines extending in the lower right direction and rows in the region marked with diagonal lines extending in the upper right direction may be loaded alternately. For example, in FIG. 39(*a*), the loading may be carried out in order of y01, y03, y01+1, y03+1, y01+2, y03+1, . . . . In the case of using the rolling shutter CMOS sensor, when the region marked with diagonal lines extending in the upper right direction is loaded after the region marked with diagonal lines extending in the lower right direction is loaded, an image pickup time of the second image pickup signal I2 and an image pickup time of the third image pickup signal differ from each other. Therefore, when the movement of the subject is fast, the accuracy of the obtained parallax deteriorates since the image pickup signals utilized in the calculation of the sum of absolute differences differ. In the case of using the rolling shutter CMOS sensor, by alternately loading the rows of the region marked with diagonal lines extending in the lower right direction and the rows of the region marked with diagonal lines extending in the upper right direction, the image pickup times of the image pickup signals utilized in the calculation of the sum of absolute differences substantially coincide with each other even when the movement of the subject is fast. Therefore, the parallax calculation can be carried out with high accuracy.

Moreover, in the case of using the rolling shutter CMOS sensor, by loading the image pickup regions pixel-by-pixel, the influence of the image pickup time is further reduced, thereby realizing the highly-accurate parallax calculation. To be specific, when the FO is 1 (first operating mode), the signals may be transferred in order of (x02, y02), (x03, y03), (x01, y01), (x04, y04), (x02+1, y02), (x03+1, y03), (x01+1, y01), (x04+1, y04), (x02+2, y02), (x03+2, y03), (x01+2, y01), (x04+2, y04), . . . , (x02+H1−1, y02), (x03+H1−1, y03), (x01+H1−1, y01), (x04+H1−1, y04), (x02, y02+1), (x03, y03+1), (x01, y01+1), (x04, y04+1), (x02+1, y02+1), (x03+1, y03+1), (x01+1, y01+1), (x04+1, y04+1), . . . , (x02, y02+V1−1), (x03, y03+V1−1), (x01, y01+V1−1), (x04, y04+V1−1), (x02+1, y02+V1−1), (x03+1, y03+V1−1), (x01+1, y01+V1−1), (x04+1, y04+V1−1), . . . , (x02+H1−1, y02+V1−1), (x03+H1−1, y03+V1−1), (x01+H1−1, y01+V1−1), and (x04+H1−1, y04+V1−1). By sequentially loading a corresponding set of image pickup signals (the second image pickup signal I2 and the third image pickup signal; the first image pickup signal I1 and the fourth image pickup signal I4) in the parallax calculation as described above, the influence of the difference between the image pickup times can be reduced. Meanwhile, when the FO is 2 (second operating mode), the signals may be transferred in order of (x02, y02), (x03, y03), (x02+1, y02), (x03+1, y03), (x02+2, y02), (x03+2, y03), . . . , (x02+H1−1, y02), (x03+H1−1, y03), (x02, y02+1), (x03, y03+1), (x02+1, y02+1), (x03+1, y03+1), . . . , (x02, y02+V1−1), (x03, y03+V1−1), (x02+1, y02+V1−1), (x03+1, y03+V1−1), . . . , (x02+H1−1, y02+V1−1), and (x03+H1−1, y03+V1−1).

As above, the image pickup region according to the transfer range may repeatedly alternately transfer a part of the generated image pickup signal to the image pickup signal input portion 233 to transfer all of the generated image pickup signals to the image pickup signal input portion 233.

Embodiment 3

In the image pickup apparatus according to Embodiments 1 and 2 of the present invention, for example, when the high speed is required in the parallax calculation, only one set of image pickup signals are transferred without transferring two sets of image pickup signals, and thereby, the time necessary for the transfer is reduced. Thus, the parallax calculation and distance calculation are carried out at high speed. In contrast, in the image pickup apparatus according to Embodiment 3, the range of the parallax calculation is limited in one set of image pickup signals, and only the limited portion is transferred, and thereby, the time necessary for the transfer is reduced. Thus, the parallax calculation and distance calculation are carried out at high speed.

Hereinafter, the image pickup apparatus according to Embodiment 3 of the present invention will be explained in reference to the drawings.

Figure 40:
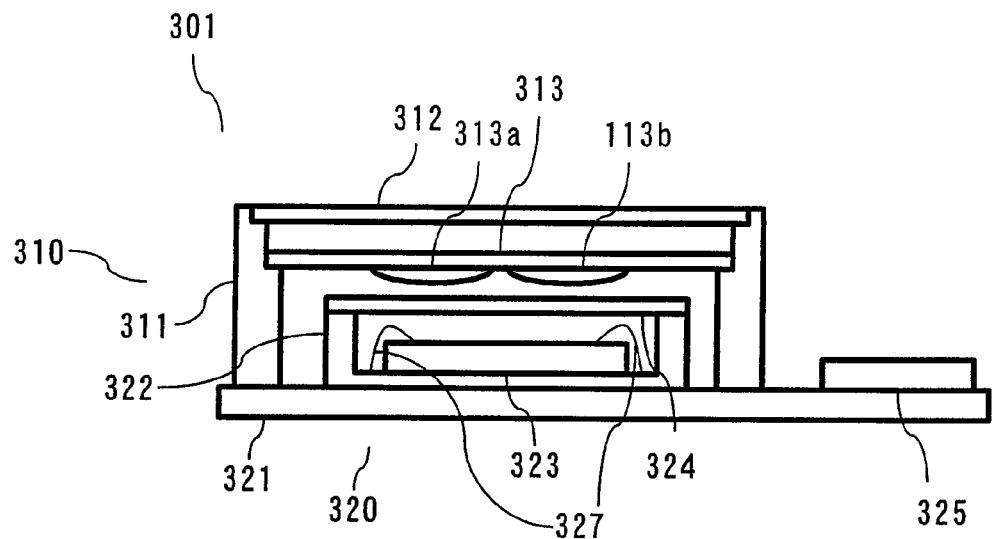
FIG. 40 is a cross-sectional view showing the configuration of the image pickup apparatus according to Embodiment 3 of the present invention.

FIG. 40 is a cross-sectional view showing the configuration of the image pickup apparatus according to Embodiment 3 of the present invention. In FIG. 40, the image pickup apparatus includes a lens module portion 310 and a circuit portion 320.

The lens module portion 310 includes a lens barrel 311, an upper cover glass 312, and a lens 313. The circuit portion 320 includes a substrate 321, a package 322, an image pickup element 323, a package cover glass 324, and a system LSI (hereinafter referred to as SLSI) 325.

The lens barrel 311 and the upper cover glass 312 are the same as the lens barrel 111 and the upper cover glass 112, respectively, of Embodiment 1, so that explanations thereof are omitted.

Figure 41:
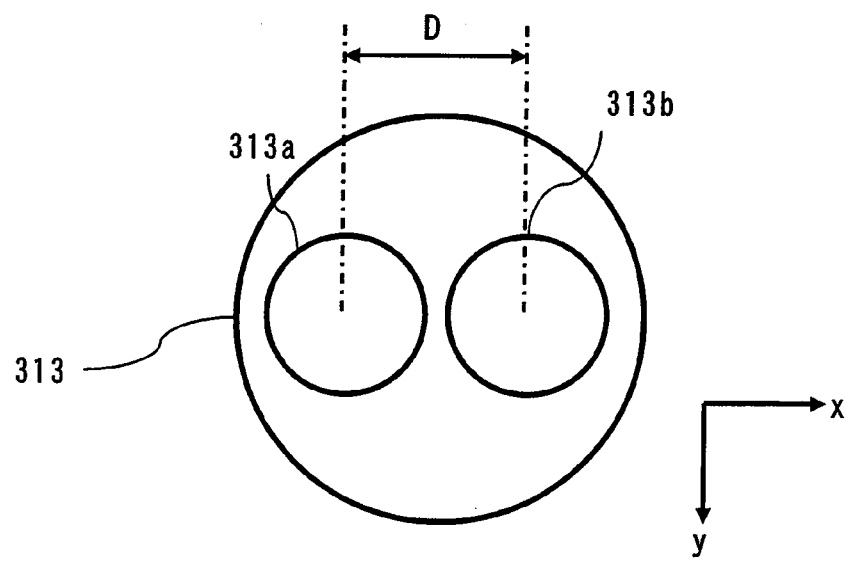
FIG. 41 is a plan view showing the configuration of the lens of the image pickup apparatus according to Embodiment 3 of the present invention.

FIG. 41 is a plan view showing the configuration of the lens of the image pickup apparatus according to Embodiment 3 of the present invention. The lens 313 has a substantially disc shape, and is formed by glass or transparent resin. In the lens 313, a first lens portion 313*a* and a second lens portion 313*b* are arranged. As shown in FIG. 41, an x-axis is set so as to extend along a direction in which the first lens portion 313*a* and the lens portion 313*b* are arranged, and a y-axis is set so as to be perpendicular to the x-axis. Light incident from the subject side of the first lens portion 313*a* and the second lens portion 313*b* emanates to the image pickup element 323 side thereof to form two images on the image pickup element 323. As shown in FIG. 41, the optical axis of the first lens portion 313a and the optical axis of the second lens portion 313b are separated from each other by D in the horizontal direction (x-axis direction) and coincide with each other in the vertical direction (y-axis direction).

The substrate 321 and the package 322 are the same as the substrate 121 and the package 122, respectively, of Embodiment 1, so that explanations thereof are omitted.

The image pickup element 323 is a CMOS sensor, and is disposed such that a light receiving surface thereof is substantially perpendicular to the optical axes of the first lens portion 313a and the second lens portion 313b. Each terminal of the image pickup element 323 is connected to the metal terminal a bottom portion inside the package 322 by a gold wire 327 using wire bonding, and is electrically connected to the SLSI 325 via the substrate 321. Light emanating from the first lens portion 313a and the second lens portion 313b form images on the light receiving surface of the image pickup element 323, this light information is converted into electric information by a photodiode, and this electric information is transferred to the SLSI 325.

Figure 42:
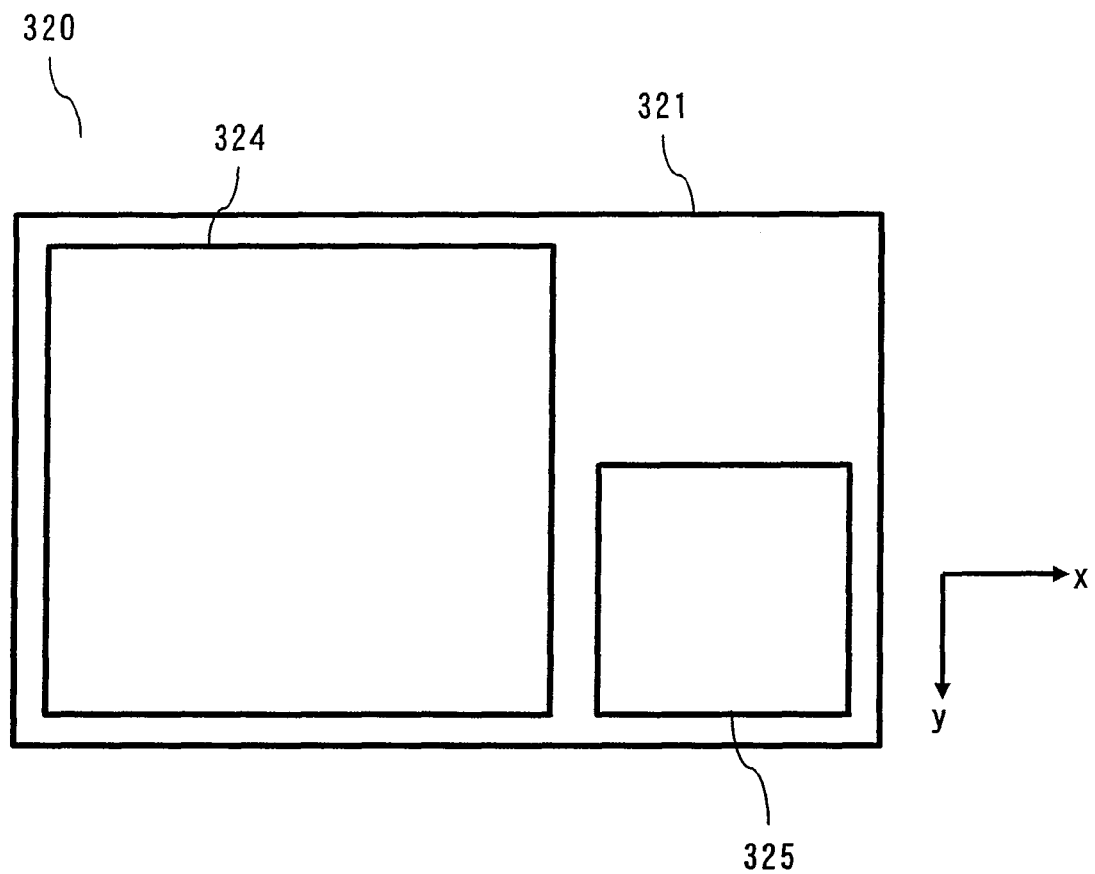
FIG. 42 is a plan view showing the configuration of the circuit portion of the image pickup apparatus according to Embodiment 3 of the present invention.

FIG. 42 is a plan view showing the configuration of the circuit portion of the image pickup apparatus according to Embodiment 3 of the present invention. The package cover glass 324 has a flat plate shape, is formed by transparent resin, and is fixed to an upper surface of the package 322 by adhesive or the like. Moreover, an antireflection coating is disposed on an upper surface, a lower surface, or both surfaces of the package cover glass 324 by vapor deposition or the like.

The SLSI 325 drives the image pickup element 323 in the following manner, receives electric information from the image pickup element 323, carries out various calculations, communicates with the host CPU, and outputs the image information, the distance information, and the like to outside. Note that the SLSI 325 is connected to the power supply (3.3 V for example) and the ground (0 V for example).

Figure 43:
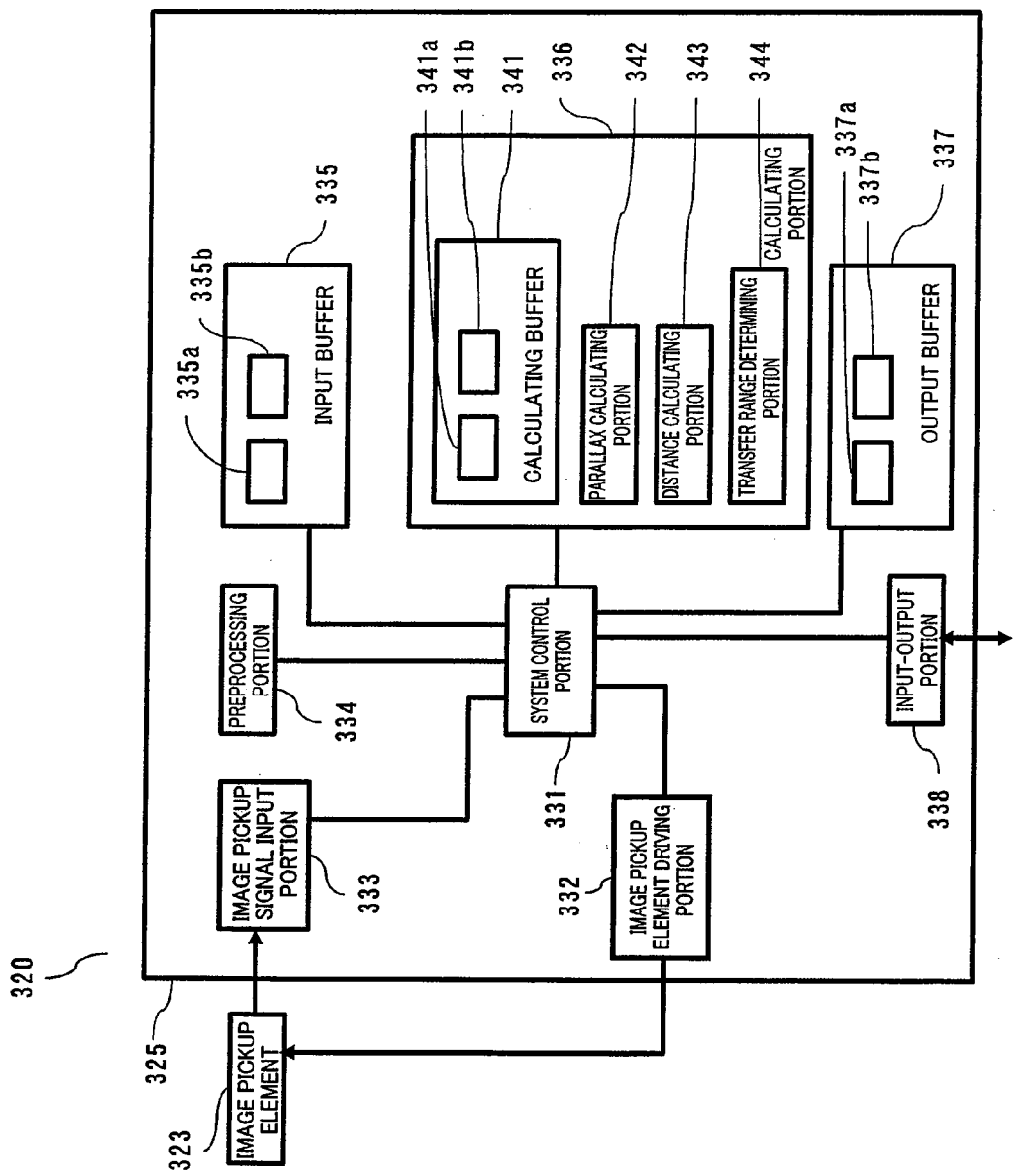
FIG. 43 is a block diagram showing the configuration of the image pickup apparatus according to Embodiment 3 of the present invention.

Next, the operation of the image pickup apparatus according to Embodiment 3 of the present invention will be explained. FIG. 43 is a block diagram showing the configuration of the image pickup apparatus according to Embodiment 3 of the present invention. The SLSI 325 includes a system control portion 331, an image pickup element driving portion 332, an image pickup signal input portion 333, a preprocessing portion 334, an input buffer 335, a calculating portion 336, an output buffer 337, and an input/output portion 338. The input buffer 335 includes a first input buffer 335a and a second input buffer 335b. The calculating portion 336 includes a calculating buffer 341, a parallax calculating portion 342, a distance calculating portion 343, and a transfer range determining portion 344. The calculating buffer 341 includes a first calculating buffer 341a and a second calculating buffer 341b. The output buffer 337 includes a first output buffer 337a and a second output buffer 337b.

The system control portion 331 is constituted by a CPU (Central Processing Unit), a logic circuit, and the like, and controls the entire SLSI 325.

The image pickup element driving portion 332 is constituted by a logic circuit and the like, generates a signal for driving the image pickup element 323, and applies to the image pickup element 323 a voltage corresponding to this signal.

The image pickup signal input portion 333 is constituted by connecting in series a CDS circuit (Correlated Double Sampling Circuit), an AGC (Automatic Gain Controller), and an ADC (Analog Digital Converter), receives an electric signal from the image pickup element 323, removes a fixed noise by the CDS circuit, adjusts a gain by the AGC, and converts an analog signal into a digital value by the ADC.

The preprocessing portion 334 is constituted by a logic circuit and the like, carries out the intensity correction, and sequentially transfers the signal to the input buffer 335. Moreover, the coordinate transformation may be suitably carried out to correct, for example, displacement of the optical axis of the lens.

The calculating portion 336 is constituted by: the first calculating buffer 341a and the second calculating buffer 341b, each of which is constituted by a SRAM (Static Random Access Memory); the parallax calculating portion 342 constituted by a logic circuit, a CPU, and the like; the distance calculating portion 343 constituted by a logic circuit, a CPU, and the like; and the transfer range determining portion 344 constituted by a logic circuit, a CPU, and the like. The calculating portion 336 loads the first image pickup signal I1 and the second image pickup signal I2 by the block, stores the signals in the first calculating buffer 341a and the second calculating buffer 341b, respectively, calculates the parallax by the parallax calculating portion 342 based on, for example, data of the first calculating buffer 341a and the second calculating buffer 341b, calculates the distance by the distance calculating portion 343 based on the obtained parallax, and transfers the obtained distance data to the output buffer 337.

The output buffer 337 is constituted by a DRAM and the like, stores the image data transferred from the input buffer 335 and the distance data transferred from the calculating portion 336, and sequentially transfers the data to the input/output portion 338.

The input/output portion 338 communicates with the host CPU (not shown), and outputs the image data and the distance data to the host CPU, the external memory (not shown), and the external display apparatus (not shown), such as a liquid crystal display.

Figure 44:
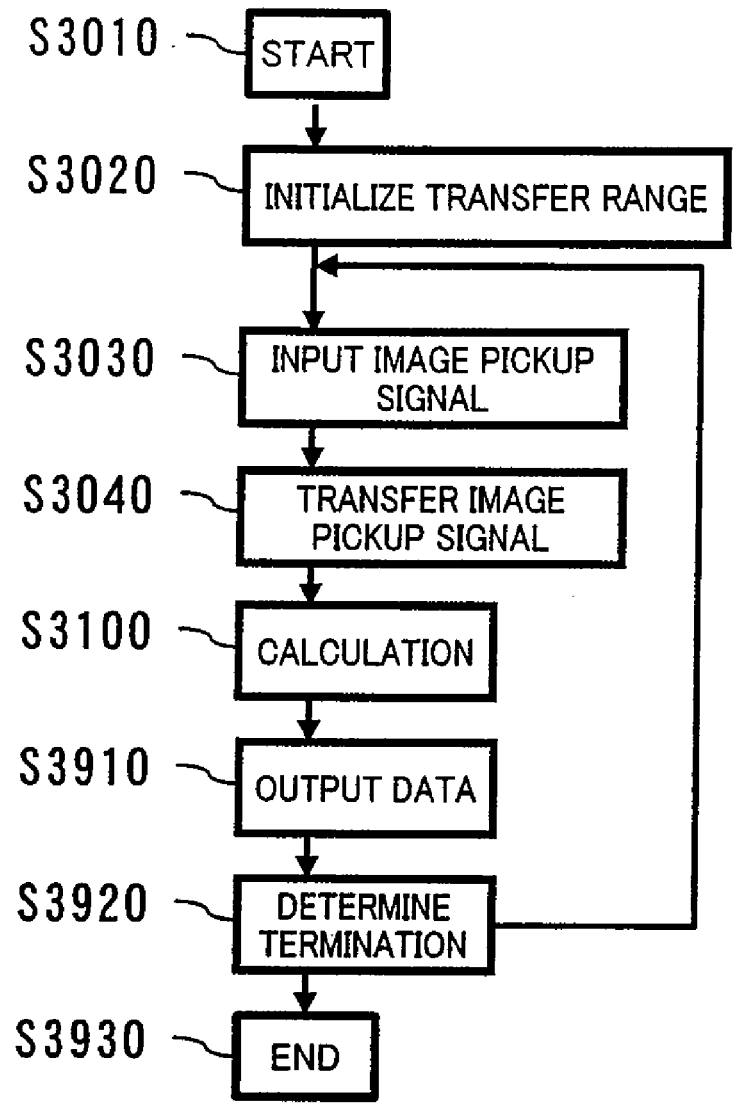
FIG. 44 is a flow chart showing the operation of the image pickup apparatus according to Embodiment 3 of the present invention.

FIG. 44 is a flow chart showing the operation of the image pickup apparatus according to Embodiment 3 of the present invention. An image pickup apparatus 301 is operated by the system control portion 331 of the SLSI 325 in accordance with this flow chart.

In Step S3010, the operation starts. For example, the host CPU (not shown) commands the image pickup apparatus 301 via the input/output portion 338 to start operating, and thereby, the image pickup apparatus 301 starts operating. Next, Step S3020 is executed.

In Step S3020, the initialization of the transfer range is carried out. In the present embodiment, the image pickup signals generated by all of the image pickup regions are set as the transfer range. Then, all of the transfer range flags FO(ibx, iby) of respective blocks (ibx, iby) are set to 1.

Figure 45:
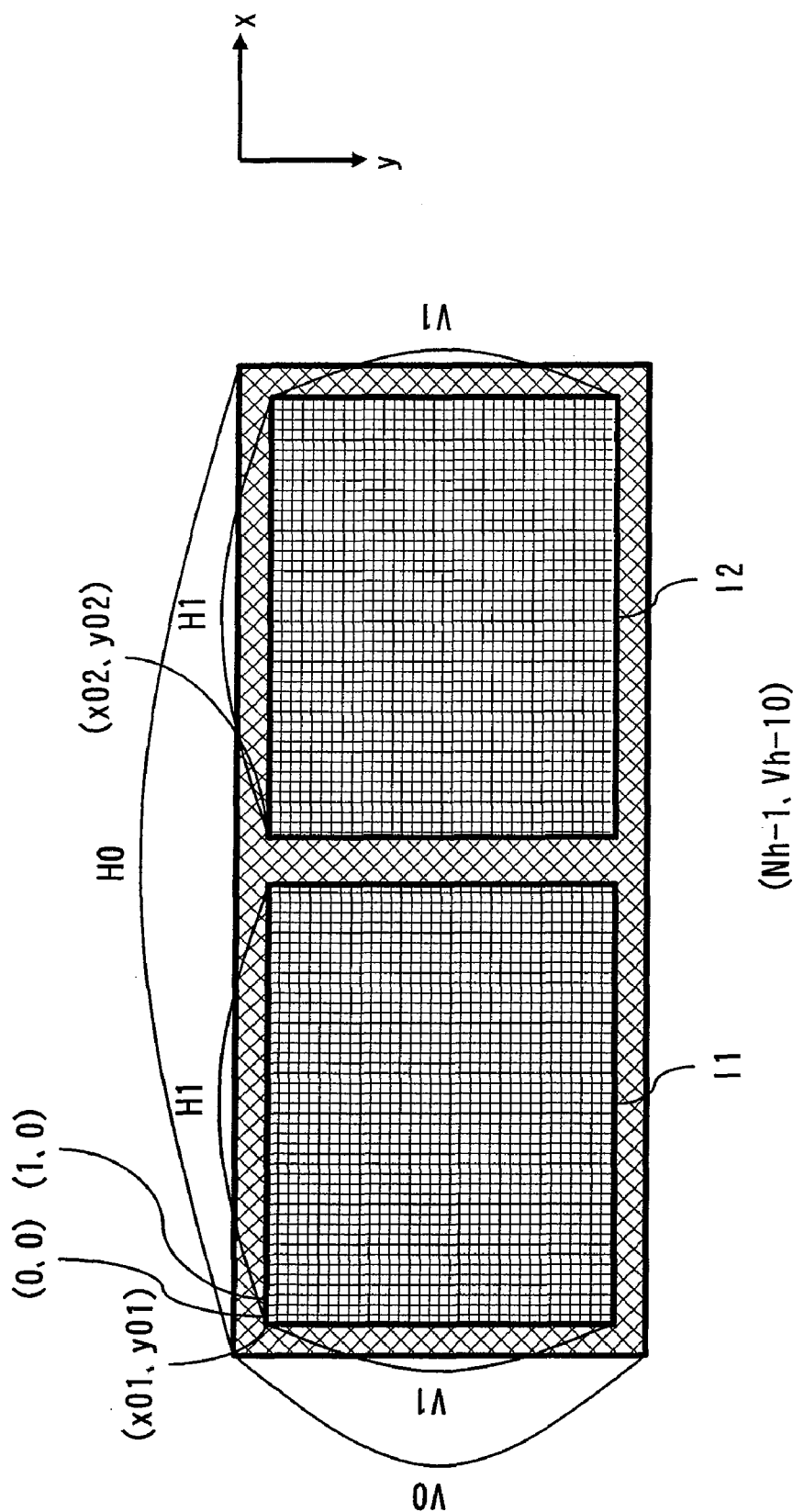
FIG. 45 is a diagram for explaining the cut-out position of the image pickup signal of the image pickup apparatus according to Embodiment 3 of the present invention.

FIG. 45 is a diagram for explaining the cut-out position of the image pickup signal of the image pickup apparatus according to Embodiment 3 of the present invention.

The image pickup region of the image pickup element 323 has H0 pixels in the horizontal direction and V0 pixels in the vertical direction. As shown by I1 in FIG. 45, the region in which the subject image formed by the first lens portion 313a is formed has the origin point (x01, y01), V1 pixels in the horizontal direction, and V1 pixels in the vertical direction, and is input to the SLSI 325 as the first image pickup signal I1. Moreover, as shown by I2 in FIG. 45, the region in which the subject image formed by the second lens portion 313b is formed has the origin point (x02, y02), H1 pixels in the horizontal direction, and V1 pixels in the vertical direction, and is input to the SLSI 325 as the second image pickup signal. The region corresponding to the first image pickup signal I1 and the region corresponding to the second image pickup signal I2 are divided into a large number of block regions.

Figure 46:
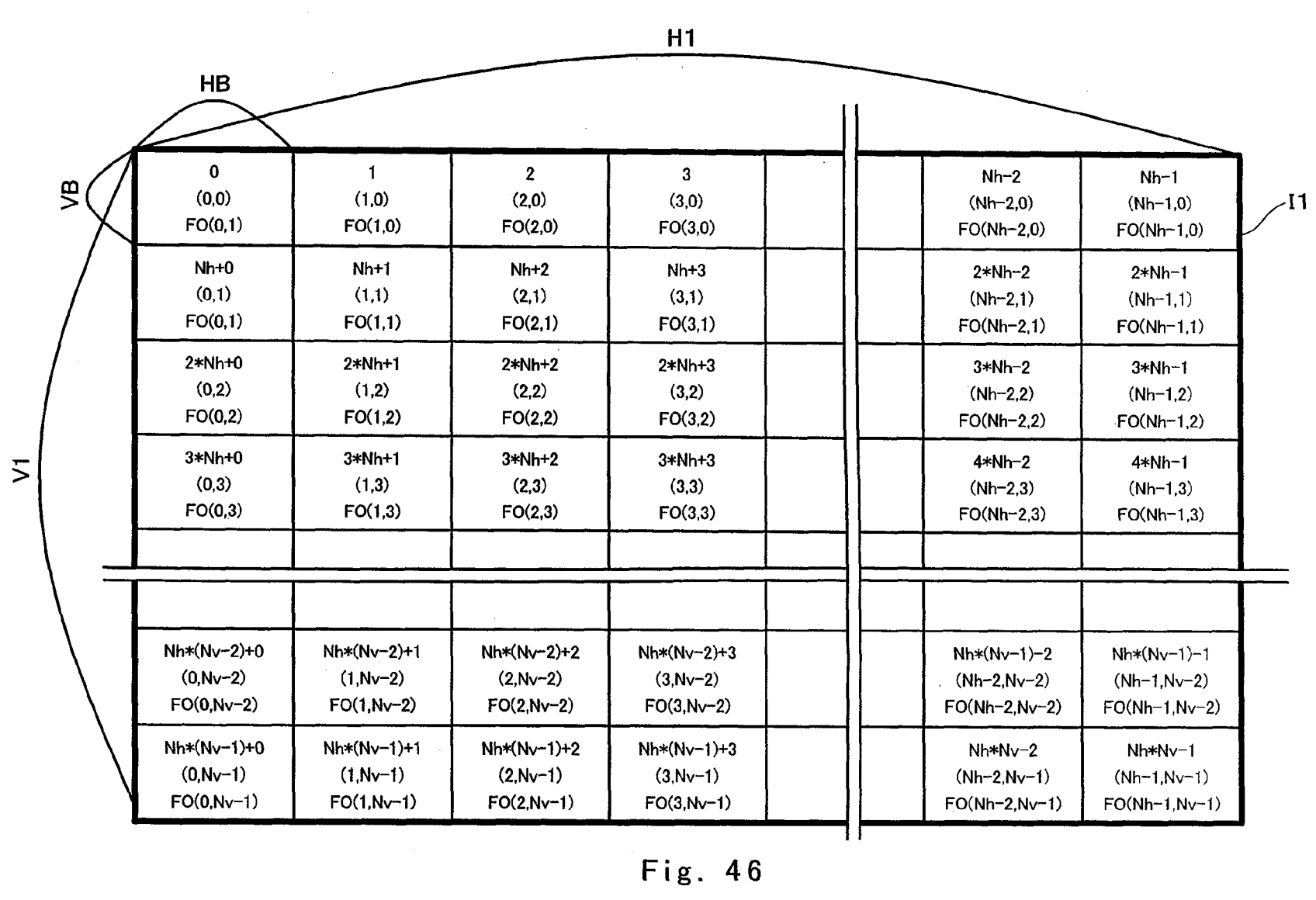
Figure 47:
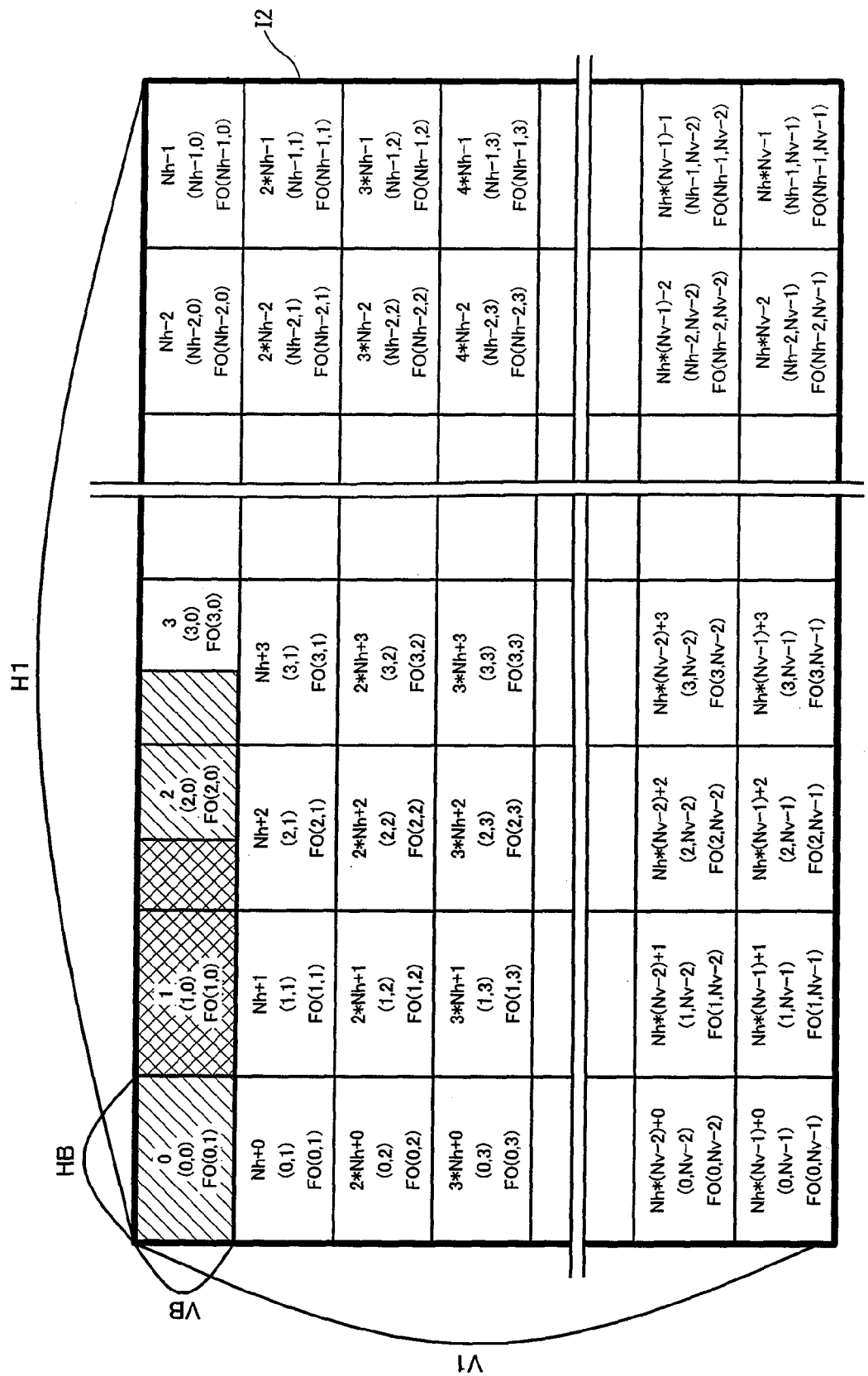
FIG. 47 is a diagram for explaining the divided blocks, calculation order, and transfer range flag of the second image pickup signal in the parallax calculation utilizing the first image pickup signal and the second image pickup signal in the image pickup apparatus according to Embodiment 3 of the present invention.

FIG. 46 is a diagram for explaining the divided blocks, calculation order, and transfer range flag of the first image pickup signal in the parallax calculation utilizing the first image pickup signal and the second image pickup signal in the image pickup apparatus according to Embodiment 3 of the present invention. FIG. 47 is a diagram for explaining the divided blocks, calculation order, and transfer range flag of the second image pickup signal in the parallax calculation utilizing the first image pickup signal and the second image pickup signal in the image pickup apparatus according to Embodiment 3 of the present invention. In FIG. 46, the first image pickup signal I1 is divided into rectangular blocks each having HB pixels in the x direction and VB pixels in the y direction. Adjacent rectangular blocks are arranged so as to be displaced from each other by HB pixels in the x direction or VB pixels in the y direction. The first image pickup signal I1 has Nh blocks in the x direction and Nv blocks in the y direction. Therefore, the blocks do not overlap each other in the x direction or the y direction. In FIG. 47, the second image pickup signal I2 is divided into rectangular blocks each having (HB+SB) pixels in the x direction and VB pixels in the y direction. Adjacent rectangular blocks are arranged so as to be displaced from each other by HB pixels in the x direction and VB pixels in the y direction. The second image pickup signal I2 has Nh blocks in the x direction and Nv blocks in the y direction. Therefore, adjacent blocks overlap each other in the x direction, but do not overlap in the y direction. Moreover, in FIG. 47, regarding a block which is located on a right side and cannot have (HB+SB) pixels in the x direction, an x-direction right end thereof is suitably omitted. Hereinafter, Embodiment 3 will explain an example in which HB is 32 and VB is 32.

In FIGS. 46 and 47, a number shown on the upper level of each block denotes the block index ib. Moreover, in FIGS. 46 and 47, the coordinates (ibx, iby) shown on a middle level of each block denotes that the block is an ibx-th block in x direction and an iby-th block in the y direction. Here, ibx is from 0 to Nh−1, and iby is from 0 to Vh−1. Moreover, in FIGS. 46 and 47, the transfer range flag FO(ibx, iby) is shown on the lower level of each block. The transfer range flag FO(ibx, iby) being 1 denotes that the operation is carried out. In this case, the image pickup signal of an appropriate block is transferred to carry out the parallax calculation. Meanwhile, the transfer range flag FO(ibx, iby) being 0 denotes that the operation stops. In this case, the image pickup signal of the appropriate block is not transferred, so that the parallax calculation is not carried out.

In Step S3020, all of the transfer range flags FO(ibx, iby) of respective blocks (ibx, iby) are initialized to 1, and the transfer range is initialized to the image pickup signals generated by all of the image pickup regions. Next, Step S3030 is executed.

In Step S3030, the image pickup signal is input. In accordance with the command of the system control portion 331, the image pickup element driving portion 332 outputs as needed a signal for carrying out electronic shutter or transfer. The image pickup signal of the image pickup region of the block (operating block) in which the transfer range flag FO(ibx, iby) is 1 is sequentially input, and sequentially transferred to the preprocessing portion 334. The preprocessing portion 334 carries out the intensity correction of the first image pickup signal I1 and the second image pickup signal I2, and sequentially transfers the signals to the input buffer 335. The first image pickup signal I1 is sequentially transferred to the first input buffer 335*a*, and the second image pickup signal I2 is sequentially transferred to the second input buffer 335*b*. The first image pickup signal I1 and the second image pickup signal I2 are obtained by the subject images formed by the first lens portion 313*a* and the second lens portion 313*b*, respectively. As shown by Formula 19 below, the first image pickup signal I1 is corrected by the first intensity correction coefficient ks1. As shown by Formula 20 below, the second image pickup signal I2 is corrected by the second intensity correction coefficient ks2.

$$I1(x, y) = ks1(x, y) * I1(x,y) \qquad \text{Formula 19}$$

$$I2(x, y) = ks2(x, y) * I2(x,y) \qquad \text{Formula 20}$$

Note that the first intensity correction coefficient ks1(x, y) and the second intensity correction coefficient ks2(x, y) denote intensity correction coefficients of the first image pickup signal I1 and the second image pickup signal I2, respectively, at coordinates (x, y), are determined by shooting a specific chart in a checking step for example, and are stored in an EEPROM or a flash memory. Note that the apparatus may not have the coefficients of respective pixels but have representative points, and the first intensity correction coefficient ks1(x, y) and the second intensity correction coefficient ks2(x, y) may be obtained by linear interpolation using the representative points. Moreover, an approximation formula may be formulated, the apparatus may have only coefficients of the approximation formula, and the first intensity correction coefficient ks1(x, y) and the second intensity correction coefficient ks2(x, y) of respective coordinates may be determined based on the coefficients. Moreover, a coordinate transformation may be suitably carried out to correct, for example, displacement of the optical axis of the lens. Next, Step S3040 is executed.

In Step S3040, the first image pickup signal I1 stored in the first input buffer 335*a* is transferred to the first output buffer 337*a*, and the first output buffer 337*a* stores the first image pickup signal I1 as the image data. In the block (operating block) in which the transfer range flag FO(ibx, iby) is 1, the image pickup signal I1 is transferred. In the block (stopped block) in which the transfer range flag FO(ibx, iby) is 0, for example, all appropriate image data is set to black since there is no image pickup signal I1 to be transferred. Next, Step S3100 is executed.

In Step S3100, the distance data is generated and is sequentially transferred to the second output buffer 337*b*. Moreover, the transfer range is determined, and the transfer range flag FO(ibx, iby) is set. Details of this operation will be explained later. Next, Step S3910 is executed.

In Step S3910, data is output to outside. The input/output portion 338 outputs the image data of the first output buffer 337*a* and the distance data of the second output buffer 337*b* to the host CPU (not shown) and the external display apparatus (not shown). Note that the transfer range flag FO(ibx, iby) may be suitably output. Next, S3920 is executed.

In Step S3920, whether or not the operation is terminated is determined. For example, the system control portion 331 communicates with the host CPU (not shown) via the input/output portion 338 to request a command indicating whether or not to terminate the operation. When the host CPU commands the termination, the operation is terminated, and next, Step S3930 is executed. On the other hand, when the host CPU does not command the termination, the operation continues, and next, Step S3030 is executed. That is, as long as the host CPU does not command the termination, the loop of Steps S3030, S3040, S3100, and S3910 is continuously executed.

In Step S3930, the operation is terminated.

Figure 48:
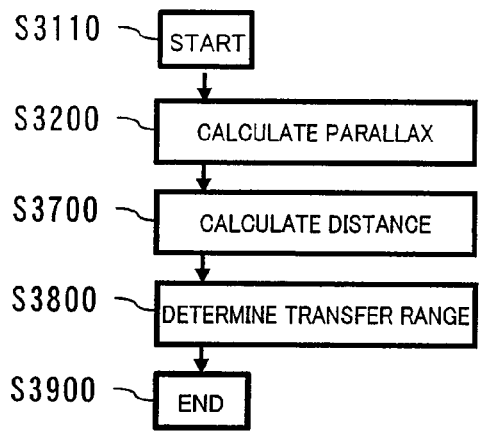
FIG. 48 is a flow chart showing the operation of the calculating portion of the image pickup apparatus according to Embodiment 3 of the present invention.

Next, details of the operation of Step S3100 will be explained. FIG. 48 is a flow chart showing the operation of the calculating portion of the image pickup apparatus according to Embodiment 3 of the present invention. The flow chart of FIG. 48 shows the details of the operation of Step S3100. In the calculation of Step S3100, first, Step S3110 is executed.

In Step S3110, the calculating operation is started. Next, Step S3200 is executed.

Figure 49:
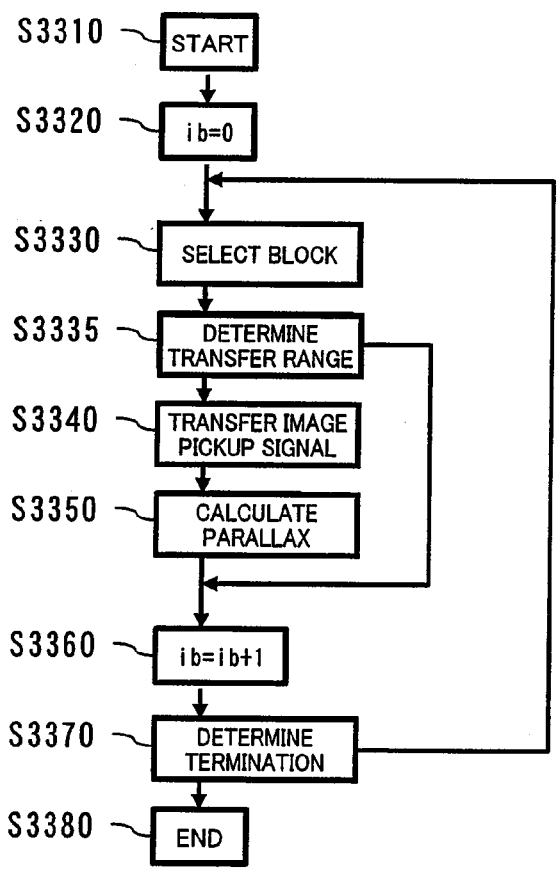
FIG. 49 is a flow chart showing the operation of the parallax calculation of the image pickup apparatus according to Embodiment 3 of the present invention.

In Step S3200, the parallax calculation is executed. FIG. 49 is a flow chart showing the operation of the parallax calculation of the image pickup apparatus according to Embodiment 3 of the present invention. The flow chart of FIG. 49 shows details of the operation of Step S3200. In Step S3200, the parallax calculation utilizing the first image pickup signal and the second image pickup signal is carried out. In the calculation of Step S3200, first, Step S3310 is executed.

In Step S3310, the parallax calculation is started. Next, Step S3320 is executed.

In Step S3320, the block index ib is initialized to 0. Next, Step S3330 is executed.

In Step S3330, the block is selected. In FIGS. 46 and 47, the block (block shown by the coordinates (ibx, iby)) shown by the block index ib is selected. Next, Step S3335 is executed.

In Step S3335, whether or not the selected block is the transfer range is determined, and the process branches off. When the transfer range flag FO(ibx, iby) is 1 (operating block) in the block (block shown by the coordinates (ibx, iby)) shown by the block index ib, next, Step S3340 is executed. Meanwhile, when the transfer range flag FO(ibx, iby) is 0 (stopped block) in the block (block shown by the coordinates (ibx, iby)) shown by the block index ib, next, Step S3360 is executed. As above, in the block in which the transfer range flag FO(ibx, iby) is 1 (operating block), the image pickup signal is transferred in Step S3340 described below, the parallax calculation is carried out in Step S3350 described below, and Step S3360 described below is executed. Meanwhile, in the block in which the transfer range flag FO(ibx, iby) is 0 (stopped block), the image pickup signal is not transferred, the parallax calculation is not carried out, and Step S3360 described below is executed.

In Step S3340, the image pickup signal is transferred. Step S3340 is similar to Step S1340 of Embodiment 1, so that an explanation thereof is omitted. Note that regarding the second image pickup signal, a portion which does not have to be transferred is only a portion (that is, a portion which has already been transferred) at which the blocks overlap and in which the transfer range flag FO(ibx, iby) is 1 (operating block). Next, Step S3350 is executed.

In Step S3350, the parallax calculation is executed. Step S3350 is similar to Step S1350 of Embodiment 1, so that an explanation thereof is omitted. Note that the calculation of the reliability is not required, and the parallax shown by $\Delta(1, 2)(ibx, iby)$ in Embodiment 1 is set as the parallax value $\Delta(ibx, iby)$ of the block (block shown by the coordinates (ibx, iby)) shown by the block index ib. Next, Step S3360 is executed.

In Step S3360, 1 is added to the block index ib. Next, Step S3370 is executed.

In Step S3370, whether or not the parallax calculation is terminated is determined. When the block index ib is less than Nh*Nv, next, Step S3330 is executed to calculate the parallax of the next block. Meanwhile, when the block index ib is Nh*Nv or more, it is determined that the parallaxes of all the blocks are calculated, and next, Step S3380 is executed.

In Step S3380, the parallax calculation is terminated, and the process returns to the upper routine. Thus, the parallax value $\Delta(ibx, iby)$ of the block shown by the block index ib and having 32*32 pixels is obtained by resolution of 32*32 pixels. Here, (ibx, iby) denote the coordinates shown on the middle level of each block in FIG. 46 (ibx is from 0 to Nh−1, and iby is from 0 to Nv−1). Next, Step S3700 of FIG. 48 is executed.

In Step S3700, the distance calculating portion 343 carries out the distance calculation, and sequentially transfers the result of the distance calculation to the second output buffer 337b as the distance data. Step S3700 is similar to Step S1700 of Embodiment 1, so that an explanation thereof is omitted. Note that the distance calculation is carried out only for the block in which the transfer range flag FO(ibx, iby) is 1 (operating block). By assigning a negative number to the block in which the transfer range flag FO(ibx, iby) is 0 (stopped block), the host CPU can determine without transferring the information of the transfer range flag FO(ibx, iby) to the host CPU that the parallax calculation and distance calculation are not carried out for the block in which the negative number is assigned among the blocks of the distance data A(ibx, iby) transferred. Therefore, communication load can be reduced. Next, Step S3800 is executed.

Figure 50:
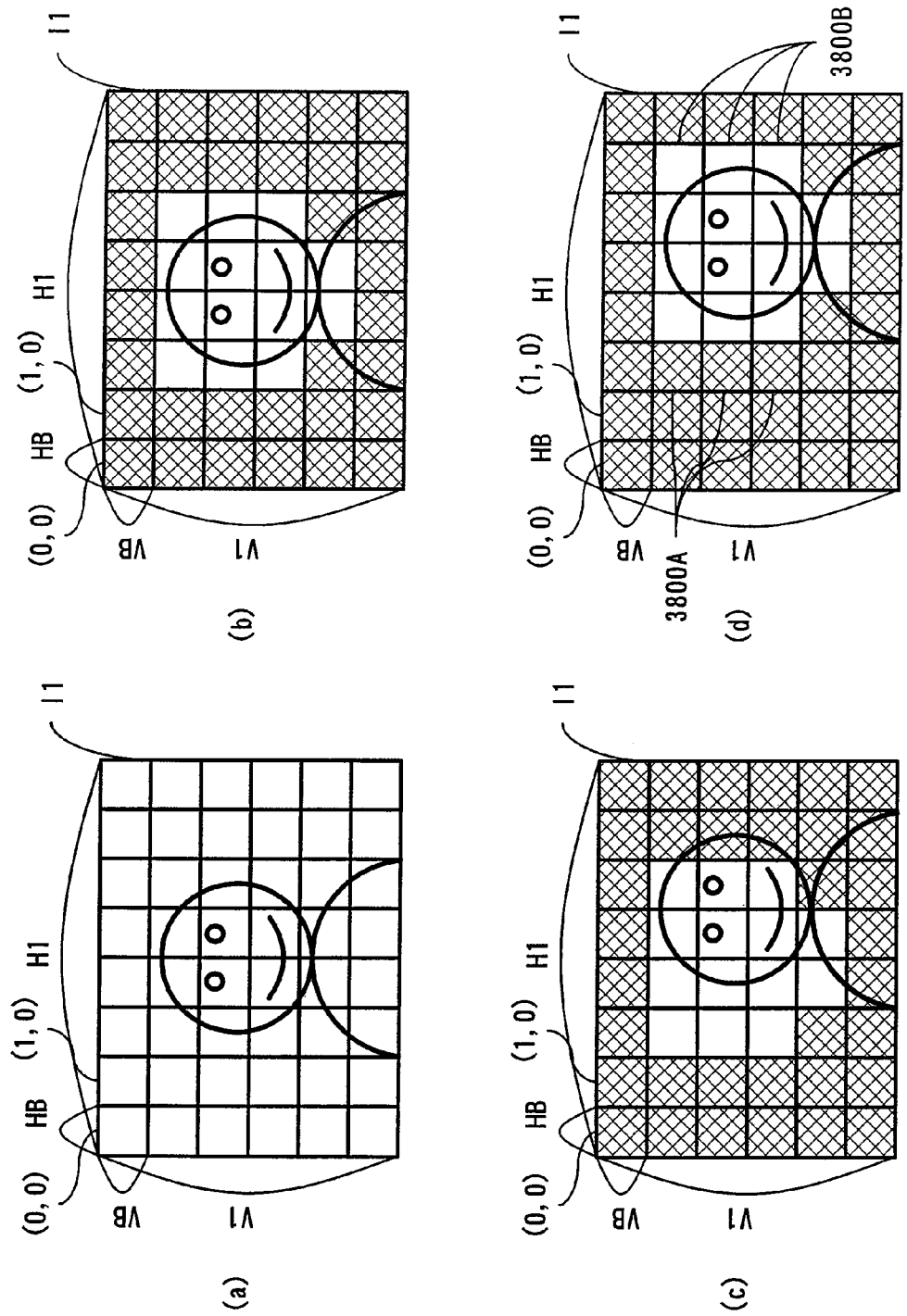
FIG. 50 are diagrams for explaining a transfer range of the image pickup apparatus according to Embodiment 3 of the present invention.

In Step S3800, the transfer range determining portion 344 determines the transfer range, and sets the transfer range flag FO(ibx, iby) of each block (ibx, iby). FIG. 50 are diagrams for explaining the transfer range of the image pickup apparatus according to Embodiment 3 of the present invention. For simplicity, FIG. 50 show a small number of blocks. However, the number of blocks is not limited to that in FIG. 50. Among the blocks of an image formed by the first image pickup signal I1, the transfer range determining portion 344 sets the FO(ibx, iby) of the block containing a face of a person to 1 (operating block) and the FO(ibx, iby) of the block not containing the face of the person to 0 (stopped block). In FIG. 50, white blocks, such as the blocks shown by the coordinates (0, 0) and the coordinates (1, 0) in FIG. 50(a), show that the transfer range flag FO(ibx, iby) is 1 (operating block), and hatched blocks, such as the blocks shown by the coordinates (0, 0) and the coordinates (1, 0) in FIGS. 50(b), 50(c), and 50(d), show that the transfer range flag FO(ibx, iby) is 0 (stopped block).

For example, regarding the image pickup signal I1 generated at first after the image pickup apparatus 301 that is the camera module has started up, since the transfer range flags FO(ibx, iby) of all the blocks are initialized to 1 in Step 3020, the entire range of the image pickup region corresponding to the first lens portion 313a is transferred as shown in FIG. 50(a). The transfer range determining portion 344 detects the face of the person, and changes the transfer range flags FO(ibx, iby) of FIG. 50(a) such that as shown in FIG. 50(b), the transfer range flags FO(ibx, iby) of the blocks containing the face are maintained to 1 (white block), and transfer range flags FO(ibx, iby) of the blocks not containing the face are changed to 0 (hatched block).

Note that a known method for detecting the face of the person may be utilized. For example, in a case where the image pickup apparatus of the present embodiment is placed in front of the person, a region which has an oval-shaped edge (edge corresponding to a profile of the face) and two black dots (two dots corresponding to eyes) in an image may be detected as the face of the person.

Moreover, when the face of the person moves in the case of the distribution of the transfer range flags FO(ibx, iby) shown in FIG. 50(b), a part of the face moves to the blocks in which the transfer ranges FO(ibx, iby) thereof are 0 (stopped block) as shown in FIG. 50(c). In this case, the transfer range flag FO(ibx, iby) of the block, such as the block shown by 3800A in FIG. 50(d), whose transfer range flag FO(ibx, iby) is 1 (white block; operating block) in FIG. 50(b) since the block contains the face is changed to 0 (hatched block) since the block does not contain the face any more in FIG. 50(c).

Further, the transfer range flag FO(ibx, iby) of the block, such as the block shown by 3800B in FIG. 50(*d*), whose transfer range flag FO(ibx, iby) is 0 (hatched block; stopped block) in FIG. 50(*b*) since the block does not contain the face is changed to 1 (white block; operating block) since the block contains the face in FIG. 50(*c*). Next, Step S3900 is executed.

In Step S3900, the calculation is terminated, and the process returns to the upper routine. Next, Step S3910 is executed.

The following effects are obtained by configuring and operating the image pickup apparatus of the present embodiment as above.

In a case where the transfer range is always the image pickup signals generated by all of the image pickup regions, the transfer time for transferring all the pixels is always required, so that the increase in speed is limited due to this transfer time. In accordance with the image pickup apparatus according to Embodiment 3 of the present invention, as shown in FIGS. 50(*b*) and 50(*d*), the transfer range flag FO(ibx, iby) of the block containing the face of the person is set to 1, and the image pickup signal of only the block containing the face of the person is transferred. In a case where the image pickup apparatus is utilized as an in-vehicle apparatus to monitor a person in the vehicle, the subject to be monitored is the face of the person, so that the distance to the face needs to be measured. Here, by limiting the transfer to only the region of the face, the amount of transfer is reduced as compared to a case where all the pixels are transferred. Thus, the image pickup apparatus capable of carrying out the high-speed parallax calculation and distance calculation is realized. For example, in FIGS. 50(*b*) and 50(*d*), the number of all blocks is 48, but the number of blocks whose image pickup signals are transferred can be reduced to 14.

In the image pickup apparatus of Embodiment 3, as described above, the image pickup signal (image pickup signal corresponding to specific blocks among all blocks) generated by a part of the image pickup regions is set to the transfer range. Then, the transfer range is suitably changed. In other words, a plurality of operating modes are suitably switched.

Moreover, in the image pickup apparatus of Embodiment 3, all image regions are set as the transfer range in an initial state, but only the image regions in the vicinity of the center may be set as the transfer range. Since the face of the person is usually located at the center of the image in the case of attaching the image pickup apparatus at an appropriate position, only the image regions in the vicinity of the center may be transferred as the initial state, and the transfer range may be suitably changed. With this, since the transfer range can always be set to the image pickup signals generated by a part of the image pickup regions, the transfer time can always be shortened, so that the parallax calculation and distance calculation can be carried out at high speed.

Moreover, in the image pickup apparatus of Embodiment 3, the size of the first calculating buffer is 32*32 pixels (32 pixels in the horizontal direction and 32 pixels in the vertical direction). However, the present embodiment is not limited to this. For example, the size of the first calculating buffer may be 4*4 pixels, 8*8 pixels, or 16*16 pixels. Moreover, the size of the first calculating buffer may be suitably changed. Moreover, the parallaxes of a plurality of blocks of different sizes may be calculated, and the parallax may be selected. Further, instead of the rectangular block, the block division may be carried out by extracting an edge or the like. Moreover, the present embodiment is not limited to the calculation of the parallax of the block, but the calculation of the parallax of the line segment that is the edge may be carried out.

Moreover, in the image pickup apparatus of Embodiment 3, the first image pickup signal I1 is transferred to the first output buffer 337*a* and output from the input/output portion 338. However, the second image pickup signal I2 may be output. Moreover, a plurality of image pickup signals may be output.

Moreover, in the image pickup apparatus of Embodiment 3, only the blocks containing the face of the person are transferred. However, the blocks to be transferred may be further limited. For example, only the blocks containing eyes of the face may be transferred.

Figure 51:
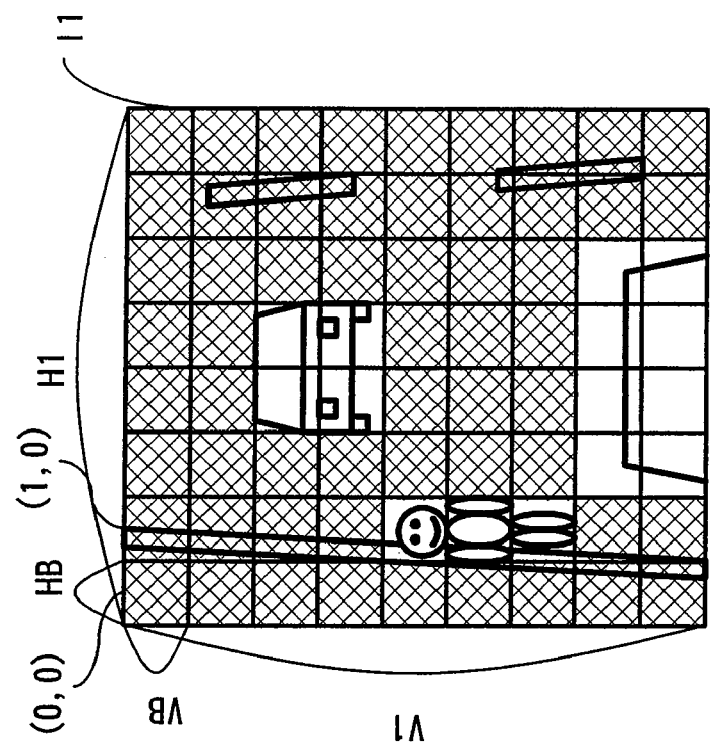
FIG. 51 are diagrams for explaining the transfer range of a modification of the image pickup apparatus according to Embodiment 3 of the present invention.
Figure 51:
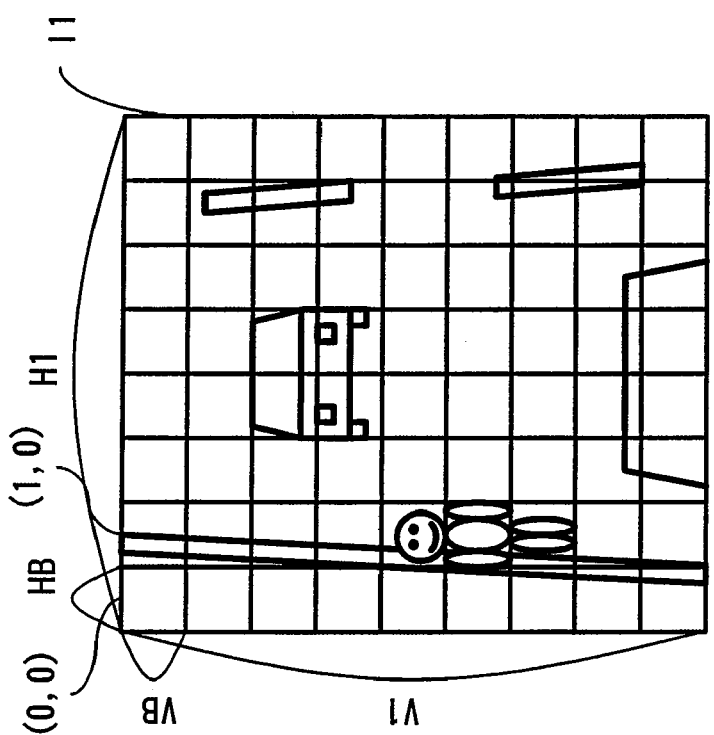

Moreover, in the image pickup apparatus of Embodiment 3, only the blocks containing the face of the person are transferred. However, for example, among the image pickup signals, only the image pickup signals corresponding to the regions except for the regions corresponding to a road surface may be transferred. FIG. 51 are diagrams for explaining the transfer range of a modification of the image pickup apparatus according to Embodiment 3 of the present invention. For example, the image pickup apparatus 301 that is the camera module is started up, and in Step S3020, the transfer range flags FO(ibx, iby) of all the blocks are initialized to 1. Therefore, as shown in FIG. 51(*a*), as the image pickup signal I1 generated at first, the image pickup signals generated by all of the image pickup regions corresponding to the first lens portion 313*a* are transferred. The transfer range determining portion 344 detects a portion which is not the road surface, maintains the transfer range flags FO(ibx, iby) of the blocks containing the subjects (a vehicle in front, a person, and one's own vehicle) which are not the road surface to 1 (white block; operating block), and changes the output range flags FO(ibx, iby) of the blocks containing the road surface to 0 (hatched block; stopped block), as shown in FIG. 51(*b*).

Note that a known method for detecting the region corresponding to the road surface may be utilized. For example, the detection can be carried out as follows. In a case where the image pickup apparatus of the present invention is placed at a front portion of the vehicle such that the optical axis of the lens thereof is adjusted to be in parallel with the road surface to measure the distance in front, a subject distance A1 is shown by Formula 21 below. In Formula 21, θ denotes an angle between the optical axis of the lens and the road surface, and Z denotes a height of the image pickup apparatus from the road surface. Then, In a case where the distance A(ibx, iby) calculated from the parallax values Δ(ibx, iby) of respective blocks is substantially equal to the distance A1 calculated by Formula 21, it is determined that the subject image taken by the block is the road surface.

$$A1 = Z/\tan\theta \qquad \text{Formula 21}$$

In a case where the transfer range is always the image pickup signals generated by all of the image pickup regions, the transfer time for transferring all the pixels is always required, so that the increase in speed is limited due to this transfer time. In accordance with the modification of the image pickup apparatus according to Embodiment 3 of the present invention, as shown in FIG. 51(*b*), the transfer range flag FO(ibx, iby) of the block containing the subject that is not the road surface is set to 1, and the image pickup signal of only the block containing the subject that is not the road surface is transferred. With this, in a case where the image pickup apparatus is utilized as an in-vehicle apparatus to monitor the front of the vehicle, the subjects to be monitored are, for example a vehicle in front, a person, and the other structures except for the road surface, and the distances thereto need to be measured. Here, by limiting the transfer to only the region other than the road surface, the mount of transfer is reduced as compared to a case where all the pixels are transferred. Thus, the image pickup apparatus capable of carrying out the high-speed parallax calculation and distance calculation is realized. For example, in FIG. 51(b), the number of all blocks is 72, but the number of blocks whose image pickup signals are transferred can be reduced to 15.

Figure 52:
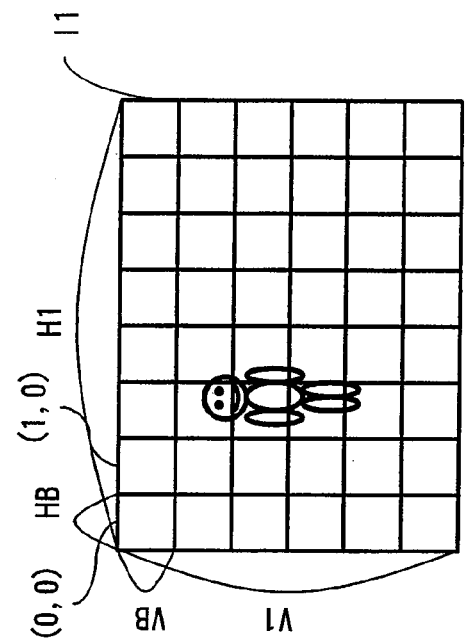
FIG. 52 are diagrams for explaining the transfer range of a modification of the image pickup apparatus according to Embodiment 3 of the present invention.
Figure 52:
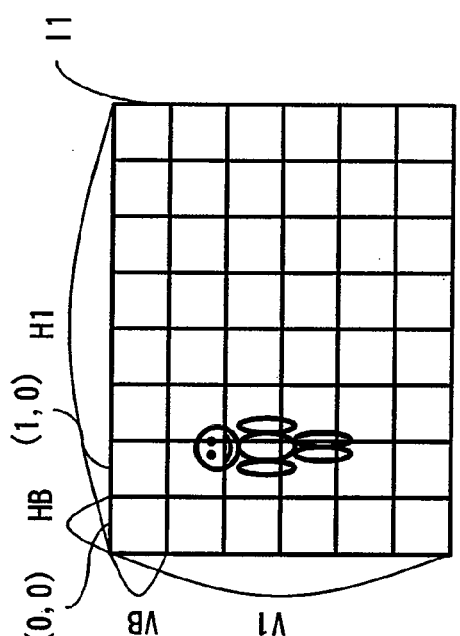
Figure 52:
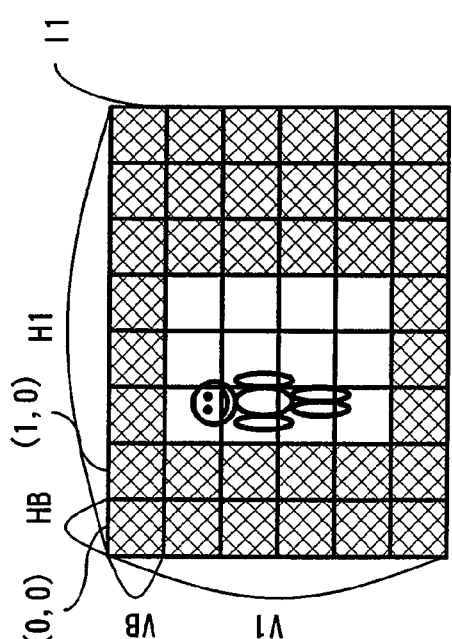
Figure 53:
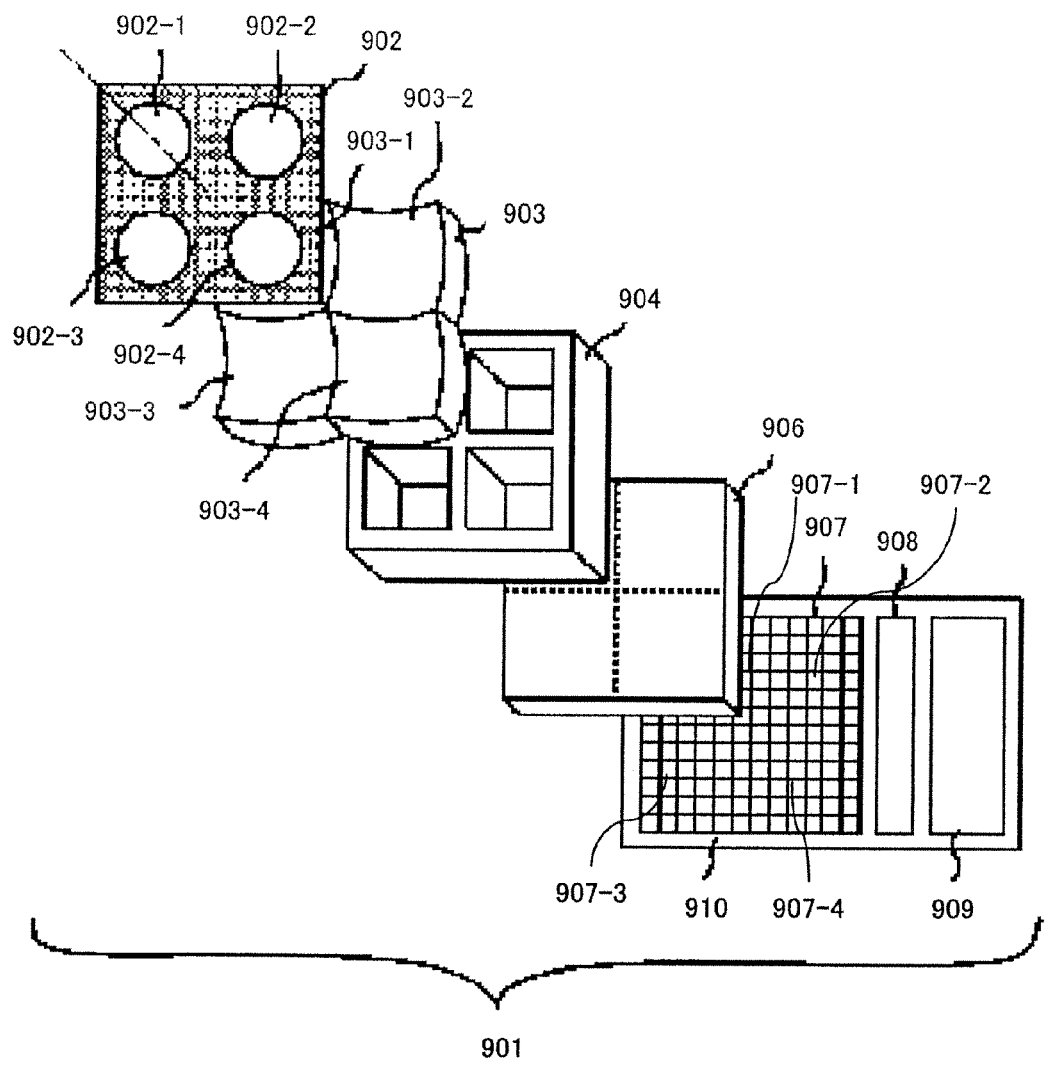
FIG. 53 is an exploded perspective view of the image pickup apparatus of Patent Document 1 of the prior art.

Moreover, in the image pickup apparatus of Embodiment 3, only the block containing the face of the person is transferred. However, among the image pickup signals, only the image pickup signal corresponding to the region containing the moving subject may be transferred. FIG. 52 are diagrams for explaining the transfer range of a modification of the image pickup apparatus according to Embodiment 3 of the present invention. FIGS. 52(a) and 52(b) are two consecutive frame images of a moving image. The person located in the second and third blocks from the right in FIG. 52(a) is located in the third and fourth blocks from the right in FIG. 52(b) that is the next frame of FIG. 52(a). In this case, as shown in FIG. 52(c), the blocks to be transferred in the next frame of FIG. 52(b) are the blocks (third and fourth blocks from the right) in which the moving person is located and the blocks (fifth blocks from the right) to which the person may move if the same movement of the person continues. To be specific, in the next frame of FIG. 52(b), the transfer range flags FO(ibx, iby) of the blocks (third and fourth blocks from the right) in which the moving person is located and the transfer range flags FO(ibx, iby) of the blocks (fifth blocks from the right) to which the person may move if the same movement of the person continues are set to 1 (white block; operating block), and the transfer range flags FO(ibx, iby) of the other blocks are set to 0 (hatched block; stopped block) (see FIG. 52(c)).

Here, the block having a large sum DtDiff (Formula 22 below) of absolute differences of two consecutive frame images of the first image pickup signal I1 may be set as the block containing the moving subject.

$$DtDiff = \Sigma\Sigma |I1(x, y)(t0) - I1(x, y)(t0+dt)| \qquad \text{Formula 22}$$

Note that I1(x, y)(t0) denotes the first image pickup signal I1 at a time t0 at the coordinates (x, y), and I1(x, y)(t0+dt) denotes the first image pickup signal I1 at a time t0+dt at the coordinates (x, y).

In a case where the transfer range is always the image pickup signals generated by all of the image pickup regions, the transfer time for transferring all the pixels is always required, so that the increase in speed is limited due to this transfer time. In accordance with the modification of the image pickup apparatus according to Embodiment 3 of the present invention, as shown in FIG. 52(c), the transfer range flag FO(ibx, iby) of the block containing the moving subject (A person is shown in FIG. 52.) is set to 1. In a case where the image pickup apparatus is utilized as an in-vehicle apparatus to monitor the front of the vehicle, the subjects to be monitored are moving subjects, such as a vehicle in front, a person, and an animal, and the distances thereto need to be measured. Here, by limiting the transfer to only the region of the moving subject, the amount of transfer is reduced as compared to a case where all the pixels are transferred. Thus, the image pickup apparatus capable of carrying out the high-speed parallax calculation and distance calculation is realized. For example, in FIG. 52(c), the number of all blocks is 48, and the number of blocks whose image pickup signals are transferred can be reduced to 12.

It is preferable that the transfer range be determined based on the speed of movement of the subject. In a case where the transfer range is always set to a certain region around the subject regardless of the speed of movement of the subject, when the movement of the subject is fast, the subject may not be contained in the region, so that the accuracy of the parallax may deteriorate. As shown in FIG. 52(c), the movement of the subject is predicted, and the region to which the subject may move in the next frame is also transferred. That is, the transfer range determining portion 344 determines the transfer range based on the speed of movement of the subject. As above, since the size of the transfer range is appropriately determined in accordance with the speed of movement of the subject, the subject is contained in the transfer range. Therefore, the image pickup apparatus capable of carrying out the highly-accurate parallax calculation and distance calculation is realized.

Here, the speed of movement of the subject is detected by the transfer range determining portion 344 by, for example, comparing the images of respective frames to each other.

It is preferable that the transfer range be made large when the movement of the subject is fast. To be specific, when the movement of the subject is fast, the range to which the subject may move in the next frame is made large, so that the subject is always contained in the transfer region. Thus, the image pickup apparatus capable of carrying out the highly-accurate parallax calculation and distance calculation is realized.

Moreover, it is preferable that the number of pixels contained in the transfer range, i.e., the number of blocks contained in the transfer range be substantially maintained among a plurality of frames. For example, in a case where the number of blocks in the transfer range is set to 12 as shown in FIG. 52(c), the image pickup apparatus may operate such that the transfer range of 12 blocks is maintained among a plurality of frames.

In a case where the transfer range is determined based only on the speed of movement of the subject, when the subject which moves fast is contained in many of the regions, the amount of transfer may increase. Here, when the subject which moves fast is contained in many of the regions, the number of pixels in the transfer range is set to be constant, and this constant number of pixels is maintained among a plurality of frames. For this purpose, for example, a process of setting a threshold for determining whether or not the movement of the subject is fast, to be large to narrow down the subject is carried out. With this, the number of pixels in the transfer range is maintained constant. Therefore, the amount of transfer is prevented from increasing. Thus, the image pickup apparatus capable of carrying out the high-speed parallax calculation and distance calculation is realized.

As above, it is preferable that the number of pixels contained in the transfer range be maintained constant among a plurality of frames. However, the number of pixels does not have to be the same among a plurality of frames and may increase or decrease in some degree in accordance with, for example, the speed of the transfer.

The foregoing has explained a few embodiments of the present invention, and these embodiments are just exemplification. Various modifications can be made as below when carrying out the present invention.

In the image pickup apparatuses of Embodiments 1 to 3, the SLSIs 125, 225, and 325 determine the transfer range flag FO. However, a member other than the SLSI may determine the transfer range flag FO. Moreover, the SLSI may be functionally divided into a plurality of LSIs, and the LSIs may be mounted on the substrate.

Moreover, in the image pickup apparatuses of Embodiments 1 to 3, the calculated parallax is utilized as it is. However, the calculated parallax may be suitably limited. In a case where the subject distance A is shorter than a certain value, an image may become unclear depending on the characteristic of the lens. Therefore, by setting this certain value as a minimum value of the subject distance A, a maximum value of the parallax can be set. The parallax which is larger than this value may be ignored as an error. In this case, the second smallest parallax evaluated value may be adopted as the parallax. Moreover, in a case where there are two distinct extreme values as the parallax evaluated values, the larger parallax may be adopted. In this case, two extreme values are generated since the appropriate block contains the subject and a background, and the distance to the subject and the distance to the background are different from each other. The larger parallax which largely influences obstruction detection may be adopted.

In the image pickup apparatus of Embodiment 1, the first color filter 124a and the second color filter 124b mainly transmit the infrared light, and the third color filter 124c and the fourth color filter 124d mainly transmit the green light. In the image pickup apparatus of Embodiment 2, the second color filter 224b and the third color filter 224c mainly transmit the infrared light, and the first color filter 224a and the fourth color filter 224d mainly transmit the green light. However, these are just exemplification, and the present invention is not limited to these. Therefore, the color filters may transmit light of different wavelength regions, respectively. For example, red light, blue light, far infrared light, near-ultraviolet light, and the like may be transmitted. Moreover, one of sets of color filters may be omitted. Moreover, specific color filters may be disposed as one set of color filters, and Bayer arrangement filters as another set of filters may be disposed on the image pickup element. Moreover, the characteristics of each set of color filters may be the same as each other, but F values and focal lengths of each set of color filters may be different from each other.

In the case of the image pickup apparatus of the present invention, since the parallax calculation needs to be carried out, the image pickup signals generated by at least two of four image pickup regions are set as the transfer range in each operating mode. As above, although the transfer range needs to be the image pickup signals generated by at least two image pickup regions, any image pickup regions may be used. Therefore, in the image pickup apparatus of Embodiment 1, all of the image pickup regions and an upper half (regions corresponding to the first lens portion 113a and the second lens portion 113b) of the image pickup regions are switched. However, all of the image pickup regions and a lower half (regions corresponding to the third lens portion 113c and the fourth lens portion 113d) of the image pickup regions may be switched. Moreover, the upper half (regions corresponding to the first lens portion 113a and the second lens portion 113b) and the lower half (regions corresponding to the third lens portion 113c and the fourth lens portion 113d) may be switched.

Moreover, in the image pickup apparatus of Embodiment 2, all of the image pickup regions and a diagonal region (regions corresponding to the second lens portion 113b and the third lens portion 113c) extending in the upper right direction are switched. However, all the image pickup regions and a diagonal region (regions corresponding to the first lens portion 113a and the fourth lens portion 113d) extending in the lower right direction may be switched. Moreover, the diagonal region (regions corresponding to the second lens portion 113b and the third lens portion 113c) extending in the upper right direction and the diagonal region (regions corresponding to the first lens portion 113a and the fourth lens portion 113d) extending in the lower right direction may be switched.

Moreover, in Embodiments 1 to 3, the sum of absolute differences (SAD) shown by Formula 6 is used as the parallax evaluated value R(k). However, the present invention is not limited to this. Utilized as the parallax evaluated value R(k) may be for example: a sum of square values of differences; a sum of square values of differences between values obtained by subtracting an average in the blocks from the first image pickup signal I1 and values obtained by subtracting the average in the blocks from the second image pickup signal I2; a sum of square values of differences between values obtained by subtracting an average in the blocks from the first image pickup signal I1 and values obtained by subtracting the average in the blocks from the second image pickup signal I2; or a value obtained by dividing the sum of square values of differences between the values obtained by subtracting the average in the blocks from the first image pickup signal I1 and the values obtained by subtracting the average in the blocks from the second image pickup signal I2, by a square root of a sum of square values of the values obtained by subtracting the average in the blocks from the first image pickup signal I1, and further dividing by a square root of a sum of square values of the values obtained by subtracting the average in the blocks from the second image pickup signal I2.

In Embodiments 1 to 3, each of the divided blocks has a rectangular shape. However, the present invention is not limited to this. For example, an edge may be detected, and each of divided blocks may have a non-rectangular shape based on the edge. Moreover, the parallax of the block may not be calculated, but the edge may be divided into a plurality of line segments, and the parallax of the line segment may be calculated. Moreover, the parallax of a certain block may be evaluated, and the blocks may be divided or connected.

From the foregoing explanation, many modifications and other embodiments of the present invention are obvious to one skilled in the art. Therefore, the foregoing explanation should be interpreted only as an example, and is provided for the purpose of teaching the best mode for carrying out the present invention to one skilled in the art. The structures and/or functional details may be substantially modified within the spirit of the present invention.

INDUSTRIAL APPLICABILITY

The image pickup apparatus and the semiconductor circuit element according to the present invention are the image pickup apparatus and the semiconductor circuit element which can carry out the high-speed parallax calculation, so that they are useful in a mobile phone having a camera function, a digital still camera, an in-vehicle camera, a monitoring camera, a 3-D measuring device, a 3-D image input camera, and the like.

The invention claimed is:
1. An image pickup apparatus comprising:
a plurality of lens portions, each having at least one lens;
a plurality of image pickup regions which are provided to correspond to said plurality of lens portions, respectively, and each of which has a light receiving surface substantially perpendicular to a direction of an optical axis of a corresponding lens portion;
an image pickup signal input portion which receives image pickup signals generated by the image pickup regions;
a transfer range determining portion which determines a transfer range of the image pickup signals transferred from the image pickup regions to said image pickup signal input portion;
an image pickup region driving portion which drives the image pickup regions such that the image pickup signals corresponding to the transfer range determined by said transfer range determining portion are transferred to said image pickup signal input portion; and a parallax calculating portion which calculates a parallax based on the image pickup signals transferred said image pickup signal input portion, wherein:

said transfer range determining portion is configured to be able to switch between a first operating mode in which the image pickup signals generated by at least two image pickup regions of said plurality of image pickup regions are determined as the transfer range and a second operating mode in which the image pickup signals different from those of the first operating mode are determined as the transfer range, and said transfer range determining portion is configured to be able to switch between the first operating mode in which the image pickup signals generated by all of the image pickup regions are determined as the transfer range and the second operating mode in which the image pickup signals generated by a substantially half of the image pickup regions are determined as the transfer range.

2. The image pickup apparatus according to claim 1, wherein the substantially half of the image pickup regions is a substantially half, which is earlier in order of transfer, of the image pickup regions.

3. The image pickup apparatus according to claim 1, wherein:

said plurality of image pickup regions are four image pickup regions arranged in two rows and two columns; and the substantially half of the image pickup regions is two image pickup regions, which are arranged diagonally, of the four image pickup regions.

4. An image pickup apparatus comprising:

a plurality of lens portions, each having at least one lens;

a plurality of image pickup regions which are provided to correspond to said plurality of lens portions, respectively, and each of which has a light receiving surface substantially perpendicular to a direction of an optical axis of a corresponding lens portion;

an image pickup signal input portion which receives image pickup signals generated by the image pickup regions;

a transfer range determining portion which determines a transfer range of the image pickup signals transferred from the image pickup regions to said image pickup signal input portion;

an image pickup region driving portion which drives the image pickup regions such that the image pickup signals corresponding to the transfer range determined by said transfer range determining portion are transferred to said image pickup signal input portion; and a parallax calculating portion which calculates a parallax based on the image pickup signals transferred said image pickup signal input portion, wherein:

said transfer range determining portion is configured to be able to switch between a first operating mode in which the image pickup signals generated by at least two image pickup regions of said plurality of image pickup regions are determined as the transfer range and a second operating mode in which the image pickup signals different from those of the first operating mode are determined as the transfer range, the image pickup regions are divided into a plurality of fields to be interlaced, and said transfer range determining portion is configured to be able to switch between the first operating mode in which the image pickup signals generated by all of the image pickup regions are determined as the transfer range and the second operating mode in which the image pickup signals generated by one field of the image pickup regions are determined as the transfer range.

5. The image pickup apparatus according to claim 4, wherein said transfer range determining portion is configured to switch between the first operating mode and the second operating mode based on information about a subject.

6. The image pickup apparatus according to claim 5, wherein said transfer range determining portion is configured to switch from the first operating mode to the second operating mode when it determines that high speed is required to calculate the parallax.

7. The image pickup apparatus according to claim 5, wherein said transfer range determining portion is configured to switch from the second operating mode to the first operating mode when it determines that high accuracy is required to calculate the parallax.

8. The image pickup apparatus according claim 4, further comprising a distance calculating portion which calculates a distance to the subject based on the parallax obtained by said parallax calculating portion.

9. An image pickup apparatus comprising:

a plurality of lens portions, each having at least one lens;

a plurality of image pickup regions which are provided to correspond to said plurality of lens portions, respectively, and each of which has a light receiving surface substantially perpendicular to a direction of an optical axis of a corresponding lens portion;

an image pickup signal input portion which receives image pickup signals generated by the image pickup regions;

a transfer range determining portion which determines a transfer range of the image pickup signals transferred from the image pickup regions to said image pickup signal input portion;

an image pickup region driving portion which drives the image pickup regions such that the image pickup signals corresponding to the transfer range determined by said transfer range determining portion are transferred to said image pickup signal input portion; and a parallax calculating portion which calculates a parallax based on the image pickup signals transferred said image pickup signal input portion, wherein:

said transfer range determining portion is configured to be able to switch between a first operating mode in which the image pickup signals generated by at least two image pickup regions of said plurality of image pickup regions are determined as the transfer range and a second operating mode in which the image pickup signals different from those of the first operating mode are determined as the transfer range, said transfer range determining portion is configured such that in at least one of the first operating mode and the second operating mode, the image pickup signals generated by the image pickup regions taking an image of a moving subject are determined as the transfer range, and said transfer range determining portion is configured to switch between the first operating mode and the second operating mode based on speed of movement of the subject.

10. The image pickup apparatus according to claim 9, wherein said transfer range determining portion is configured to switch to, when the movement of the subject is fast, an operating mode in which the image pickup signals generated by a large number of the image pickup regions are determined as the transfer range, and to, when the movement of the subject is slow, an operating mode in which the image pickup signals generated by a small number of the image pickup regions are determined as the transfer range.

11. The image pickup apparatus according to claim 9, wherein said transfer range determining portion is configured such that a number of pixels corresponding to the image pickup signals in the transfer range is maintained substantially constant in at least one of the first operating mode and the second operating mode.

12. An image pickup apparatus comprising:
a plurality of lens portions, each having at least one lens;
a plurality of image pickup regions which are provided to correspond to said plurality of lens portions, respectively, and each of which has a light receiving surface substantially perpendicular to a direction of an optical axis of a corresponding lens portion;
an image pickup signal input portion which receives image pickup signals generated by the image pickup regions;
a transfer range determining portion which determines a transfer range of the image pickup signals transferred from the image pickup regions to said image pickup signal input portion;
an image pickup region driving portion which drives the image pickup regions such that the image pickup signals corresponding to the transfer range determined by said transfer range determining portion are transferred to said image pickup signal input portion; and
a parallax calculating portion which calculates a parallax based on the image pickup signals transferred said image pickup signal input portion, wherein:
said transfer range determining portion is configured to be able to switch between a first operating mode in which the image pickup signals generated by at least two image pickup regions of said plurality of image pickup regions are determined as the transfer range and a second operating mode in which the image pickup signals different from those of the first operating mode are determined as the transfer range, and
at least two image pickup regions of said plurality of image pickup regions are configured to repeatedly alternately transfer a part of the generated image pickup signals to said image pickup signal input portion to transfer all of the generated image pickup signals to said image pickup signal input portion.

13. A semiconductor circuit element for use in an image pickup apparatus including: a plurality of lens portions, each having at least one lens; and a plurality of image pickup regions which are provided to correspond to said plurality of lens portions, respectively, and each of which has a light receiving surface substantially perpendicular to a direction of an optical axis of the corresponding lens portion,
the semiconductor circuit element comprising:
an image pickup signal input portion which receives image pickup signals generated by the image pickup regions;
a transfer range determining portion which determines a transfer range of the image pickup signals transferred from the image pickup regions to said image pickup signal input portion;
an image pickup element driving portion which drives the image pickup regions such that the image pickup signals corresponding to the transfer range determined by said transfer range determining portion are transferred to said image pickup signal input portion; and
a parallax calculating portion which calculates a parallax based on the image pickup signals transferred to said image pickup signal input portion, wherein:
said transfer range determining portion is configured to be able to switch between a first operating mode in which the image pickup signals generated by at least two image pickup regions of said plurality of image pickup regions are determined as the transfer range and a second operating mode in which the image pickup signals different from those of the first operating mode are determined as the transfer range, and
said transfer range determining portion is configured to be able to switch between the first operating mode in which the image pickup signals generated by all of the image pickup regions are determined as the transfer range and the second operating mode in which the image pickup signals generated by a substantially half of the image pickup regions are determined as the transfer range.

* * * * *